(12) United States Patent
Kostamo

(10) Patent No.: US 11,086,216 B2
(45) Date of Patent: Aug. 10, 2021

(54) GENERATING ELECTRONIC COMPONENTS

(71) Applicant: Microsoft Technology Licensing, LLC, Redmond, WA (US)

(72) Inventor: Pasi Kostamo, Espoo (FI)

(73) Assignee: Microsoft Technology Licensing, LLC, Redmond, WA (US)

( * ) Notice: Subject to any disclaimer, the term of this patent is extended or adjusted under 35 U.S.C. 154(b) by 733 days.

(21) Appl. No.: 15/369,464

(22) Filed: Dec. 5, 2016

(65) Prior Publication Data

US 2017/0235219 A1   Aug. 17, 2017

Related U.S. Application Data

(63) Continuation-in-part of application No. 14/617,697, filed on Feb. 9, 2015, now Pat. No. 9,513,480.

(51) Int. Cl.
*G03F 7/00* (2006.01)
*B29D 11/00* (2006.01)
(Continued)

(52) U.S. Cl.
CPC ............ *G03F 7/0002* (2013.01); *B29C 59/02* (2013.01); *B29D 11/0074* (2013.01); (Continued)

(58) Field of Classification Search
CPC ... G03F 7/0002; B29C 59/02; B29D 11/0074; B29D 11/00951; G02B 5/1857; G02B 6/0035; G02B 27/0172
See application file for complete search history.

(56) References Cited

U.S. PATENT DOCUMENTS 3,227,888 A   1/1966   Turnbull et al.
3,410,774 A   11/1968   Barson et al.
(Continued)

FOREIGN PATENT DOCUMENTS

CN   1440513   9/2003
CN   101029968   9/2007
(Continued)

OTHER PUBLICATIONS

US 9,632,316 B2, 04/2017, Levola (withdrawn)
(Continued)

*Primary Examiner* — Timothy Kennedy
*Assistant Examiner* — John Robitaille
(74) *Attorney, Agent, or Firm* — Rainier Patents, P.S.

(57) ABSTRACT

Techniques for generating electronics components that operate free of unwanted distortions such as edge diffraction and unwanted phase jumps are described. A modified production master or a modified working stamp can be implemented to generate an electronic or optical component having structures that are positioned within a desired distance from a planar surface. A production master or a working stamp is modified in dependence upon a comparison of an identified distance for each respective structure to the planar surface and a desired distance. The modified production master or the modified working stamp generates the electronic or optical component by positioning the structures in accordance with the desired distance. By positioning the structures in accordance with the desired distance, electronic components generated using the modified production master or the modified working stamp minimize distortions, such as a phase jump between the structures.

20 Claims, 31 Drawing Sheets

(51) Int. Cl.
*B29C 59/02* (2006.01)
*F21V 8/00* (2006.01)
*G02B 27/01* (2006.01)
*G02B 5/18* (2006.01)
*B29L 31/34* (2006.01)
*B29L 11/00* (2006.01)
*G02B 6/34* (2006.01)

(52) U.S. Cl.
CPC ...... *B29D 11/00951* (2013.01); *G02B 5/1842* (2013.01); *G02B 5/1857* (2013.01); *G02B 5/1866* (2013.01); *G02B 6/0033* (2013.01); *G02B 6/0035* (2013.01); *G02B 27/0172* (2013.01); *B29L 2011/00* (2013.01); *B29L 2031/34* (2013.01); *G02B 6/34* (2013.01); *G02B 2027/0125* (2013.01); *G02B 2027/0178* (2013.01)

(56) References Cited

U.S. PATENT DOCUMENTS

| | | | |
|---|---|---|---|
| 3,542,453 | A | 11/1970 | Kantor |
| 3,836,258 | A | 9/1974 | Courten et al. |
| 3,906,528 | A | 9/1975 | Johnson |
| 3,971,065 | A | 7/1976 | Bayer |
| 4,200,395 | A | 4/1980 | Stewart et al. |
| 4,294,507 | A | 10/1981 | Johnson |
| 4,343,890 | A | 8/1982 | Phillips et al. |
| 4,402,610 | A | 9/1983 | Lacombat |
| 4,560,249 | A | 12/1985 | Nishiwaki et al. |
| 4,664,524 | A | 5/1987 | Hattori et al. |
| 4,711,512 | A | 12/1987 | Upatnieks |
| 4,758,087 | A | 7/1988 | Hicks, Jr. |
| 4,799,752 | A | 1/1989 | Carome |
| 4,822,145 | A | 4/1989 | Staelin |
| 4,860,361 | A | 8/1989 | Sato et al. |
| 4,900,129 | A | 2/1990 | Vanderwerf |
| 4,957,351 | A | 9/1990 | Shioji |
| 5,004,673 | A | 4/1991 | Vlannes |
| 5,019,808 | A | 5/1991 | Prince et al. |
| 5,019,898 | A | 5/1991 | Chao et al. |
| 5,106,181 | A | 4/1992 | Rockwell, III |
| 5,114,236 | A | 5/1992 | Matsugu et al. |
| 5,146,355 | A | 9/1992 | Prince et al. |
| 5,162,656 | A | 11/1992 | Matsugu et al. |
| 5,170,153 | A | 12/1992 | Migozzi et al. |
| 5,216,257 | A | 6/1993 | Brueck et al. |
| 5,305,389 | A | 4/1994 | Palmer |
| 5,309,169 | A | 5/1994 | Lippert |
| 5,313,535 | A | 5/1994 | Williams |
| 5,315,676 | A | 5/1994 | Sunagawa |
| 5,359,444 | A | 10/1994 | Piosenka et al. |
| 5,413,884 | A | 5/1995 | Koch et al. |
| 5,453,877 | A | 9/1995 | Gerbe et al. |
| 5,455,458 | A | 10/1995 | Quon et al. |
| 5,459,611 | A | 10/1995 | Bohn et al. |
| 5,483,307 | A | 1/1996 | Anderson |
| 5,491,580 | A | 2/1996 | O'Meara |
| 5,543,588 | A | 8/1996 | Bisset et al. |
| 5,549,212 | A | 8/1996 | Kanoh et al. |
| 5,574,473 | A | 11/1996 | Sekiguchi |
| 5,579,830 | A | 12/1996 | Giammaruti |
| 5,583,609 | A | 12/1996 | Mizutani et al. |
| 5,606,455 | A | 2/1997 | Eichenlaub |
| 5,614,941 | A | 3/1997 | Hines |
| 5,630,902 | A | 5/1997 | Galarneau et al. |
| 5,648,643 | A | 7/1997 | Knowles et al. |
| 5,651,414 | A | 7/1997 | Suzuki et al. |
| 5,673,146 | A | 9/1997 | Kelly |
| 5,705,321 | A | 1/1998 | Brueck et al. |
| 5,708,449 | A | 1/1998 | Heacock et al. |
| 5,708,736 | A | 1/1998 | Steinblatt |
| 5,712,995 | A | 1/1998 | Cohn |
| 5,714,967 | A | 2/1998 | Okamura et al. |
| 5,737,171 | A | 4/1998 | Buller et al. |
| 5,751,476 | A | 5/1998 | Matsui et al. |
| 5,771,042 | A | 6/1998 | Santos-Gomez |
| 5,771,320 | A | 6/1998 | Stone |
| 5,772,903 | A | 6/1998 | Hirsch |
| 5,856,842 | A | 1/1999 | Tedesco |
| 5,861,931 | A | 1/1999 | Gillian et al. |
| 5,880,725 | A | 3/1999 | Southgate |
| 5,886,822 | A | 3/1999 | Spitzer |
| 5,940,149 | A | 8/1999 | Vanderwerf |
| 5,959,664 | A | 9/1999 | Woodgate |
| 5,982,553 | A | 11/1999 | Bloom et al. |
| 5,991,087 | A | 11/1999 | Rallison |
| 6,101,008 | A | 8/2000 | Popovich |
| 6,144,439 | A | 11/2000 | Carollo |
| 6,160,667 | A | 12/2000 | Smoot |
| 6,169,613 | B1 | 1/2001 | Amitai et al. |
| 6,169,829 | B1 | 1/2001 | Laming et al. |
| 6,181,852 | B1 | 1/2001 | Adams et al. |
| 6,200,711 | B1 | 3/2001 | Kurihara et al. |
| 6,226,178 | B1 | 5/2001 | Broder et al. |
| 6,239,502 | B1 | 5/2001 | Grewe et al. |
| 6,264,787 | B1 | 7/2001 | Burbank |
| 6,271,808 | B1 | 8/2001 | Corbin |
| 6,307,142 | B1 | 10/2001 | Allen et al. |
| 6,323,949 | B1 | 11/2001 | Lading et al. |
| 6,323,970 | B1 | 11/2001 | Popovich |
| 6,377,401 | B1 | 4/2002 | Bartlett |
| 6,385,641 | B1 | 5/2002 | Jiang |
| 6,411,512 | B1 | 6/2002 | Mankaruse et al. |
| 6,417,892 | B1 | 7/2002 | Sharp et al. |
| 6,446,442 | B1 | 9/2002 | Batchelor et al. |
| 6,466,198 | B1 | 10/2002 | Feinstein |
| 6,470,289 | B1 | 10/2002 | Peters et al. |
| 6,481,851 | B1 | 11/2002 | McNelley et al. |
| 6,483,580 | B1 | 11/2002 | Xu et al. |
| 6,496,218 | B2 | 12/2002 | Takigawa et al. |
| 6,529,331 | B2 | 3/2003 | Massof et al. |
| 6,542,307 | B2 | 4/2003 | Gleckman et al. |
| 6,545,650 | B1 | 4/2003 | Yamada et al. |
| 6,553,165 | B1 | 4/2003 | Temkin et al. |
| 6,554,428 | B2 | 4/2003 | Fergason et al. |
| 6,577,411 | B1 | 6/2003 | David |
| 6,580,529 | B1 | 6/2003 | Amitai et al. |
| 6,606,152 | B2 | 8/2003 | Littau |
| 6,621,702 | B2 | 9/2003 | Elias et al. |
| 6,631,755 | B1 | 10/2003 | Kung et al. |
| 6,635,999 | B2 | 10/2003 | Belliveau |
| 6,639,201 | B2 | 10/2003 | Almogy et al. |
| 6,661,436 | B2 | 12/2003 | Barksdale et al. |
| 6,735,499 | B2 | 5/2004 | Ohki et al. |
| 6,753,828 | B2 | 6/2004 | Tuceryan et al. |
| 6,775,460 | B2 | 8/2004 | Steiner et al. |
| 6,792,328 | B2 | 9/2004 | Laughery et al. |
| 6,804,115 | B2 | 10/2004 | Lai |
| 6,809,925 | B2 | 10/2004 | Belady et al. |
| 6,819,426 | B2 | 11/2004 | Sezginer et al. |
| 6,825,987 | B2 | 11/2004 | Repetto et al. |
| 6,829,093 | B1 | 12/2004 | Nakai |
| 6,829,095 | B2 | 12/2004 | Amitai |
| 6,867,753 | B2 | 3/2005 | Chinthammit et al. |
| 6,877,134 | B1 | 4/2005 | Fuller et al. |
| 6,888,613 | B2 | 5/2005 | Robins et al. |
| 6,889,755 | B2 | 5/2005 | Zuo et al. |
| 6,898,596 | B2 | 5/2005 | Aikens et al. |
| 6,906,901 | B1 | 6/2005 | Liu |
| 6,916,584 | B2 | 7/2005 | Sreenivasan et al. |
| 6,919,867 | B2 | 7/2005 | Sauer |
| 6,947,020 | B2 | 9/2005 | Kiser et al. |
| 6,964,731 | B1 | 11/2005 | Krisko et al. |
| 6,971,443 | B2 | 12/2005 | Kung et al. |
| 6,974,714 | B2 | 12/2005 | Uno |
| 6,992,738 | B2 | 1/2006 | Ishihara et al. |
| 6,997,241 | B2 | 2/2006 | Chou et al. |
| 7,006,215 | B2 | 2/2006 | Hoff et al. |
| 7,015,876 | B1 | 3/2006 | Miller |
| 7,020,848 | B2 | 3/2006 | Rosenzweig et al. |
| 7,031,894 | B2 | 4/2006 | Niu et al. |
| 7,048,385 | B2 | 5/2006 | Beeson et al. |

(56) References Cited

U.S. PATENT DOCUMENTS

| | | |
|---|---|---|
| 7,061,624 B2 | 6/2006 | Ishizuka |
| 7,069,975 B1 | 7/2006 | Haws et al. |
| 7,072,049 B2 | 7/2006 | Niu et al. |
| 7,099,005 B1 | 8/2006 | Fabrikant et al. |
| 7,113,605 B2 | 9/2006 | Rui et al. |
| 7,116,555 B2 | 10/2006 | Kamath et al. |
| 7,151,635 B2 | 12/2006 | Bidnyk et al. |
| 7,159,174 B2 | 1/2007 | Johnson et al. |
| 7,181,699 B2 | 2/2007 | Morrow et al. |
| 7,184,615 B2 | 2/2007 | Levola |
| 7,189,362 B2 | 3/2007 | Nordin et al. |
| 7,191,820 B2 | 3/2007 | Chou et al. |
| 7,193,584 B2 | 3/2007 | Lee et al. |
| 7,196,758 B2 | 3/2007 | Crawford et al. |
| 7,206,107 B2 | 4/2007 | Levola |
| 7,212,709 B2 | 5/2007 | Hosoi |
| 7,212,723 B2 | 5/2007 | McLeod et al. |
| 7,250,930 B2 | 7/2007 | Hoffman et al. |
| 7,253,445 B2 | 8/2007 | Heremans et al. |
| 7,261,453 B2 | 8/2007 | Morejon et al. |
| 7,261,827 B2 | 8/2007 | Ootsu et al. |
| 7,271,795 B2 | 9/2007 | Bradski |
| 7,277,282 B2 | 10/2007 | Tate |
| 7,301,587 B2 | 11/2007 | Uehara et al. |
| 7,324,754 B2 | 1/2008 | Kobayashi et al. |
| 7,333,690 B1 | 2/2008 | Peale et al. |
| 7,337,018 B2 | 2/2008 | Espinoza-Ibarra et al. |
| 7,359,420 B2 | 4/2008 | Shchegrov et al. |
| 7,365,734 B2 | 4/2008 | Fateh et al. |
| 7,369,101 B2 | 5/2008 | Sauer et al. |
| 7,372,565 B1 | 5/2008 | Holden et al. |
| 7,376,852 B2 | 5/2008 | Edwards |
| 7,396,133 B2 | 7/2008 | Burnett et al. |
| 7,399,420 B2 | 7/2008 | Paek et al. |
| 7,412,306 B2 | 8/2008 | Katoh et al. |
| 7,416,017 B2 | 8/2008 | Haws et al. |
| 7,417,617 B2 | 8/2008 | Eichenlaub |
| 7,418,170 B2 | 8/2008 | Mukawa et al. |
| 7,428,001 B2 | 9/2008 | Schowengerdt et al. |
| 7,430,349 B2 | 9/2008 | Jones |
| 7,430,355 B2 | 9/2008 | Heikenfeld et al. |
| 7,437,678 B2 | 10/2008 | Awada et al. |
| 7,455,102 B2 | 11/2008 | Cheng |
| 7,496,642 B2 | 2/2009 | Gill et al. |
| 7,505,269 B1 | 3/2009 | Cosley et al. |
| 7,513,627 B2 | 4/2009 | Larson et al. |
| 7,515,143 B2 | 4/2009 | Keam et al. |
| 7,515,279 B2 | 4/2009 | Raymond |
| 7,518,740 B2 | 4/2009 | Chard et al. |
| 7,532,227 B2 | 5/2009 | Nakajima et al. |
| 7,539,371 B2 | 5/2009 | Martinelli et al. |
| 7,542,665 B2 | 6/2009 | Lei |
| 7,551,814 B1 | 6/2009 | Smits |
| 7,576,916 B2 | 8/2009 | Amitai |
| 7,583,327 B2 | 9/2009 | Takatani |
| 7,587,419 B2 | 9/2009 | Thorpe et al. |
| 7,607,111 B2 | 10/2009 | Vaananen et al. |
| 7,612,882 B2 | 11/2009 | Wu et al. |
| 7,619,895 B1 | 11/2009 | Wertz et al. |
| 7,631,687 B2 | 12/2009 | Yang |
| 7,634,478 B2 | 12/2009 | Yang et al. |
| 7,646,606 B2 | 1/2010 | Rytka et al. |
| 7,646,950 B2 | 1/2010 | Park et al. |
| 7,649,594 B2 | 1/2010 | Kim et al. |
| 7,656,912 B2 | 2/2010 | Brueck et al. |
| 7,660,500 B2 | 2/2010 | Konttinen et al. |
| 7,668,842 B2 | 2/2010 | LaChapelle et al. |
| 7,679,641 B2 | 3/2010 | Lipton et al. |
| 7,693,292 B1 | 4/2010 | Gross et al. |
| 7,693,911 B2 | 4/2010 | Wories et al. |
| 7,701,716 B2 | 4/2010 | Blanco, Jr. et al. |
| 7,706,785 B2 | 4/2010 | Lei et al. |
| 7,716,003 B1 | 5/2010 | Wack et al. |
| 7,716,317 B2 | 5/2010 | Kumar et al. |
| 7,719,769 B2 | 5/2010 | Sugihara et al. |
| 7,728,933 B2 | 6/2010 | Kim et al. |
| 7,730,113 B1 | 6/2010 | Payette et al. |
| 7,764,413 B2 | 7/2010 | Levola |
| 7,768,534 B2 | 8/2010 | Pentenrieder et al. |
| 7,777,944 B2 | 8/2010 | Ho et al. |
| 7,783,669 B2 | 8/2010 | Qiu et al. |
| 7,788,474 B2 | 8/2010 | Switzer et al. |
| 7,817,104 B2 | 10/2010 | Ryu et al. |
| 7,826,508 B2 | 11/2010 | Reid et al. |
| 7,832,885 B2 | 11/2010 | Hsiao et al. |
| 7,843,691 B2 | 11/2010 | Reichert et al. |
| 7,871,811 B2 | 1/2011 | Fang et al. |
| 7,882,115 B2 | 2/2011 | Hirsch |
| 7,890,882 B1 | 2/2011 | Nelson |
| 7,894,613 B1 | 2/2011 | Ong et al. |
| 7,903,409 B2 | 3/2011 | Patel et al. |
| 7,904,832 B2 | 3/2011 | Ubillos |
| 7,908,273 B2 | 3/2011 | DiMaria et al. |
| 7,909,958 B2 | 3/2011 | Washburn et al. |
| 7,941,231 B1 | 5/2011 | Dunn |
| 7,949,214 B2 | 5/2011 | DeJong |
| 7,966,184 B2 | 6/2011 | O'Conor et al. |
| 7,986,462 B2 | 7/2011 | Kobayashi et al. |
| 8,004,621 B2 | 8/2011 | Woodgate et al. |
| 8,014,644 B2 | 9/2011 | Morimoto et al. |
| 8,033,709 B2 | 10/2011 | Kao et al. |
| 8,035,896 B2 | 10/2011 | Taira et al. |
| 8,046,616 B2 | 10/2011 | Edwards |
| 8,061,411 B2 | 11/2011 | Xu et al. |
| 8,085,948 B2 | 12/2011 | Thomas et al. |
| 8,092,064 B2 | 1/2012 | Erchak et al. |
| 8,108,430 B2 | 1/2012 | Wong et al. |
| 8,125,579 B2 | 2/2012 | Khan et al. |
| 8,128,800 B2 | 3/2012 | Seo et al. |
| 8,139,504 B2 | 3/2012 | Mankins et al. |
| 8,150,893 B2 | 4/2012 | Bohannon et al. |
| 8,160,411 B2 | 4/2012 | Levola et al. |
| 8,162,524 B2 | 4/2012 | Van Ostrand et al. |
| 8,165,988 B2 | 4/2012 | Shau et al. |
| 8,176,436 B2 | 5/2012 | Arend et al. |
| 8,189,263 B1 | 5/2012 | Wang et al. |
| 8,195,220 B2 | 6/2012 | Kim et al. |
| 8,200,704 B2 | 6/2012 | Petakov et al. |
| 8,233,204 B1 | 7/2012 | Robbins et al. |
| 8,233,273 B2 | 7/2012 | Chen et al. |
| 8,244,667 B1 | 8/2012 | Weinberger et al. |
| 8,246,170 B2 | 8/2012 | Yamamoto et al. |
| 8,274,614 B2 | 9/2012 | Yokote et al. |
| 8,280,861 B1 | 10/2012 | Park et al. |
| 8,291,349 B1 | 10/2012 | Park et al. |
| 8,300,614 B2 | 10/2012 | Ankaiah et al. |
| 8,320,032 B2 | 11/2012 | Levola |
| 8,332,402 B2 | 12/2012 | Forstall et al. |
| 8,358,400 B2 | 1/2013 | Escuti |
| 8,384,999 B1 | 2/2013 | Crosby et al. |
| 8,392,035 B2 | 3/2013 | Patel et al. |
| 8,395,898 B1 | 3/2013 | Chamseddine et al. |
| 8,418,083 B1 | 4/2013 | Lundy et al. |
| 8,434,019 B2 | 4/2013 | Nelson |
| 8,446,340 B2 | 5/2013 | Aharoni |
| 8,466,953 B2 | 6/2013 | Levola |
| 8,472,119 B1 | 6/2013 | Kelly |
| 8,482,920 B2 | 7/2013 | Tissot et al. |
| 8,571,539 B1 | 10/2013 | Ranganathan et al. |
| 8,576,143 B1 | 11/2013 | Kelly |
| 8,589,341 B2 | 11/2013 | Golde et al. |
| 8,593,734 B2 | 11/2013 | Laakkonen |
| 8,594,702 B2 | 11/2013 | Naaman et al. |
| 8,605,700 B2 | 12/2013 | Gurin |
| 8,611,014 B2 | 12/2013 | Valera et al. |
| 8,627,228 B2 | 1/2014 | Yosef et al. |
| 8,629,815 B2 | 1/2014 | Brin et al. |
| 8,634,139 B1 | 1/2014 | Brown et al. |
| 8,638,498 B2 | 1/2014 | Bohn et al. |
| 8,645,871 B2 | 2/2014 | Fong et al. |
| 8,666,212 B1 | 3/2014 | Amirparviz |
| 8,693,500 B2 | 4/2014 | Ludwig et al. |
| 8,698,845 B2 | 4/2014 | Lemay |
| 8,700,931 B2 | 4/2014 | Gudlavenkatasiva et al. |

(56) References Cited

U.S. PATENT DOCUMENTS

| | | | |
|---|---|---|---|
| 8,712,598 B2 | 4/2014 | Dighde et al. |
| 8,717,676 B2 | 5/2014 | Rinko |
| 8,745,513 B2 | 6/2014 | Crystal |
| 8,754,831 B2 | 6/2014 | Kollin et al. |
| 8,793,282 B2 | 7/2014 | Hedinsson et al. |
| 8,796,012 B2 | 8/2014 | Sinclair et al. |
| 8,810,600 B2 | 8/2014 | Bohn et al. |
| 8,817,350 B1 | 8/2014 | Robbins et al. |
| 8,819,079 B2 | 8/2014 | Bush et al. |
| 8,823,531 B1 | 9/2014 | McCleary et al. |
| 8,843,744 B2 | 9/2014 | Sentinelli et al. |
| 8,885,997 B2 | 11/2014 | Nguyen et al. |
| 8,909,384 B1 | 12/2014 | Beitelmal et al. |
| 8,917,453 B2 | 12/2014 | Bohn |
| 8,934,235 B2 | 1/2015 | Rubenstein et al. |
| 8,941,683 B2 | 1/2015 | Son et al. |
| 8,989,535 B2 | 3/2015 | Robbins |
| 8,990,255 B2 | 3/2015 | Metsatahti et al. |
| 9,003,162 B2 | 4/2015 | Lomet et al. |
| 9,304,235 B2 | 4/2016 | Sainiema et al. |
| 9,372,347 B1 | 6/2016 | Levola et al. |
| 9,423,360 B1 | 8/2016 | Kostamo et al. |
| 9,429,692 B1 | 8/2016 | Saarikko et al. |
| 9,513,480 B2 | 12/2016 | Saarikko et al. |
| 9,514,211 B2 | 12/2016 | Sengupta et al. |
| 9,535,253 B2 | 1/2017 | Levola et al. |
| 9,558,590 B2 | 1/2017 | Westerinen et al. |
| 9,759,932 B1 | 9/2017 | Ainsworth et al. |
| 9,779,643 B2 | 10/2017 | Bohn et al. |
| 9,807,381 B2 | 10/2017 | Fleck et al. |
| 9,827,209 B2 | 11/2017 | Kostamo |
| 10,018,844 B2 | 7/2018 | Levola et al. |
| 2001/0043208 A1 | 11/2001 | Furness, III et al. |
| 2002/0035455 A1 | 3/2002 | Niu et al. |
| 2002/0038196 A1 | 3/2002 | Johnson et al. |
| 2002/0041735 A1 | 4/2002 | Cai et al. |
| 2002/0044152 A1 | 4/2002 | Abbott et al. |
| 2002/0044162 A1 | 4/2002 | Sawatari |
| 2002/0063820 A1 | 5/2002 | Broer et al. |
| 2002/0076154 A1 | 6/2002 | Maisenhoelder et al. |
| 2002/0097558 A1 | 7/2002 | Stone et al. |
| 2002/0138772 A1 | 9/2002 | Crawford et al. |
| 2002/0171939 A1 | 11/2002 | Song |
| 2002/0180659 A1 | 12/2002 | Takahashi |
| 2003/0006364 A1 | 1/2003 | Katzir et al. |
| 2003/0023889 A1 | 1/2003 | Hofstee et al. |
| 2003/0047822 A1* | 3/2003 | Hori ............... B29C 33/42 |
| | | 264/1.21 |
| 2003/0137706 A1 | 7/2003 | Rmanujam et al. |
| 2003/0179453 A1 | 9/2003 | Mori et al. |
| 2003/0204698 A1 | 10/2003 | Sachedina et al. |
| 2003/0214728 A1 | 11/2003 | Olczak |
| 2004/0011503 A1 | 1/2004 | Kung et al. |
| 2004/0024580 A1 | 2/2004 | Salmonsen et al. |
| 2004/0042724 A1 | 3/2004 | Gombert et al. |
| 2004/0085649 A1 | 5/2004 | Repetto et al. |
| 2004/0108971 A1 | 6/2004 | Waldern et al. |
| 2004/0109234 A1 | 6/2004 | Levola |
| 2004/0135209 A1 | 7/2004 | Hsieh et al. |
| 2004/0139169 A1 | 7/2004 | O'Brien et al. |
| 2004/0151466 A1 | 8/2004 | Crossman-Bosworth et al. |
| 2004/0176928 A1 | 9/2004 | Johnson |
| 2004/0267990 A1 | 12/2004 | Lin |
| 2005/0089328 A1 | 4/2005 | Nishiki et al. |
| 2005/0100272 A1 | 5/2005 | Gilman |
| 2005/0174737 A1 | 8/2005 | Meir |
| 2005/0207120 A1 | 9/2005 | Tseng et al. |
| 2005/0243107 A1 | 11/2005 | Haim et al. |
| 2005/0246352 A1 | 11/2005 | Moore et al. |
| 2005/0248705 A1 | 11/2005 | Smith et al. |
| 2005/0285878 A1 | 12/2005 | Singh et al. |
| 2006/0018025 A1 | 1/2006 | Sharon et al. |
| 2006/0032616 A1 | 2/2006 | Yang |
| 2006/0038881 A1 | 2/2006 | Starkweather et al. |
| 2006/0054787 A1 | 3/2006 | Olsen et al. |
| 2006/0072206 A1 | 4/2006 | Tsuyuki et al. |
| 2006/0080401 A1 | 4/2006 | Gill et al. |
| 2006/0118280 A1 | 6/2006 | Liu |
| 2006/0126181 A1 | 6/2006 | Levola |
| 2006/0129951 A1 | 6/2006 | Vaananen et al. |
| 2006/0132806 A1 | 6/2006 | Shchegrov et al. |
| 2006/0132914 A1 | 6/2006 | Weiss et al. |
| 2006/0139447 A1 | 6/2006 | Unkrich |
| 2006/0152646 A1 | 7/2006 | Schrader |
| 2006/0155723 A1 | 7/2006 | Kumar et al. |
| 2006/0164382 A1 | 7/2006 | Kulas et al. |
| 2006/0183331 A1 | 8/2006 | Hofmann |
| 2006/0196643 A1 | 9/2006 | Hata et al. |
| 2006/0215244 A1 | 9/2006 | Yosha et al. |
| 2006/0221448 A1 | 10/2006 | Nivon et al. |
| 2006/0228073 A1 | 10/2006 | Mukawa et al. |
| 2006/0249765 A1 | 11/2006 | Hsieh |
| 2006/0250541 A1 | 11/2006 | Huck |
| 2007/0002412 A1 | 1/2007 | Aihara |
| 2007/0005334 A1 | 1/2007 | Salmonsen |
| 2007/0008456 A1 | 1/2007 | Lesage et al. |
| 2007/0023703 A1 | 2/2007 | Sunaoshi et al. |
| 2007/0027591 A1 | 2/2007 | Goldenberg et al. |
| 2007/0041684 A1 | 2/2007 | Popovich et al. |
| 2007/0097019 A1 | 5/2007 | Wynne-Powell et al. |
| 2007/0147673 A1 | 6/2007 | Crandall |
| 2007/0153395 A1 | 7/2007 | Repetto et al. |
| 2007/0171328 A1 | 7/2007 | Freeman et al. |
| 2007/0177260 A1 | 8/2007 | Kuppenheimer et al. |
| 2007/0208687 A1 | 9/2007 | O'Conor et al. |
| 2007/0214180 A1 | 9/2007 | Crawford |
| 2007/0236959 A1 | 10/2007 | Tolbert et al. |
| 2007/0284093 A1 | 12/2007 | Bhatti et al. |
| 2007/0288478 A1 | 12/2007 | DiMaria et al. |
| 2008/0005348 A1 | 1/2008 | Kosiba et al. |
| 2008/0008076 A1 | 1/2008 | Raguin et al. |
| 2008/0014534 A1 | 1/2008 | Barwicz et al. |
| 2008/0025350 A1 | 1/2008 | Arbore et al. |
| 2008/0043100 A1 | 2/2008 | Sobel et al. |
| 2008/0043425 A1 | 2/2008 | Hebert et al. |
| 2008/0059535 A1 | 3/2008 | Lindsley et al. |
| 2008/0088603 A1 | 4/2008 | Eliasson et al. |
| 2008/0088624 A1 | 4/2008 | Long et al. |
| 2008/0106677 A1 | 5/2008 | Kuan et al. |
| 2008/0117341 A1 | 5/2008 | McGrew |
| 2008/0141681 A1 | 6/2008 | Arnold |
| 2008/0150913 A1 | 6/2008 | Bell et al. |
| 2008/0174735 A1 | 7/2008 | Quach et al. |
| 2008/0189303 A1 | 8/2008 | Bush et al. |
| 2008/0232680 A1 | 9/2008 | Berestov et al. |
| 2008/0248852 A1 | 10/2008 | Rasmussen |
| 2008/0285140 A1 | 11/2008 | Amitai |
| 2008/0297535 A1 | 12/2008 | Reinig |
| 2008/0303918 A1 | 12/2008 | Keithley |
| 2008/0311386 A1 | 12/2008 | Wendt |
| 2009/0002939 A1 | 1/2009 | Baugh et al. |
| 2009/0015742 A1 | 1/2009 | Liao et al. |
| 2009/0021908 A1 | 1/2009 | Patel et al. |
| 2009/0051283 A1 | 2/2009 | Cok et al. |
| 2009/0059376 A1 | 3/2009 | Hayakawa |
| 2009/0084525 A1 | 4/2009 | Satou et al. |
| 2009/0084757 A1 | 4/2009 | Erokhin et al. |
| 2009/0092261 A1 | 4/2009 | Bard |
| 2009/0097127 A1 | 4/2009 | Amitai |
| 2009/0113301 A1 | 4/2009 | Fisher et al. |
| 2009/0128449 A1 | 5/2009 | Brown et al. |
| 2009/0128901 A1 | 5/2009 | Tilleman et al. |
| 2009/0144642 A1 | 6/2009 | Crystal |
| 2009/0180250 A1 | 7/2009 | Holling et al. |
| 2009/0188610 A1 | 7/2009 | Yamamoto |
| 2009/0189974 A1 | 7/2009 | Deering |
| 2009/0190003 A1 | 7/2009 | Park et al. |
| 2009/0193024 A1 | 7/2009 | Dhananjaya |
| 2009/0195756 A1 | 8/2009 | Li et al. |
| 2009/0199128 A1 | 8/2009 | Matthews et al. |
| 2009/0222147 A1 | 9/2009 | Nakashima et al. |
| 2009/0224416 A1 | 9/2009 | Laakkonen et al. |
| 2009/0235203 A1 | 9/2009 | Iizuka |
| 2009/0244413 A1 | 10/2009 | Ishikawa et al. |

(56) References Cited

U.S. PATENT DOCUMENTS

| | | |
|---|---|---|
| 2009/0246707 A1 | 10/2009 | Li et al. |
| 2009/0256837 A1 | 10/2009 | Deb et al. |
| 2009/0262419 A1 | 10/2009 | Robinson et al. |
| 2009/0303599 A1 | 12/2009 | Levola |
| 2010/0002989 A1 | 1/2010 | Tokushima |
| 2010/0018858 A1 | 1/2010 | Seki |
| 2010/0021108 A1 | 1/2010 | Kang et al. |
| 2010/0053151 A1 | 3/2010 | Marti et al. |
| 2010/0060551 A1 | 3/2010 | Sugiyama et al. |
| 2010/0061078 A1 | 3/2010 | Kim |
| 2010/0074291 A1 | 3/2010 | Nakamura |
| 2010/0079865 A1 | 4/2010 | Saarikko et al. |
| 2010/0084674 A1 | 4/2010 | Paetzold et al. |
| 2010/0096617 A1 | 4/2010 | Shanks |
| 2010/0103078 A1 | 4/2010 | Mukawa et al. |
| 2010/0134534 A1 | 6/2010 | Sesselberg et al. |
| 2010/0138809 A1 | 6/2010 | Shenfield et al. |
| 2010/0141905 A1 | 6/2010 | Burke |
| 2010/0149073 A1 | 6/2010 | Chaum et al. |
| 2010/0188353 A1 | 7/2010 | Yoon et al. |
| 2010/0191783 A1 | 7/2010 | Mason et al. |
| 2010/0200736 A1 | 8/2010 | Laycock et al. |
| 2010/0201953 A1 | 8/2010 | Freeman et al. |
| 2010/0202725 A1 | 8/2010 | Popovich et al. |
| 2010/0205178 A1 | 8/2010 | Bush et al. |
| 2010/0211575 A1 | 8/2010 | Collins et al. |
| 2010/0213467 A1 | 8/2010 | Lee et al. |
| 2010/0220439 A1 | 9/2010 | Qin |
| 2010/0229853 A1 | 9/2010 | Vandal et al. |
| 2010/0238270 A1 | 9/2010 | Bjelkhagen et al. |
| 2010/0245387 A1 | 9/2010 | Bachelder et al. |
| 2010/0259889 A1 | 10/2010 | Chen et al. |
| 2010/0271467 A1 | 10/2010 | Akeley |
| 2010/0277421 A1 | 11/2010 | Charlier et al. |
| 2010/0277439 A1 | 11/2010 | Charlier et al. |
| 2010/0277779 A1 | 11/2010 | Futterer et al. |
| 2010/0277803 A1 | 11/2010 | Pockett et al. |
| 2010/0278484 A1 | 11/2010 | Scheerlinck et al. |
| 2010/0281382 A1 | 11/2010 | Meaney et al. |
| 2010/0284085 A1 | 11/2010 | Laakkonen |
| 2010/0300654 A1 | 12/2010 | Edwards |
| 2010/0309687 A1 | 12/2010 | Sampsell et al. |
| 2010/0315781 A1 | 12/2010 | Agostini |
| 2010/0317132 A1 | 12/2010 | Rogers et al. |
| 2010/0321609 A1 | 12/2010 | Qi et al. |
| 2010/0321781 A1 | 12/2010 | Levola |
| 2010/0328351 A1 | 12/2010 | Tan |
| 2011/0012814 A1 | 1/2011 | Tanaka |
| 2011/0021251 A1 | 1/2011 | Lindén |
| 2011/0025605 A1 | 2/2011 | Kwitek |
| 2011/0026128 A1 | 2/2011 | Baker et al. |
| 2011/0032482 A1 | 2/2011 | Agurok |
| 2011/0038049 A1 | 2/2011 | Vallius et al. |
| 2011/0050547 A1 | 3/2011 | Mukawa |
| 2011/0050655 A1 | 3/2011 | Mukawa |
| 2011/0055765 A1 | 3/2011 | Neubrand et al. |
| 2011/0063795 A1 | 3/2011 | Yeh et al. |
| 2011/0075442 A1 | 3/2011 | Chiang |
| 2011/0084893 A1 | 4/2011 | Lee et al. |
| 2011/0090343 A1 | 4/2011 | Alt et al. |
| 2011/0091156 A1 | 4/2011 | Laughlin |
| 2011/0096401 A1 | 4/2011 | Levola |
| 2011/0099512 A1 | 4/2011 | Jeong |
| 2011/0114823 A1 | 5/2011 | Katzir et al. |
| 2011/0115340 A1 | 5/2011 | Lee |
| 2011/0127024 A1 | 6/2011 | Patel et al. |
| 2011/0134017 A1 | 6/2011 | Burke |
| 2011/0134645 A1 | 6/2011 | Hitchcock et al. |
| 2011/0141388 A1 | 6/2011 | Park et al. |
| 2011/0148931 A1 | 6/2011 | Kim |
| 2011/0163986 A1 | 7/2011 | Lee et al. |
| 2011/0175930 A1 | 7/2011 | Hwang et al. |
| 2011/0194029 A1 | 8/2011 | Herrmann et al. |
| 2011/0205251 A1 | 8/2011 | Auld |
| 2011/0210946 A1 | 9/2011 | Goertz et al. |
| 2011/0214082 A1 | 9/2011 | Osterhout et al. |
| 2011/0215349 A1 | 9/2011 | An et al. |
| 2011/0221658 A1 | 9/2011 | Haddick et al. |
| 2011/0221659 A1 | 9/2011 | King et al. |
| 2011/0222236 A1 | 9/2011 | Luo et al. |
| 2011/0227820 A1 | 9/2011 | Haddick et al. |
| 2011/0227913 A1 | 9/2011 | Hyndman |
| 2011/0231192 A1 | 9/2011 | O'Conor et al. |
| 2011/0233431 A1 | 9/2011 | Wan et al. |
| 2011/0235179 A1 | 9/2011 | Simmonds |
| 2011/0242145 A1 | 10/2011 | Nishimura et al. |
| 2011/0242392 A1 | 10/2011 | Chiang |
| 2011/0242670 A1 | 10/2011 | Simmonds |
| 2011/0242757 A1 | 10/2011 | Tracy et al. |
| 2011/0248904 A1 | 10/2011 | Miyawaki et al. |
| 2011/0248958 A1 | 10/2011 | Gruhlke et al. |
| 2011/0267799 A1 | 11/2011 | Epstein et al. |
| 2011/0283223 A1 | 11/2011 | Vaittinen et al. |
| 2011/0295913 A1 | 12/2011 | Enbutsu |
| 2011/0299044 A1 | 12/2011 | Yeh et al. |
| 2011/0304640 A1 | 12/2011 | Noge |
| 2011/0309378 A1 | 12/2011 | Lau et al. |
| 2011/0310232 A1 | 12/2011 | Wilson et al. |
| 2011/0310312 A1 | 12/2011 | Yokote et al. |
| 2012/0013651 A1 | 1/2012 | Trayner et al. |
| 2012/0019434 A1 | 1/2012 | Kuhlman et al. |
| 2012/0026161 A1 | 2/2012 | Chen et al. |
| 2012/0030616 A1 | 2/2012 | Howes et al. |
| 2012/0033306 A1 | 2/2012 | Valera et al. |
| 2012/0038629 A1 | 2/2012 | Brown et al. |
| 2012/0041721 A1 | 2/2012 | Chen |
| 2012/0044573 A1 | 2/2012 | Simmonds et al. |
| 2012/0050144 A1 | 3/2012 | Morlock et al. |
| 2012/0052934 A1 | 3/2012 | Maharbiz et al. |
| 2012/0062998 A1 | 3/2012 | Schultz et al. |
| 2012/0069413 A1 | 3/2012 | Schultz |
| 2012/0084710 A1 | 4/2012 | Sirpal et al. |
| 2012/0105487 A1 | 5/2012 | Son et al. |
| 2012/0106170 A1 | 5/2012 | Matthews et al. |
| 2012/0111544 A1 | 5/2012 | Senatori |
| 2012/0113092 A1 | 5/2012 | Bar-Zeev et al. |
| 2012/0120493 A1 | 5/2012 | Simmonds et al. |
| 2012/0127577 A1 | 5/2012 | Desserouer |
| 2012/0134623 A1 | 5/2012 | Boudreau et al. |
| 2012/0144331 A1 | 6/2012 | Tolonen et al. |
| 2012/0157114 A1 | 6/2012 | Alameh et al. |
| 2012/0162764 A1 | 6/2012 | Shimizu |
| 2012/0176322 A1 | 7/2012 | Karmi et al. |
| 2012/0176474 A1 | 7/2012 | Border |
| 2012/0182687 A1 | 7/2012 | Dighde et al. |
| 2012/0188205 A1 | 7/2012 | Jansson et al. |
| 2012/0195553 A1 | 8/2012 | Hasegawa et al. |
| 2012/0200495 A1 | 8/2012 | Johansson |
| 2012/0206589 A1 | 8/2012 | Crandall |
| 2012/0206880 A1 | 8/2012 | Andres et al. |
| 2012/0218301 A1 | 8/2012 | Miller |
| 2012/0227006 A1 | 9/2012 | Amm |
| 2012/0235885 A1 | 9/2012 | Miller et al. |
| 2012/0242561 A1 | 9/2012 | Sugihara |
| 2012/0256856 A1 | 10/2012 | Suzuki et al. |
| 2012/0256963 A1 | 10/2012 | Suzuki et al. |
| 2012/0262657 A1 | 10/2012 | Nakanishi et al. |
| 2012/0287381 A1 | 11/2012 | Li et al. |
| 2012/0292535 A1 | 11/2012 | Choi et al. |
| 2012/0296191 A1 | 11/2012 | McGrath et al. |
| 2012/0304092 A1 | 11/2012 | Jarrett et al. |
| 2012/0311481 A1 | 12/2012 | Reyna |
| 2013/0000871 A1 | 1/2013 | Olson et al. |
| 2013/0019273 A1 | 1/2013 | Ma et al. |
| 2013/0033485 A1 | 2/2013 | Kollin et al. |
| 2013/0081779 A1 | 4/2013 | Liao et al. |
| 2013/0093741 A1 | 4/2013 | Akimoto et al. |
| 2013/0106592 A1 | 5/2013 | Morgan et al. |
| 2013/0106674 A1 | 5/2013 | Wheeler et al. |
| 2013/0148864 A1 | 6/2013 | Dolson et al. |
| 2013/0158957 A1 | 6/2013 | Lee et al. |
| 2013/0162673 A1 | 6/2013 | Bohn |
| 2013/0163089 A1 | 6/2013 | Bohn |
| 2013/0170031 A1 | 7/2013 | Bohn |

(56) References Cited

U.S. PATENT DOCUMENTS

| | | |
|---|---|---|
| 2013/0170802 A1 | 7/2013 | Pitwon |
| 2013/0186596 A1 | 7/2013 | Rubenstein et al. |
| 2013/0186598 A1 | 7/2013 | Rubenstein |
| 2013/0187943 A1 | 7/2013 | Bohn et al. |
| 2013/0198176 A1 | 8/2013 | Kim |
| 2013/0207964 A1 | 8/2013 | Fleck |
| 2013/0208003 A1 | 8/2013 | Bohn |
| 2013/0208362 A1 | 8/2013 | Bohn |
| 2013/0208482 A1 | 8/2013 | Fleck |
| 2013/0215081 A1 | 8/2013 | Levin et al. |
| 2013/0226931 A1 | 8/2013 | Hazel et al. |
| 2013/0242056 A1 | 9/2013 | Fleck et al. |
| 2013/0242555 A1 | 9/2013 | Mukawa |
| 2013/0250431 A1 | 9/2013 | Robbins et al. |
| 2013/0252628 A1 | 9/2013 | Kuehnel |
| 2013/0254412 A1 | 9/2013 | Menezes et al. |
| 2013/0257848 A1 | 10/2013 | Westerinen et al. |
| 2013/0258701 A1 | 10/2013 | Westerinen et al. |
| 2013/0267309 A1 | 10/2013 | Robbins et al. |
| 2013/0294030 A1 | 11/2013 | Wang et al. |
| 2013/0305184 A1 | 11/2013 | Kim et al. |
| 2013/0307875 A1 | 11/2013 | Anderson |
| 2013/0314789 A1 | 11/2013 | Saarikko et al. |
| 2013/0314793 A1 | 11/2013 | Robbins |
| 2013/0322810 A1 | 12/2013 | Robbins |
| 2013/0332159 A1 | 12/2013 | Federighi et al. |
| 2013/0335671 A1 | 12/2013 | Fleck |
| 2013/0339446 A1 | 12/2013 | Balassanian et al. |
| 2013/0342674 A1 | 12/2013 | Dixon |
| 2013/0346725 A1 | 12/2013 | Lomet et al. |
| 2014/0010265 A1 | 1/2014 | Peng |
| 2014/0022265 A1 | 1/2014 | Canan |
| 2014/0041827 A1 | 2/2014 | Giaimo |
| 2014/0059139 A1 | 2/2014 | Filev et al. |
| 2014/0063367 A1 | 3/2014 | Yang et al. |
| 2014/0078130 A1 | 3/2014 | Uchino et al. |
| 2014/0089833 A1 | 3/2014 | Hwang et al. |
| 2014/0094973 A1 | 4/2014 | Giaimo et al. |
| 2014/0098671 A1 | 4/2014 | Raleigh et al. |
| 2014/0104665 A1 | 4/2014 | Popovich et al. |
| 2014/0104685 A1 | 4/2014 | Bohn |
| 2014/0111865 A1 | 4/2014 | Kobayashi |
| 2014/0116982 A1 | 5/2014 | Schellenberg et al. |
| 2014/0140653 A1 | 5/2014 | Brown et al. |
| 2014/0140654 A1 | 5/2014 | Brown et al. |
| 2014/0143247 A1 | 5/2014 | Rathnavelu et al. |
| 2014/0143351 A1 | 5/2014 | Deng |
| 2014/0143439 A1 | 5/2014 | Ramamurthy |
| 2014/0176528 A1 | 6/2014 | Robbins |
| 2014/0184699 A1 | 7/2014 | Ito et al. |
| 2014/0189557 A1 | 7/2014 | O'Connell et al. |
| 2014/0204455 A1 | 7/2014 | Popovich et al. |
| 2014/0240842 A1 | 8/2014 | Nguyen et al. |
| 2014/0300966 A1 | 10/2014 | Travers et al. |
| 2014/0314374 A1 | 10/2014 | Fattal et al. |
| 2014/0320399 A1 | 10/2014 | Kim et al. |
| 2015/0046500 A1 | 2/2015 | Bush et al. |
| 2015/0086163 A1 | 3/2015 | Valera et al. |
| 2015/0168731 A1 | 6/2015 | Robbins |
| 2016/0033697 A1 | 2/2016 | Sainiemi et al. |
| 2016/0033784 A1 | 2/2016 | Levola et al. |
| 2016/0035539 A1 | 2/2016 | Sainiemi et al. |
| 2016/0041394 A1 | 2/2016 | Tanaka et al. |
| 2016/0110403 A1 | 4/2016 | Lomet et al. |
| 2016/0231257 A1 | 8/2016 | Kostamo et al. |
| 2016/0231477 A1 | 8/2016 | Saarikko et al. |
| 2016/0231478 A1 | 8/2016 | Kostamo |
| 2016/0231566 A1 | 8/2016 | Levola et al. |
| 2016/0231567 A1 | 8/2016 | Saarikko et al. |
| 2016/0231568 A1 | 8/2016 | Saarikko et al. |
| 2016/0231569 A1 | 8/2016 | Levola |
| 2016/0231570 A1 | 8/2016 | Levola et al. |
| 2016/0234485 A1 | 8/2016 | Robbins et al. |
| 2016/0283618 A1 | 9/2016 | Levola et al. |
| 2017/0301270 A1 | 10/2017 | Bohn et al. |
| 2017/0326446 A1 | 11/2017 | Robbins et al. |
| 2018/0267318 A1 | 9/2018 | Levola et al. |
| 2019/0285899 A1 | 9/2019 | Levola et al. |

FOREIGN PATENT DOCUMENTS

| | | |
|---|---|---|
| CN | 101105512 | 1/2008 |
| CN | 101460884 A | 6/2009 |
| CN | 101589326 A | 11/2009 |
| CN | 102004315 | 4/2011 |
| EP | 0959378 A1 | 11/1999 |
| EP | 0977022 | 2/2000 |
| EP | 1494109 | 1/2005 |
| EP | 1847924 | 10/2007 |
| EP | 2065750 | 6/2009 |
| EP | 2083310 | 7/2009 |
| EP | 2112547 | 10/2009 |
| EP | 2144177 | 1/2010 |
| EP | 2216678 | 1/2010 |
| EP | 2196843 | 6/2010 |
| EP | 2241926 | 10/2010 |
| EP | 2662761 | 11/2013 |
| EP | 2700987 | 2/2014 |
| EP | 2752691 | 7/2014 |
| EP | 2887121 | 6/2015 |
| EP | 3018524 | 5/2016 |
| FR | 2942811 | 9/2010 |
| GB | 2500631 | 10/2013 |
| JP | S5557807 | 4/1980 |
| JP | S57109618 | 7/1982 |
| JP | S599920 | 1/1984 |
| JP | S5962888 | 4/1984 |
| JP | S60188911 | 9/1985 |
| JP | S6252506 | 3/1987 |
| JP | S62278508 | 12/1987 |
| JP | H03180801 | 8/1991 |
| JP | H0422358 | 1/1992 |
| JP | H06310806 | 11/1994 |
| JP | 7311303 | 11/1995 |
| JP | H08163602 A | 6/1996 |
| JP | 2000013818 A | 1/2000 |
| JP | 2000347037 | 12/2000 |
| JP | 2001078234 | 3/2001 |
| JP | 2002365589 A | 12/2002 |
| JP | 2003005128 A | 1/2003 |
| JP | 2004219664 A | 8/2004 |
| JP | 2006195333 A | 7/2006 |
| JP | 2006267887 A | 10/2006 |
| JP | 2008015125 A | 1/2008 |
| JP | 2008017135 | 1/2008 |
| JP | 2012042654 A | 3/2012 |
| KR | 20070001771 | 1/2007 |
| KR | 20090076539 | 7/2009 |
| KR | 20090084316 | 8/2009 |
| KR | 20110070087 | 6/2011 |
| KR | 20120023458 | 3/2012 |
| WO | WO-9418595 | 8/1994 |
| WO | WO-9952002 | 10/1999 |
| WO | WO-2001033282 | 5/2001 |
| WO | WO-0177915 | 10/2001 |
| WO | WO-0195027 | 12/2001 |
| WO | WO-03090611 | 11/2003 |
| WO | WO-2006054056 | 5/2006 |
| WO | WO-2006064334 | 6/2006 |
| WO | WO-2007052265 | 5/2007 |
| WO | WO-2007057500 | 5/2007 |
| WO | WO-2008021504 | 2/2008 |
| WO | WO-2008081070 | 7/2008 |
| WO | WO-2009029826 | 3/2009 |
| WO | WO-2009077601 | 6/2009 |
| WO | WO-2009127849 | 10/2009 |
| WO | WO-2010092409 | 8/2010 |
| WO | WO-2010125337 | 11/2010 |
| WO | WO-2011003381 | 1/2011 |
| WO | WO-2011051660 | 5/2011 |
| WO | WO-2011090455 | 7/2011 |
| WO | WO-2011110728 | 9/2011 |
| WO | WO-2011131978 | 10/2011 |
| WO | WO-2012172295 | 12/2012 |

(56) References Cited

FOREIGN PATENT DOCUMENTS

| WO | WO-2012177811 | 12/2012 |
|----|---------------|---------|
| WO | WO-2013033274 | 3/2013 |
| WO | WO-2013058769 | 4/2013 |
| WO | WO-2013164665 | 11/2013 |
| WO | WO-201407202 | 2/2014 |
| WO | WO-2014051920 | 4/2014 |
| WO | WO-2014085502 | 6/2014 |
| WO | WO-2014088343 | 6/2014 |
| WO | WO-2014111163 | 7/2014 |
| WO | WO-2014130383 | 8/2014 |
| WO | WO-2015091669 | 6/2015 |
| WO | WO-2016014368 | 1/2016 |
| WO | WO-2016064575 | 4/2016 |

OTHER PUBLICATIONS

"Second Written Opinion", Application No. PCT/US2016/015869, dated Jan. 20, 2017, 5 pages.
"Second Written Opinion", Application No. PCT/US2016/015873, dated Feb. 6, 2017, 6 pages.
"Second Written Opinion", Application No. PCT/US2016/015496, dated Feb. 9, 2017, 7 pages.
"International Preliminary Report on Patentability", Application No. PCT/US2015/042187, dated Oct. 31, 2016, 7 pages.
"Examiner's Answer to Appeal Brief", U.S. Appl. No. 14/447,419, filed Feb. 27, 2017, 8 pages.
"Corrected Notice of Allowance", U.S. Appl. No. 14/617,683, dated Aug. 21, 2017, 6 pages.
"Final Office Action", U.S. Appl. No. 14/617,606, dated Sep. 5, 2017, 15 pages.
"International Preliminary Report on Patentability", Application No. PCT/US2016/016029, dated Apr. 13, 2017, 9 pages.
"Non-Final Office Action", U.S. Appl. No. 14/447,446, dated Jun. 9, 2017, 15 pages.
"Notice of Allowance", U.S. Appl. No. 14/448,913, dated Aug. 9, 2017, 10 pages.
"Notice of Allowance", U.S. Appl. No. 14/617,683, dated Aug. 9, 2017, 9 pages.
"Second Written Opinion", Application No. PCT/US2016/016029, dated Jan. 20, 2017, 6 pages.
"Office Action arid Search Report Issued in Chinese Patent Application No. 201680009464.6", dated Feb. 11, 2019, 16 Pages.
"Office Action and Search Report Issued in Chinese Patent Application No. 201680009565.3", dated Feb. 3, 2019, 12 Pages.
"Office Action and Search Report Issued in Chinese Patent Application No. 201680009547.5", dated Feb. 3, 2019, 16 Pages.
"Second Office Action Issued in Chinese Patent Application No. 201680009565.3", dated Jul. 11, 2019, 6 Pages.
"Corrected Notice of Allowance", U.S. Appl. No. 14/617,710, dated Dec. 13, 2016, 2 pages.
"Final Office Action", U.S. Appl. No. 14/617,606, dated Dec. 27, 2016, 13 pages.
"Final Office Action", U.S. Appl. No. 14/617,666, dated Dec. 12, 2016, 29 pages.
"International Preliminary Report on Patentability", Application No. PCT/US2015/041900, dated Oct. 11, 2016, 6 pages.
"Non-Final Office Action", U.S. Appl. No. 14/617,769, dated Jan. 12, 2017, 10 pages.
Schrauwen,"Focused-Ion-Beam Fabrication of Slanted Grating Couplers in Silicon-on-Insulator Waveguides", IEEE Photonics Technology Letters, vol. 19, Issue 11, Jun. 1, 2007, 3 pages.
"Corrected Notice of Allowance", U.S. Appl. No. 14/617,683, dated Oct. 27, 2017, 6 pages.
"Corrected Notice of Allowance", U.S. Appl. No. 14/617,769, dated Feb. 15, 2018, 7 pages.
"Final Office Action", U.S. Appl. No. 14/617,666, dated Nov. 20, 2017, 30 pages.
"Non-Final Office Action", U.S. Appl. No. 14/617,666, dated Feb. 9, 2018, 29 pages.
"Non-Final Office Action", U.S. Appl. No. 14/617,710, dated Oct. 20, 2017, 23 pages.
"Notice of Allowance", U.S. Appl. No. 14/617,769, dated Nov. 17, 2017, 9 pages.
"Non Final Office Action Issued in U.S. Appl. No. 13/432,311", dated Sep. 20, 2017, 28 Pages.
"Final Office Action Issued in U.S. Appl. No. 14/447,446", dated Dec. 5, 2017, 16 Pages.
"Non Final Office Action Issued in U.S. Appl. No. 14/617,666", dated Sep. 25, 2018, 24 Pages.
"Non-Final Office Action Issued in U.S. Appl. No. 15/642,020", dated Oct. 6, 2017, 14 Pages.
"Non-Final Office Action Issued in U.S. Appl. No. 15/987,795", dated Aug. 30, 2018, 21 Pages.
"First Office Action and Search Report Issued in Chinese Patent Application No. 201380015757.1", dated Jul. 11, 2016, 13 Pages.
"Third Office Action Issued in Chinese Patent Application No. 201380015757.1", dated Dec. 19, 2017, 10 Pages.
"Office Action Issued in Russian Patent Application No. 2015124081", dated Nov. 14, 2017, 7 Pages.
"Office Action Issued in Japanese Patent Application No. 2015-501688", dated Dec. 5, 2017, 7 Pages.
"Office Action Issued in Japanese Patent Application No. 2015-503284", dated Aug. 16, 2017, 12 Pages.
"Office Action Issued in Japanese Patent Application No. 2015-549765", dated Nov. 1, 2017, 7 Pages.
"Ex Parte Quayle Action", U.S. Appl. No. 14/617,769, filed Jun. 2, 2017, 7 pages.
"International Preliminary Report on Patentability", Application No. PCT/US2016/015871, dated May 15, 2017, 10 pages.
"International Preliminary Report on Patentability", Application No. PCT/US2016/019006, dated Jun. 6, 2017, 11 pages.
"International Preliminary Report on Patentability", Application No. PCT/US2016/016027, dated May 3, 2017, 8 pages.
"International Preliminary Report on Patentability", Application No. PCT/US2016/015873, dated May 15, 2017, 8 pages.
"International Preliminary Report on Patentability", Application No. PCT/US2016/015496, dated May 4, 2017, 9 pages.
"International Preliminary Report on Patentability", Application No. PCT/US2016/016241, dated May 4, 2017, 9 pages.
"Non-Final Office Action", U.S. Appl. No. 14/670,242, dated Jun. 8, 2017, 26 pages.
"Second Written Opinion", Application No. PCT/US2016/016027, dated Jan. 24, 2017, 5 pages.
"Second Written Opinion", Application No. PCT/US2016/019006, dated Feb. 20, 2017, 9 pages.
Widnall,"Lecture L3—Vectors, Matrices and Coordinate Transformations", 16.07 Dynamics, 2009, 16 pages.
"Non-Final Office Action", U.S. Appl. No. 14/617,606, dated Mar. 27, 2017, 14 pages.
"Non-Final Office Action", U.S. Appl. No. 14/617,666, dated Mar. 22, 2017, 23 pages.
"Non-Final Office Action", U.S. Appl. No. 14/617,683, dated Apr. 21, 2017, 13 pages.
"Restriction Requirement", U.S. Appl. No. 14/447,446, dated Feb. 9, 2017, 7 pages.
"Second Written Opinion", Application No. PCT/US2016/015871, dated Feb. 6, 2017, 8 pages.
"Second Written Opinion", Application No. PCT/US2016/016028, dated Feb. 3, 2017, 5 pages.
"Second Written Opinion", Application No. PCT/US2016/016241, dated Feb. 9, 2017, 7 pages.
"Final Office Action Issued in U.S. Appl. No. 14/647,666", dated Jan. 22, 2019 23 Pages.
"Second Office Action and Search Report Issued in Chinese Patent Application No. 201680009464.6", dated Aug. 1, 2019, 12 Pages.
"Second Office Action Issued in Chinese Patent Application No. 201680009547.5", dated Aug. 1, 2019, 12 Pages.
"Non Final Office Action Issued in U.S. Appl. No. 16/422,645", dated Oct. 4, 2019, 14 Pages.

(56) References Cited

OTHER PUBLICATIONS

"Adobe Audition / Customizing Workspaces", Retrieved From: <http://help.adobe.com/en_US/audition/cs/using/WNS9FA7B8D7-5991-4e05-B13C-4C85DAF1F051.html> Jul. 5, 2014, May 18, 2011, 6 Pages.

"Advisory Action", U.S. Appl. No. 13/428,879, dated Sep. 19, 2014, 3 pages.

"Always Connected", Available at: http://www.samsung.com/global/microsite/galaxycamera/nx/, Jun. 24, 2013, 5 pages.

"Augmented Reality and Physical Games", U.S. Appl. No. 13/440,165, filed Apr. 5, 2012, 49 pages.

"BragGrate Mirror", Retrieved from <http://web.archive.org/web/20090814104232/http://www.optigrate.com/BragGrate_Mirror.html> on Jul. 8, 2014, Aug. 14, 2009, 2 pages.

"Controlling Your Desktop's Power Management", Retrieved From: <http://www.vorkon.de/SU1210.001/drittanbieter/Dokumentation/openSUSE_11.2/manual/sec.gnomeuser.start.power_mgmt.html> Jul. 7, 2014, 6 Pages.

"Corrected Final Office Action", U.S. Appl. No. 13/432,311, dated Dec. 24, 2014, 25 pages.

"Corrected Notice of Allowance", U.S. Appl. No. 13/355,836, dated Sep. 11, 2014, 2 pages.

"Corrected Notice of Allowance", U.S. Appl. No. 13/355,836, dated Dec. 15, 2014, 2 pages.

"Corrected Notice of Allowance", U.S. Appl. No. 14/617,574, dated Sep. 12, 2016, 10 pages.

"Corrected Notice of Allowance", U.S. Appl. No. 14/617,574, dated Oct. 21, 2016, 2 pages.

"Corrected Notice of Allowance", U.S. Appl. No. 14/617,723, dated Apr. 20, 2016, 7 pages.

"Corrected Notice of Allowance", U.S. Appl. No. 14/617,735, dated Jun. 20, 2016, 2 pages.

"Corrected Notice of Allowance", U.S. Appl. No. 14/617,735, dated Jul. 21, 2016, 2 pages.

"DigiLens", SBG Labs—retrieved from <http://www.digilens.com/products.html> on Jun. 19, 2012, 1 page.

"Display Control", Retrieved From: <http://www.portrait.com/technology/display-control.html> Jul. 4, 2014, Jun. 24, 2013, 5 Pages.

"Final Office Action", U.S. Appl. No. 13/229,554, dated Feb. 27, 2015, 29 pages.

"Final Office Action", U.S. Appl. No. 13/229,554, dated Jun. 16, 2016, 35 pages.

"Final Office Action", U.S. Appl. No. 13/336,873, dated Jan. 5, 2015, 21 pages.

"Final Office Action", U.S. Appl. No. 13/336,895, dated May 27, 2014, 11 pages.

"Final Office Action", U.S. Appl. No. 13/355,836, dated Mar. 10, 2014, 18 pages.

"Final Office Action", U.S. Appl. No. 13/355,914, dated Feb. 23, 2015, 21 pages.

"Final Office Action", U.S. Appl. No. 13/355,914, dated Jun. 19, 2014, 11 pages.

"Final Office Action", U.S. Appl. No. 13/397,495, dated May 29, 2014, 10 pages.

"Final Office Action", U.S. Appl. No. 13/397,516, dated Jan. 29, 2015, 13 pages.

"Final Office Action", U.S. Appl. No. 13/397,539, dated Jun. 29, 2015, 11 pages.

"Final Office Action", U.S. Appl. No. 13/428,879, dated Jul. 14, 2014, 12 pages.

"Final Office Action", U.S. Appl. No. 13/432,311, dated Dec. 15, 2014, 24 pages.

"Final Office Action", U.S. Appl. No. 13/432,372, dated Jan. 29, 2015, 33 pages.

"Final Office Action", U.S. Appl. No. 13/440,165, dated Jun. 6, 2014, 12 pages.

"Final Office Action", U.S. Appl. No. 13/440,165, dated Jul. 21, 2015, 11 pages.

"Final Office Action", U.S. Appl. No. 13/477,646, dated Feb. 23, 2015, 36 pages.

"Final Office Action", U.S. Appl. No. 13/477,646, dated May 5, 2014, 26 pages.

"Final Office Action", U.S. Appl. No. 13/525,649, dated Oct. 9, 2014, 8 pages.

"Final Office Action", U.S. Appl. No. 13/774,875, dated Apr. 22, 2016, 10 pages.

"Final Office Action", U.S. Appl. No. 13/774,875, dated Jun. 4, 2015, 10 pages.

"Final Office Action", U.S. Appl. No. 14/,447,419, dated Aug. 29, 2016, 11 pages.

"Final Office Action", U.S. Appl. No. 14/134,993, dated Jul. 16, 2015, 19 pages.

"Final Office Action", U.S. Appl. No. 14/134,993, dated Aug. 20, 2014, 15 pages.

"Final Office Action", U.S. Appl. No. 14/447,419, dated May 17, 2016, 10 pages.

"Final Office Action", U.S. Appl. No. 14/617,683, dated Nov. 28, 2016, 16 pages.

"Final Office Action", U.S. Appl. No. 14/617,710, dated Aug. 2, 2016, 19 pages.

"Foreign Notice of Allowance", CN Application No. 201320034345.X, dated Aug. 14, 2013, 2 Pages.

"Foreign Office Action", CN Application No. 201210563730.3, dated Jan. 7, 2015, 16 pages.

"Foreign Office Action", CN Application No. 201210567932.5, dated Aug. 14, 2014, 12 pages.

"Foreign Office Action", CN Application No. 201380017348.5, dated Jan. 14, 2016, 12 pages.

"Foreign Office Action", EP Application No. 13769961.7, dated Mar. 11, 2015, 8 pages.

"Foreign Office Action", EP Application No. 13769961.7, dated Jun. 30, 2015, 6 pages.

"HDTV Helmet Mounted Display", Available at <http://defense-update.com/products/h/HDTV-HMD.htm>, Jan. 26, 2005, 1 page.

"International Preliminary Report on Patentability", Application No. PCT/US2015/041930, dated Oct. 26, 2016, 9 pages.

"International Search Report and Written Opinion", Application No. PCT/US2012/069331, dated Mar. 29, 2013, 10 pages.

"International Search Report and Written Opinion", Application No. PCT/US2014/016658, dated Apr. 23, 2014, 10 pages.

"International Search Report and Written Opinion", Application No. PCT/US2015/042371, dated Oct. 2, 2015, 10 pages.

"International Search Report and Written Opinion", Application No. PCT/US2013/053676, dated Oct. 16, 2013, 10 pages.

"International Search Report and Written Opinion", Application No. PCT/US2015/042187, dated Oct. 20, 2015, 10 pages.

"International Search Report and Written Opinion", Application No. PCT/US2015/042226, dated Oct. 27, 2015, 10 Pages.

"International Search Report and Written Opinion", Application No. PCT/US2015/042205, dated Oct. 30, 2015, 10 pages.

"International Search Report and Written Opinion", Application No. PCT/US2015/042218, dated Nov. 6, 2015, 10 pages.

"International Search Report and Written Opinion", Application No. PCT/US2013/030632, dated Jun. 26, 2013, 10 pages.

"International Search Report and Written Opinion", Application No. PCT/US2016/015496, dated Apr. 11, 2016, 11 pages.

"International Search Report and Written Opinion", Application No. PCT/US2016/015873, dated May 23, 2016, 11 pages.

"International Search Report and Written Opinion", Application No. PCT/US2016/016028, dated May 25, 2016, 11 pages.

"International Search Report and Written Opinion", Application No. PCT/US2015/042259, dated Oct. 12, 2015, 11 pages.

"International Search Report and Written Opinion", Application No. PCT/US2013/028477, dated Jun. 21, 2013, 11 pages.

"International Search Report and Written Opinion", Application No. PCT/US2013/031111, dated Jun. 26, 2013, 11 pages.

"International Search Report and Written Opinion", Application No. PCT/US2016/016241, dated Apr. 20, 2016, 12 pages.

"International Search Report and Written Opinion", Application No. PCT/US2016/015869, dated May 12, 2016, 12 pages.

(56) References Cited

OTHER PUBLICATIONS

"International Search Report and Written Opinion", Application No. PCT/US2016/016029, dated May 12, 2016, 12 pages.
"International Search Report and Written Opinion", Application No. PCT/US2015/041930, dated Oct. 20, 2015, 12 Pages.
"International Search Report and Written Opinion", Application No. PCT/US2015/041900, dated Oct. 21, 2015, 12 pages.
"International Search Report and Written Opinion", Application No. PCT/US2013/076832, dated Mar. 17, 2014, 12 pages.
"International Search Report and Written Opinion", Application No. PCT/US2013/061225, dated Jun. 4, 2014, 12 pages.
"International Search Report and Written Opinion", Application No. PCT/US2016/016027, dated May 17, 2016, 13 pages.
"International Search Report and Written Opinion", Application No. PCT/US2016/015871, dated Jun. 13, 2016, 13 pages.
"International Search Report and Written Opinion", Application No. PCT/US2015/041909, dated Oct. 20, 2015, 13 pages.
"International Search Report and Written Opinion", Application No. PCT/US2012/071563, dated Apr. 25, 2013, 13 pages.
"International Search Report and Written Opinion", Application No. PCT/US2016/019006, dated May 12, 2016, 14 pages.
"International Search Report and Written Opinion", Application No. PCT/US2016/016242, dated May 27, 2018, 14 pages.
"International Search Report and Written Opinion", Application No. PCT/US2015/041046, dated Nov. 9, 2015, 15 pages.
"International Search Report and Written Opinion", Application No. PCT/US2016/015497, dated May 19, 2016, 17 pages.
"International Search Report and Written Opinion", Application No. PCT/US2015/054350, dated Feb. 5, 2016, 9 pages.
"International Search Report and Written Opinion", Application No. PCT/US2013/021784, dated Apr. 30, 2013, 9 pages.
"International Search Report and Written Opinion", Application No. PCT/US2012/069330, dated Mar. 28, 2013, 9 pages.
"International Search Report and Written Opinion", Application No. PCT/US2013/021783, dated May 15, 2013, 9 pages.
"International Search Report and Written Opinion", Application No. PCT/US2013/026200, dated Jun. 3, 2013, 9 pages.
"Light Guide Techniques using LED Lamps", Application Brief I-003, retrieved from <http://www.ciri.org.nz/downloads/Lightpipe%20design.pdf> on Jan. 12, 2012, Oct. 14, 2008, 22 pages.
"Manage Multiple Windows", Retrieved From: <http://windows.microsoft.com/en-hk/windows/manage-multiple-windows#1TC=windows-7> Jul. 8, 2014, 4 Pages.
"Merge Operator", Retrieved on: Jun. 3, 2014, Available at: https://github.com/facebook/rocksdb/wiki/Merge-Operator, 10 pages.
"New Technology from MIT may Enable Cheap, Color, Holographic Video Displays", Retrieved from <http://www.gizmag.com/holograph-3d-color-video-display-inexpensive-mit/28029/> on Feb. 25, 2015, Jun. 24, 2013, 8 pages.
"Non-Final Office Action", U.S. Appl. No. 13/397,495, dated Nov. 13, 2013, 8 pages.
"Non-Final Office Action", U.S. Appl. No. 13/440,165, dated Feb. 6, 2014, 12 pages.
"Non-Final Office Action", U.S. Appl. No. 13/229,554, dated Feb. 3, 2016, 33 pages.
"Non-Final Office Action", U.S. Appl. No. 13/336,873, dated Apr. 9, 2015, 18 pages.
"Non-Final Office Action", U.S. Appl. No. 13/336,873, dated Jul. 25, 2014, 16 pages.
"Non-Final Office Action", U.S. Appl. No. 13/336,895, dated Oct. 24, 2013, 9 pages.
"Non-Final Office Action", U.S. Appl. No. 13/343,675, dated Jul. 16, 2013, 9 pages.
"Non-Final Office Action", U.S. Appl. No. 13/355,836, dated Nov. 4, 2013, 15 pages.
"Non-Final Office Action", U.S. Appl. No. 13/355,914, dated Feb. 14, 2014, 10 pages.
"Non-Final Office Action", U.S. Appl. No. 13/355,914, dated Oct. 28, 2014, 18 pages.
"Non-Final Office Action", U.S. Appl. No. 13/397,495, dated Apr. 3, 2015, 11 pages.
"Non-Final Office Action", U.S. Appl. No. 13/397,516, dated Jun. 12, 2014, 11 pages.
"Non-Final Office Action", U.S. Appl. No. 13/397,516, dated Nov. 25, 2013, 10 pages.
"Non-Final Office Action", U.S. Appl. No. 13/397,539, dated Mar. 16, 2015, 9 pages.
"Non-Final Office Action", U.S. Appl. No. 13/397,617, dated May 5, 2015, 6 pages.
"Non-Final Office Action", U.S. Appl. No. 13/397,617, dated Oct. 9, 2014, 6 pages.
"Non-Final Office Action", U.S. Appl. No. 13/428,879, dated Feb. 24, 2015, 10 pages.
"Non-Final Office Action", U.S. Appl. No. 13/428,879, dated Mar. 17, 2014, 10 pages.
"Non-Final Office Action", U.S. Appl. No. 13/428,879, dated Jun. 26, 2015, 13 pages.
"Non-Final Office Action", U.S. Appl. No. 13/432,311, dated Jun. 2, 2015, 25 pages.
"Non-Final Office Action", U.S. Appl. No. 13/432,311, dated Jul. 8, 2014, 33 pages.
"Non-Final Office Action", U.S. Appl. No. 13/432,311, dated Aug. 17, 2016, 18 pages.
"Non-Final Office Action", U.S. Appl. No. 13/432,372, dated May 9, 2014, 26 pages.
"Non-Final Office Action", U.S. Appl. No. 13/432,372, dated Oct. 24, 2014, 27 pages.
"Non-Final Office Action", U.S. Appl. No. 13/440,165, dated Feb. 13, 2015, 10 pages.
"Non-Final Office Action", U.S. Appl. No. 13/440,165, dated Oct. 16, 2014, 11 pages.
"Non-Final Office Action", U.S. Appl. No. 13/477,646, dated Jun. 18, 2015, 43 pages.
"Non-Final Office Action", U.S. Appl. No. 13/477,646, dated Oct. 6, 2014, 34 pages.
"Non-Final Office Action", U.S. Appl. No. 13/477,646, dated Nov. 22, 2013, 20 pages.
"Non-Final Office Action", U.S. Appl. No. 13/525,649, dated Jan. 29, 2014, 7 pages.
"Non-Final Office Action", U.S. Appl. No. 13/525,649, dated Feb. 5, 2015, 7 pages.
"Non-Final Office Action", U.S. Appl. No. 13/525,649, dated Jun. 5, 2014, 7 pages.
"Non-Final Office Action", U.S. Appl. No. 13/570,073, dated Jan. 23, 2015, 7 pages.
"Non-Final Office Action", U.S. Appl. No. 13/631,308, dated Feb. 23, 2015, 9 pages.
"Non-Final Office Action", U.S. Appl. No. 13/722,917, dated May 21, 2015, 12 pages.
"Non-Final Office Action", U.S. Appl. No. 13/774,875, dated Sep. 16, 2015, 8 pages.
"Non-Final Office Action", U.S. Appl. No. 13/774,875, dated Nov. 24, 2014, 8 pages.
"Non-Final Office Action", U.S. Appl. No. 14/134,993, dated Jan. 22, 2015, 17 pages.
"Non-Final Office Action", U.S. Appl. No. 14/134,993, dated Apr. 17, 2014, 34 pages.
"Non-Final Office Action", U.S. Appl. No. 14/335,927, dated Jun. 3, 2016, 8 pages.
"Non-Final Office Action", U.S. Appl. No. 14/447,419, dated Feb. 2, 2016, 8 pages.
"Non-Final Office Action", U.S. Appl. No. 14/617,574, dated Feb. 26, 2016, 22 pages.
"Non-Final Office Action", U.S. Appl. No. 14/617,606, dated May 23, 2016, 12 pages.
"Non-Final Office Action", U.S. Appl. No. 14/617,606, dated Sep. 9, 2016, 12 pages.
"Non-Final Office Action", U.S. Appl. No. 14/617,666, dated Jul. 26, 2016, 21 pages.
"Non-Final Office Action", U.S. Appl. No. 14/617,683, dated Aug. 3, 2016, 14 pages.

(56) References Cited

OTHER PUBLICATIONS

"Non-Final Office Action", U.S. Appl. No. 14/617,710, dated Mar. 2, 2016, 16 pages.
"Non-Final Office Action", U.S. Appl. No. 14/746,298, dated Aug. 28, 2015, 6 pages.
"Notice of Allowance", U.S. Appl. No. 13/336,895, dated Aug. 11, 2014, 6 pages.
"Notice of Allowance", U.S. Appl. No. 13/343,675, dated Sep. 16, 2013, 8 pages.
"Notice of Allowance", U.S. Appl. No. 13/355,836, dated Jun. 13, 2014, 11 pages.
"Notice of Allowance", U.S. Appl. No. 13/355,836, dated Oct. 8, 2014, 11 pages.
"Notice of Allowance", U.S. Appl. No. 13/356,545, dated Mar. 28, 2014, 6 pages.
"Notice of Allowance", U.S. Appl. No. 13/488,145, dated Nov. 19, 2014, 8 pages.
"Notice of Allowance", U.S. Appl. No. 14/447,464, dated Nov. 9, 2015, 10 pages.
"Notice of Allowance", U.S. Appl. No. 14/617,574, dated Jul. 20, 2016, 13 pages.
"Notice of Allowance", U.S. Appl. No. 14/617,697, dated Feb. 29, 2016, 7 pages.
"Notice of Allowance", U.S. Appl. No. 14/617,697, dated Jul. 22, 2016, 5 pages.
"Notice of Allowance", U.S. Appl. No. 14/617,710, dated Oct. 7, 2016, 9 pages.
"Notice of Allowance", U.S. Appl. No. 14/617,723, dated Feb. 9, 2016, 10 pages.
"Notice of Allowance", U.S. Appl. No. 14/617,723, dated May 24, 2016, 7 pages.
"Notice of Allowance", U.S. Appl. No. 14/617,735, dated Apr. 5, 2016, 12 pages.
"Notice of Allowance", U.S. Appl. No. 14/617,746, dated Apr. 11, 2016, 7 pages.
"Organize Your Desktop Workspace for More Comfort with WindowSpace", Retrieved From: <http://www.ntwind.com/software/windowspace.html> Jul. 4, 2014, Sep. 19, 2008, 5 Pages.
"Restriction Requirement", U.S. Appl. No. 13/355,836, dated Sep. 27, 2013, 6 pages.
"Restriction Requirement", U.S. Appl. No. 13/397,539, dated Dec. 1, 2014, 6 pages.
"Restriction Requirement", U.S. Appl. No. 13/488,145, dated Sep. 8, 2014, 14 pages.
"Restriction Requirement", U.S. Appl. No. 13/570,073, dated Nov. 18, 2014, 7 pages.
"Restriction Requirement", U.S. Appl. No. 14/447,419, dated Aug. 4, 2015, 6 pages.
"Restriction Requirement", U.S. Appl. No. 14/617,683, dated May 9, 2016, 6 pages.
"Restriction Requirement", U.S. Appl. No. 14/617,697, dated Nov. 30, 2015, 6 pages.
"Second Written Opinion", Application No. PCT/US2015/041900, dated Jun. 30, 2016, 6 pages.
"Second Written Opinion", Application No. PCT/US2015/041909, dated Jun. 21, 2016, 6 pages.
"Second Written Opinion", Application No. PCT/US2015/041930, dated Jun. 21, 2016, 5 pages.
"SizeUp the Missing Window Manager", Retrieved From: <https://www.irradiatedsoftware.com/sizeup/> Jul. 4, 2014, Jan. 17, 2013, 4 Pages.
"Supplemental Notice of Allowance", U.S. Appl. No. 13/356,545, dated Jul. 22, 2014, 2 pages.
"Supplemental Notice of Allowance", U.S. Appl. No. 14/447,464, dated Jan. 12, 2016, 2 pages.
"Supplementary European Search Report", EP Application No. 13769961.7, dated Mar. 3, 2015, 3 pages.
"Two-Faced: Transparent Phone with Dual Touch Screens", Retrieved from <http://gajitz.com/two-faced-transparent-phone-with-dual-touch-screens/>, Jun. 7, 2012, 3 pages.
"Using Flickr to Organize a Collection of Images", Available at: http://www.jiscdigitalmedia.ac.uk/guide/using-flickr-to-organise-a-collection-of-images, Apr. 2, 2013, 17 pages.
"Variable Groove Depth (VGD) Master Gratings", Retrieved From: <http://www.horiba.com/scientific/products/diffraction-gratings/catalog/variable-groove-depth-vgd/> May 28, 2014, 2 pages.
"Window Magnet", Retrieved From: <http://magnet.crowdcafe.com/> Jul. 4, 2014, Jun. 23, 2011, 2 Pages.
"Windows 7: Display Reminder When Click on Shutdown?", Retrieved From: <http://www.sevenforums.com/customization/118688-display-reminder-when-click-shutdown.html> Jul. 8, 2014, Oct. 18, 2010, 5 Pages.
"Working with Windows", Retrieved From: <http://windows.microsoft.com/en-us/windows/working-with-windows#1TC=windows-7> Jul. 4, 2014, 10 Pages.
"Written Opinion", Application No. PCT/US2013/061225, dated Oct. 10, 2014, 6 Pages.
Allen,"ELiX1R—Solid-State Luminaire with Enhanced Light Extraction by Internal Reflection", Journal of Display Technology, vol. 3, No. 2, Available at <http://www.nanolab.uc.edu/Publications/PDFfiles/355.pdf>, Jun. 2007, pp. 155-159.
Ando,"Development of Three-Dimensional Microstages Using Inclined Deep-Reactive Ion Etching", Journal of Microelectromechanical Systems, Jun. 1, 2007, 10 pages.
Antonopoulos,"Efficient Updates for Web-Scale Indexes over the Cloud", IEEE 28th International Conference on Data Engineering Workshops, Apr. 2012, 8 pages.
Aron,"'Sprinting' chips could push phones to the speed limit", New Scientist, Feb. 20, 2012, Issue #2852, Feb. 20, 2012, 2 pages.
Ashraf,"Winsplit Revolution: Tile, Resize, and Position Windows for Efficient Use of Your Screen", Retrieved From: <http://dottech.org/11240/winsplit-revolution-tile-resize-and-position-windows-for-efficient-use-of-your-screen/> Jul. 8, 2014, Dec. 18, 2011, 4 Pages.
Baluja,"Non-Intrusive Gaze Tracking Using Artificial Neural Networks", Technical Report CMU-CS-94-102, Available at <http://citeseerx.ist.psu.edu/viewdoc/download?doi=10.1.1.33.4027&rep=rep1&type=pdf> , Jan. 5, 1994, 14 pages.
Barger,"COTS Cooling", Publication of the National Electronics Manufacturing Center of Excellence, Retrieved from: <http://www.empf.org/empfasis/2009/Oct09/cots.html > on Jul. 9, 2012, Oct. 2009, 4 pages.
Baudisch,"Back-of-Device Interaction Allows Creating Very Small Touch Devices", In Proceedings of 27th International Conference on Human Factors in Computing Systems, Retrieved from <http://citeseerx.ist.psu.edu/viewdoc/download?doi=10.1.1.160.3337&rep=rep1&type=pdf>, Apr. 2005, 10 pages.
Baxtor,"TwinTech GeForce GTS 250 XT OC 1GB Graphics Card", retrieved from <http://www.tweaktown.com/reviews/2733/twintech_geforce_gts_250_xt_oc_1gb_graphics_card/index3.html> on Dec. 30, 2011, Apr. 24, 2009, 4 pages.
Berger,"Photonic Band Gaps and Holography", Journal of Applied Physics 82 (1), Jul. 1997, 6 pages.
Callaghan,"Types of writes", Available at: http://smalldatum.blogspot.in/2014/04/types-of-writes.html, Apr. 17, 2014, 3 pages.
Chang-Yen,"A Monolithic PDMS Waveguide System Fabricated Using Soft-Lithography Techniques", In Journal of Lightwave Technology, vol. 23, No. 6, Jun. 2005, 6 pages.
Charles,"Design of Optically Path Length Matched, Three-Dimensional Photonic Circuits Comprising Uniquely Routed Waveguides", In Proceedings of Applied Optics, vol. 51, Issue 27, Sep. 20, 2012, 11 pages.
Chen,"A Study of Fiber-to-Fiber Losses in Waveguide Grating Routers", In Journal of Lightwave Technology, vol. 15, No. 10, Oct. 1997, 5 pages.
Chen,"Strategies for 3D Video with Wide Fields-of-View", IEEE Proceeding Optoelectronics, vol. 148, Issue 2, Available at <http://ieeexplore.ieee.org/stamp/stamp.jsp?tp=&arnumber=926823>, Apr. 2001, pp. 85-90.
Cheng,"Waveguide Displays Based on Polymer-dispersed Liquid Crystals", SPIE Newsroom, Available at <http://spie.org/documents/Newsroom/Imported/003805/003805_10.pdf>, Aug. 12, 2011, 2 pages.

(56) References Cited

OTHER PUBLICATIONS

Chirgwin,"Researchers propose 'overclock' scheme for mobiles—Processing at a sprint to overcome tech limitations", The Register, Feb. 21, 2012, Feb. 21, 2012, 2 pages.
Cohen,"Automatic Strategies in the Siemens RTL Tiled Window Manager", In Proceedings: The 2nd IEEE Conference on Computer Workstations, Mar. 7, 1988, pp. 111-119.
Coldewey,"Researchers Propose "Computational Sprinting" to Speed Up Chips by 1000%—But Only for a Second", TechCrunch, Feb. 28, 2012, Feb. 29, 2012, 2 pages.
Cottier,"Label-free Highly Sensitive Detection of (small) Molecules by Wavelength Interrogation of Integrated Optical Chips", n Proceedings of Sensors and Actuators B: Chemical, vol. 91, Issue 1-3, Jun. 1, 2003, pp. 241-251.
DeAgazio,"Selecting Display Backlighting for Portable, Handheld Devices", Hearst Electronics Products, retrieved from <http://www2.electronicproducts.com/Selecting_display_backlighting_for_portable_handheld_devices-article-farcglobal-feb2008-html.aspx> on Jan. 12, 2012, Jan. 2, 2008, 4 pages.
Dumon,"Compact Arrayed Waveguide Grating Devices in Silicon-on-Insulator", in Proceedings of the IEEE/LEOS Symposium Benelux Chapter, May 27, 2014, 4 pages.
Eadicicco,"First Transparent Tablet Lets You Touch From Both Sides", Retrieved from <http://blog.laptopmag.com/first-transparent-tablet>, Dec. 26, 2013, 4 pages.
Eckel,"Personalize Alerts with the Help of OS X Mavericks Notifications", Retrieved From: <http://www.techrepublic.com/article/customize-os-x-mavericks-notifications-to-personalize-alerts/> Jul. 8, 2014, Mar. 10, 2014, 7 Pages.
Elnaka,"Real-Time Traffic Classification for Unified Communication Networks", In Proceedings of International Conference on Selected Topics in Mobile and Wireless Networking, Aug. 19, 2013, 6 pages.
Garcia,"COMET: Content Mediator Architecture for Content-Aware Networks", In IEEE Future Network & Mobile Summit, 2011, 8 pages.
Gila,"First Results From a Multi-Ion Beam Lithography and Processing System at the University of Florida", AIP Conference Proceedings, Jun. 1, 2011, 6 pages.
Glendenning,"Polymer Micro-Optics via Micro Injection Moulding", Available at: https://web.archive.org/web/20120310003606/http://www.microsystems.uk.com/english/polymer_optics_injection_moulding.html, Jan. 10, 2011, 6 pages.
Grabamik,"Concave Diffraction Gratings Fabricated With Planar Lithography", In Proceedings of SPIE, vol. 6992, May 3, 2008, 8 pages.
Greenemeier,"Could "Computational Sprinting" Speed Up Smart Phones without Burning Them Out?", Scientific American, Feb. 29, 2012, Feb. 29, 2012, 2 pages.
Greiner,"Bandpass engineering of lithographically scribed channel-waveguide Bragg gratings", In Proceedings of Optics Letters, vol. 29, No. 8, Apr. 15, 2004, pp. 806-808.
Han,"Accurate diffraction efficiency control for multiplexed volume holographic gratings", Retrieved at: opticalengineering.spiedigitallibrary.org/data/Journals/.../2799_1, 2002, 4 pages.
Hepburn,"Color: The Location Based Social Photo App", Available at: http://www.digitalbuzzblog.com/color-the-location-based-social-photo-iphone-app/, Mar. 27, 2011, 12 pages.
Hua,"Engineering of Head-mounted Projective Displays", In Proceedings of Applied Optics, vol. 39, No. 22, Aug. 1, 2000, 11 pages.
Ismail,"Improved Arrayed-Waveguide-Grating Layout Avoiding Systematic Phase Errors", In Proceedings of Optics Express, vol. 19, No. 9, Apr. 25, 2011, pp. 8781-8794.
Jacques,"Polarized Light Imaging of Tissue", Available at <http://www.lumamed.com/documents/5_polarized%20light%20imaging.pdf>, 2004, 17 pages.
Jarvenpaa,"Compact near-to-eye display with integrated gaze tracker", Second International Conference on Computer Engineering and Applications, Mar. 19, 2010, 9 pages.

Jaworski,"A Novel Design of Heat Sink with PCM for Electronics Cooling", 10th International Conference on Thermal Energy Storage, Stockton, May 31-Jun. 2, 2006, retrieved from <https://intraweb.stockton.edu/eyos/energy_studies/content/docs/FINAL_PRESENTATIONS/4b-6%20.pdf> on Jan. 5, 2012, May 31, 2006, 8 pages.
Johnson,"Samsung Galaxy Tab Pro 10.1 Review", Retrieved From: <http://hothardware.com/Reviews/Samsung-Galaxy-Tab-Pro-101-Review/?page=3#!baGZDY > Jul. 9, 2014, Mar. 21, 2014, 10 Pages.
Kandogan,"Elastic Windows: Improved Spatial Layout and Rapid Multiple Window Operations", In Proceedings of the Workshop on Advanced Visual Interfaces, May 27, 1996, 10 Pages.
Karp,"Planar Micro-optic Solar Concentration using Multiple Imaging Lenses into a Common Slab Waveguide", In Proceedings of SPIE vol. 7407, Available at <http://psilab.ucsd.edu/research/slab_concentration/files/SPIE_Slab_Published.pdf>, Jan. 2009, 11 pages.
Kim,"Determination of small angular displacement by moire fringes of matched radial-parallel gratings", Applied Optics, vol. 36, No. 13, May 1997, 8 pages.
Kress,"Exit Pupil for Wearable See-through displays", Downloaded From: http://proceedings.spiedigitallibrary.org/ on Jan. 31, 2015 Terms of Use: http://spiedl.org/terms, 2012, 8 pages.
Krishnan,"A Novel Hybrid Heat Sink Using Phase Change Materials for Transient Thermal Management of Electronics", IEEE transactions on components and packaging technologies, vol. 28, No. 2, retrieved from <http://ieeexploreleee.org/stamp/stamp.jsp?tp=8,arnumber=1432936> on Jan. 5, 2012, Jun. 2005, pp. 281-289.
L,"All-Nanoparticle Concave Diffraction Grating Fabricated by Self-Assembly onto Magnetically-Recorded Templates", In Proceedings of Optical Express, vol. 21, Issue 1, Jan. 2013, 1 page.
Lanman,"Near-eye Light Field Displays", In Journal of ACM Transactions on Graphics, vol. 32, No. 6, Nov. 2013, 10 pages.
Large,"Parallel Optics in Waveguide Displays: a Flat Panel Autostereoscopic", Display Technology, Journal of, Retrieved from <http://download.microsoft.com/download/D/2/E/D2E425F8-CF3C-4C71-A4A2-70F9D4081007/ParallelOpticsinWaveguide-DisplaysMS090925.Final.pdf>, Jun. 21, 2010, pp. 1-7.
Lerner,"Penn Helps Rethink Smartphone Design With 'Computational Sprinting'", Penn News Release, Feb. 28, 2012, 2 pages.
Levandoski,"Latch-Free, Log-Structured Storage for Multiple Access Methods", U.S. Appl. No. 13/924,567, filed Jun. 22, 2013, 51 pages.
Levandoski,"Ranking and New Database Architectures", In Proceedings of the 7th International Workshop on Ranking in Databases, Aug. 2013, 4 pages.
Levandoski,"The Bw-Tree: A B-tree for New Hardware Platforms", In IEEE 29th International Conference on Data Engineering, Apr. 8, 2013, 12 pages.
Levola,"Diffractive optics for virtual reality displays", Journal of the Society for Information Display—SID, Jan. 1, 2006, 9 pages.
Li,"Design Optimization of Reflective Polarizers for LCD Backlight Recycling", Journal of Display Technology, vol. 5, No. 8, Available at <http://ieeexplore.ieee.org/stamp/stamp.jsp?tp=&arnumber=5196840 >, Aug. 2009, pp. 335-340.
Li,"QRON: QoS-Aware Routing in Overlay Networks", In Proceedings of IEEE Journal on Selected Areas in Communications, vol. 22, No. 1, Jan. 2004, 12 pages.
Li,"Switchable Electro-optic Diffractive Lens with High Efficiency for Ophthalmic Applications", PNAS Apr. 18, 2006 vol. 103 No. 16 6100-6104, Retrieved from: <http://www.pnas.org/content/103/16/6100.long> Feb. 22, 2012, Feb. 2, 2006, 4 pages.
Lindau,"Controlling the Groove Depth of Holographic Gratings", In Proceedings of Optical System Design, Analysis, and Production, vol. 0399, Oct. 26, 1983, 2 pages.
Mack,"Moto X: The First Two Weeks", Retrieved From: <http://www.gizmag.com/two-weeks-motorola-google-moto-x-review/28722/> Jul. 8, 2014, Aug. 16, 2013, 8 pages.
Man,"IT Equipment Noise Emission Standards: Overview of New Development in the Next Edition of ISO/ECMA Standards", In Proceedings of 37th International Congress and Exposition on Noise Control Engineering, Available at <http://www.ecma-international.org/activities/Acoustics/Inter-noise%202008%20paper%20on%20ECMA-74%20updates.pdf >, Oct. 26, 2008, 8 pages.

(56) References Cited

OTHER PUBLICATIONS

March,"A Read-Only Distributed Has Table", IN Journal of Grip Computing, vol. 9, Issue 4, Apr. 27, 2011, pp. 501-529.
Massenot,"Multiplexed holographic transmission gratings recorded in holographic polymer-dispersed liquid crystals: static and dynamic studies", Retrieved at: http://oatao.univ-toulouse.fr/2874/, 2005, 8 pages.
McMillan,"Your Future iPhone May Be Stuffed With Wax", Aug. 23, 2013, 3 pages.
Mei,"An all fiber interferometric gradient hydrophone with optical path length compensation", In Proceedings of Summaries of Papers Presented at the Conference on Lasers and Electro-Optics, May 28, 1999, 2 pages.
Melcher,"LCoS for High Performance Displays", In Proceedings of LEOS 2003, Available at <http://ieeexplore.ieee.org/stamp/stamp.jsp?tp=&arnumber=1253048>, Oct. 27, 2003, pp. 812-813.
Minier,"Diffraction Characteristics of Superimposed Holographic gratings in Planar Optical waveguides", IEEE Photonics Technology Letters, vol. 4, No. 10, Oct. 1992, 4 pages.
Moore,"Computational sprinting pushes smartphones till they're tired", Michigan News Release, Feb. 28, 2012, 2 pages.
Morga,"History of SAW Devices", In Proceedings of the IEEE International Frequency Control Symposium, May 27, 1998, 22 pages.
Nguyen,"Advanced Cooling System Using Miniature Heat Pipes in Mobile PC", IEEE Transactions on Components and Packaging Technology, vol. 23, No. 1, Available at <http://ieeexplore.ieee.org/stamp/stamp.jsp?tp=&arnumber=833046&userType=inst>, Mar. 2000, pp. 86-90.
O'Reilly,"How to Use the Microsoft Surface Touch Screen and Keyboard", Retrieved From: <http://www.cnet.com/how-to/how-to-use-the-microsoft-surface-touch-screen-and-keyboard/> Jul. 5, 2014, Nov. 6, 2012, 5 Pages.
Owano,"Study explores computing bursts for smartphones", PhysOrg.com, Feb. 21, 2012, Feb. 21, 2012, 2 pages.
Papaefthymiou,"Computational Sprinting on a Hardware/Software Testbed", In the Proceedings of the 18th Eighteenth International Conference on Architectural Support for Programming Languages and Operating Systems (ASPLOS), Mar. 2013., Mar. 2013, 12 pages.
Patrizio,"Researchers Working on Ways to Put 16-Core Processors in Smartphones", Brighthand, Mar. 18, 2012, Mar. 18, 2012, 2 pages.
Paul,"Three Windows Multitasking Features That Help Maximize Your Screen Space", Retrieved From: <http://www.pcworld.com/article/2094124/three-windows-multitasking-features-that-help-maximize-your-screen-space.html> Jul. 4, 2014, Feb. 4, 2014, 4 Pages.
Prohaska,"Fast Updates with TokuDB", Available at: http://www.tokutek.com/2013/02/fast-updates-with-tokudb/, Feb. 12, 2013, 2 pages.
Pu,"Exposure schedule for multiplexing holograms in photopolymer films", Retrieved at: lo.epfl.ch/webdav/site/lo/shared/1996/OE_35_2824_Oct1996.pdf, Oct. 1996, 6 pages.
Raghavan,"Computational Sprinting", In the Proceedings of the 18th Symposium on High Performance Computer Architecture (HPCA), Feb. 2012, Feb. 2012, 12 pages.
Raghavan,"Designing for Responsiveness With Computational Sprinting", IEEE Micro's "Top Picks of 2012" Issue, May 2013, 8 pages.
Scott,"RearType: Text Entry Using Keys on the Back of a Device", In Proceedings of 12th Conference on Human-Computer Interaction with Mobile Devices and Services, Retrieved from <https://research.microsoft.com/pubs/135609/reartype%20mobilehci.pdf>, Sep. 7, 2010, 9 pages.
Singh"Laser-Based Head-Tracked 3D Display Research", Journal of Display Technology, vol. 6, No. 10, Available at <http://ieeexplore.ieee.org/stamp/stamp.jsp?tp=&arnumber=5462999>, Oct. 2010, pp. 531-543.
Smalley,"Anisotropic Leaky-Mode Modulator for Holographic Video Displays", In Proceedings of Nature, vol. 498, Jun. 20, 2013, 6 pages.
Stupar,"Optimization of Phase Change Material Heat Sinks for Low Duty Cycle High Peak Load Power Supplies", IEEE transactions on components, packaging and manufacturing technology, retrieved from <http://ieeexplore.ieee.org/stamp/stamp.jsp?tp=&arnumber=6081913> on Jan. 5, 2012, Nov. 15, 2011, 14 pages.
Tari,"CFD Analyses of a Notebook Computer Thermal Management System and a Proposed Passive Cooling Alternative", IEEE Transactions on Components and Packaging Technologies, vol. 33, No. 2, retrieved from <http://ieeexplore.ieee.org/stamp/stamp.jsp?tp=&arnumber=5466211> on Dec. 30, 2011, Jun. 2010, pp. 443-452.
Teng,"Fabrication of nanoscale zero-mode waveguides using microlithography for single molecule sensing", In Proceedings of Nanotechnology, vol. 23, No. 45, Jul. 7, 2012, 7 pages.
Theocaris,"Radial Gratings as Moire Gauges", Journal of Physics E. Scientific Instruments, Jun. 1, 1968, 6 pages.
Thurrott,"Nokia Lumia "Black": Glance 2.0", Retrieved From:<http://winsupersite.com/windows-phone/nokia-lumia-black-glance-20> Jul. 8, 2014, Jan. 11, 2014, 3 Pages.
Tien,"Microcontact Printing of SAMs", In Proceedings of Thin Films, vol. 24, May 28, 2014, 24 pages.
Travis,"Collimated Light from a Waveguide for a Display Backlight", Optics Express—Retrieved from <http://download.microsoft.com/download/D/2/E/D2E425F8-CF3C-4C71-A4A2-70F9D4081007/OpticsExpressbacklightpaper.pdf>, Oct. 15, 2009, pp. 19714-19719.
Travis,"The Design of Backlights for View-Sequential 3D", Microsoft Corporation, Available at <http://download.microsoft.com/download/D/2/E/D2E425F8-CF3C-4C71-A4A2-70F9D4081007/Backlightforviewsequentialautostereo.docx>, Jul. 3, 2010, 4 pages.
Van"A Survey of Augmented Reality Technologies, Applications and Limitations", The International Journal of Virtual Reality, 2010, 9(2), Available at <http://www.ijvr.org/issues/issue2-2010/paper1%20.pdf>, Jun. 2010, pp. 1-19.
Vranjes,"Application Window Divider Control for Window Layout Management", U.S. Appl. No. 13/863,369, filed Apr. 15, 2013, 21 pages.
Walker,"Thermalright Ultra-120 Extreme CPU Cooler", retrieved from <http://www.pro-clockers.com/cooling/66-thermalright-ultra-120-extreme-cpu-cooler.html> on Dec. 30, 2011, Jul. 2, 2009, 7 pages.
Westerinen,"Light Guide Display and Field of View", U.S. Appl. No. 13/428,879, filed Mar. 23, 2012, 46 pages.
Wiebe,"Using screen space efficiently with Gridmove", Available at: http://lowerthought.wordpress.com/2010/05/15/using-screen-space-efficiently-with-gridmove/, May 15, 2010, 2 pages.
Wigdor,"LucidTouch: A See-Through Mobile Device", In Proceedings of 20th Annual ACM symposium on User Interface Software and Technology, Retrieved from <http://dl.acm.org/citation.cfm?id=1294259>, Oct. 7, 2007, 10 pages.
Xie,"Fabrication of Varied-Line-Spacing Grating by Elastic Medium", In Proceedings SPIE 5636, Holography, Diffractive Optics, and Applications II, Nov. 2004, 4 pages.
Yan,"Multiplexing holograms in the photopolymer with equal diffraction efficiency", 2005, 9 pages.
Zharkova,"Study of the Dynamics of Transmission Gratings Growth on Holographic Polymer-Dispersed Liquid Crystals", International Conference on Methods of Aerophysical. Research, ICMAR 2008, 2008, 4 pages.
"Office Action Issued in European Patent Application No. 16706070.6", dated May 3, 2021, 7 Pages.
"Office Action Issued in European Patent Application No. 16706071.4", dated Apr. 9, 2021, 5 Pages.

\* cited by examiner (Plan view)

(Plan view)

(Frontal view)

(Plan view)

(Frontal view)

(Plan view)

(Frontal view)

(Frontal view)

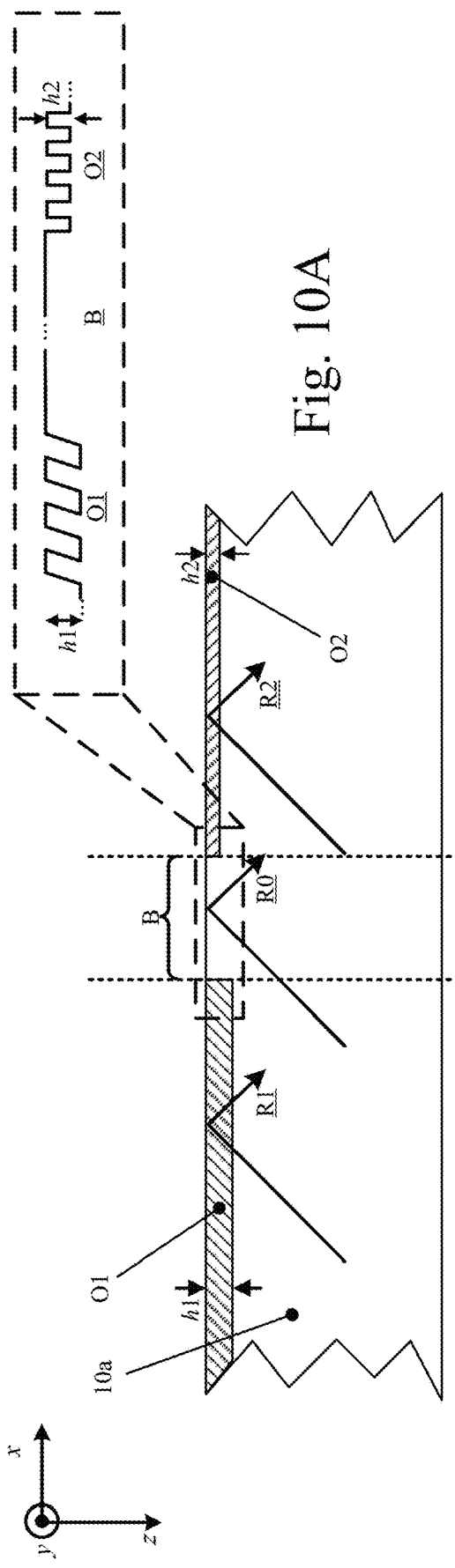
Fig. 10A
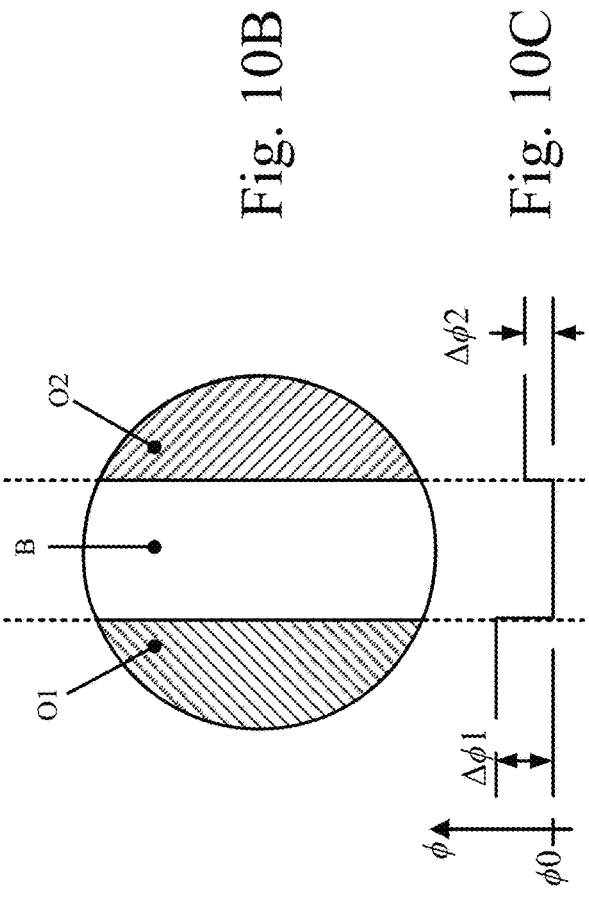
Fig. 10B
Fig. 10C

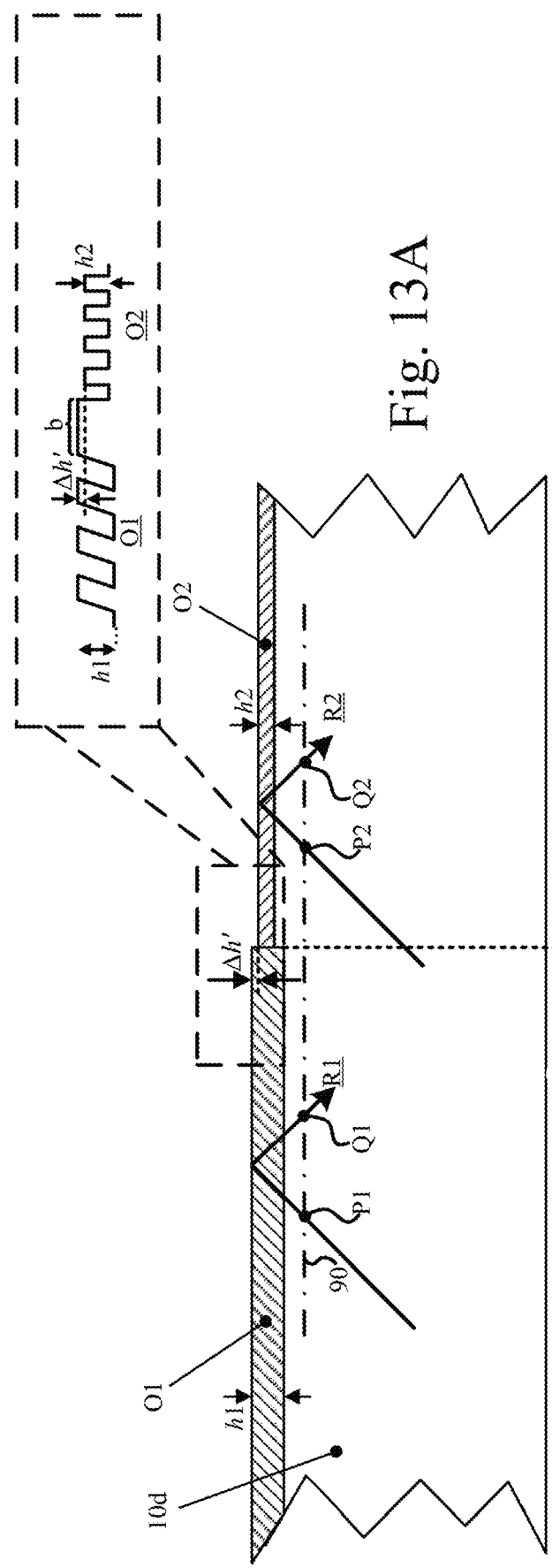
Fig. 13A
Fig. 13B
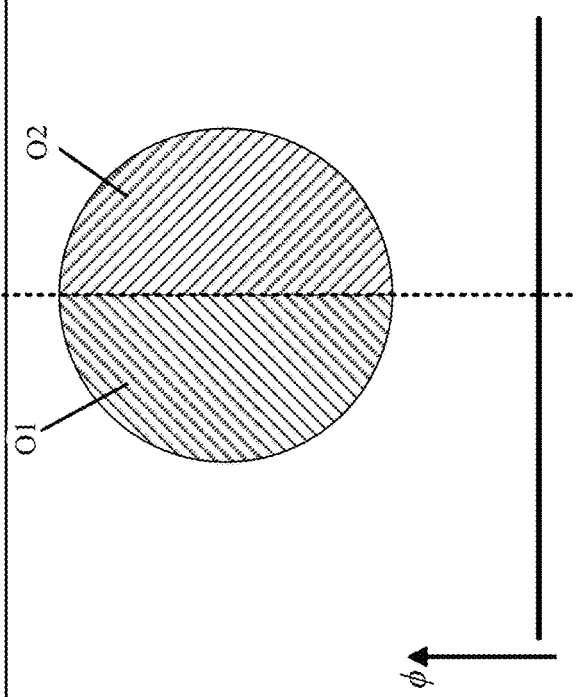
Fig. 13C

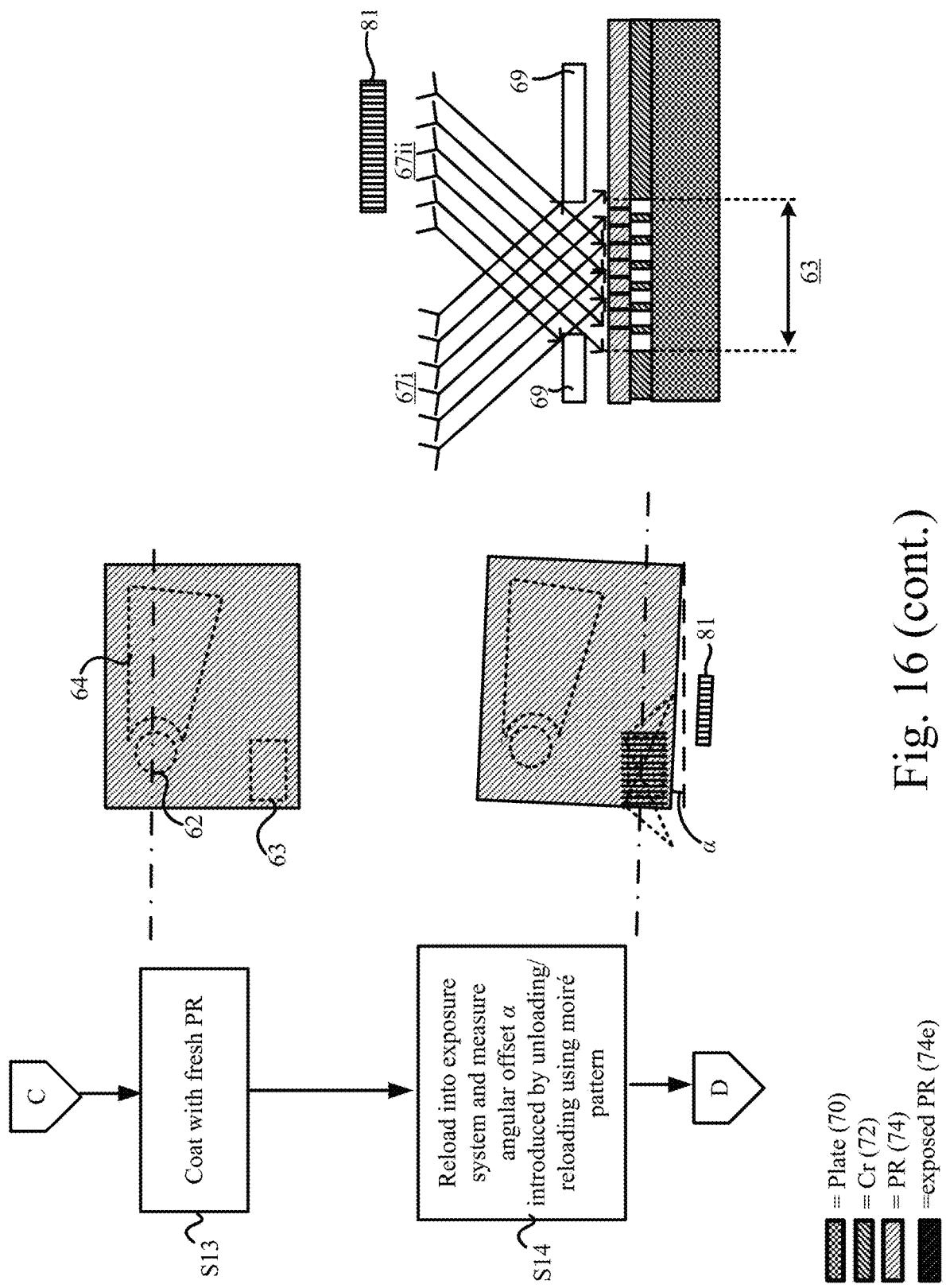

2200

Identify a distance for each respective structure of an electronic or optical component to a planar surface defined by the electronic or optical component
2202

Modify a production master or a working stamp in dependence upon a comparison of the identified distance for each respective structure to the planar surface and a desired distance from the planar surface
2204

Generate the electronic or optical component, with the modified production master or the modified working stamp, by positioning the structures in accordance with the desired distance
2206

Produce structures on the surface of a substrate in accordance with a bias level that biases the structures to a particular position, including positioning the structures a desired distance from a plane of the substrate
2302

Cause a reduction in edge diffraction of light interacting with the structures on the surface of the substrate by positioning the structures in accordance with the bias level
2304

Ascertain an offset distance for the optical elements from a surface of the substrate
2402

Adjust the offset distance for the optical elements from the surface of the substrate by modifying areas on the mould that generate the optical elements
2404

GENERATING ELECTRONIC COMPONENTS

RELATED APPLICATIONS

This application is a continuation-in-part of and claims priority to U.S. patent application Ser. No. 14/617,697, filed Feb. 9, 2015, the entire disclosure of which is hereby incorporated by reference herein.

BACKGROUND

Traditional techniques, such as imprinting and molding, to manufacture an electronic or an optics component typically introduce areas in the optical component during manufacturing, which affect the performance of the component in an undesired manner. Often, additional manufacturing steps and/or expensive re-design of the electronic component is needed to correct the defects caused by using the traditional techniques. For instance, an optical component manufactured using traditional techniques often produces unwanted distortions when light responds to the optical component. In one specific instance, a waveguide generated using traditional manufacturing techniques produces unwanted distortions including diffractive beam spreading when light passes through the waveguide. Thus, traditional techniques to manufacture electronic components can be ineffective and can lead to user frustration when viewing the manufactured electronic component and/or when required to design around defects caused during manufacturing.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter. Nor is the claimed subject matter limited to implementations that solve any or all of the disadvantages noted in the background section.

Electronic or optical component manufacturing techniques are described. In implementations, a production master and/or a working stamp are configured to bias structures of the electronic or optical component to particular positions. In implementations, a production master and/or a working stamp can be modified in dependence upon a comparison of an identified distance for each respective structure to the planar surface and a threshold or bias distance. The modified production master and/or a working stamp may then generate an electronic or optical component by positioning the structures in accordance with the bias distance.

A sub-assembly can be configured to perform electronic component generation techniques including producing structures on a surface of a substrate in accordance with a bias level that biases the structures to a particular position. For example, the bias level may be an offset or distance in height above a plane of the electronics component by a desired distance. In implementations, the sub-assembly produces the structures on the surface of the substrate in accordance with the bias level such that the desired functionality of the electronic or optical component is optimized. In implementations, the sub-assembly also causes a reduction in edge diffraction of light reacting to the structures on the surface of the substrate by positioning the structures in accordance with the bias level.

In implementations, a process to form optical elements on a surface of a substrate using a mould includes ascertaining an offset distance for the optical elements from a surface of the substrate. The process to form optical elements can also include adjusting the offset distance for the optical elements from the surface of the substrate by modifying areas on the mould that generate the optical elements.

BRIEF DESCRIPTION OF FIGURES

FIGS. 10A and 10B show plan and side views of a part of a waveguide having optical elements which are not offset from one another, and FIG. 10C shows a phase distribution for the waveguide of FIGS. 10A and 10B;

FIGS. 13A and 13B show plan and side views of a part of a second waveguide having offset optical elements, and FIG. 13C shows a phase distribution for the second waveguide of FIGS. 13A and 13B;

FIG. 22 shows a flow diagram depicting an example procedure in accordance with one or more aspects of the disclosure.

FIG. 23 shows another flow diagram depicting an example procedure in accordance with one or more aspects of the disclosure.

DETAILED DESCRIPTION

Figure 1:
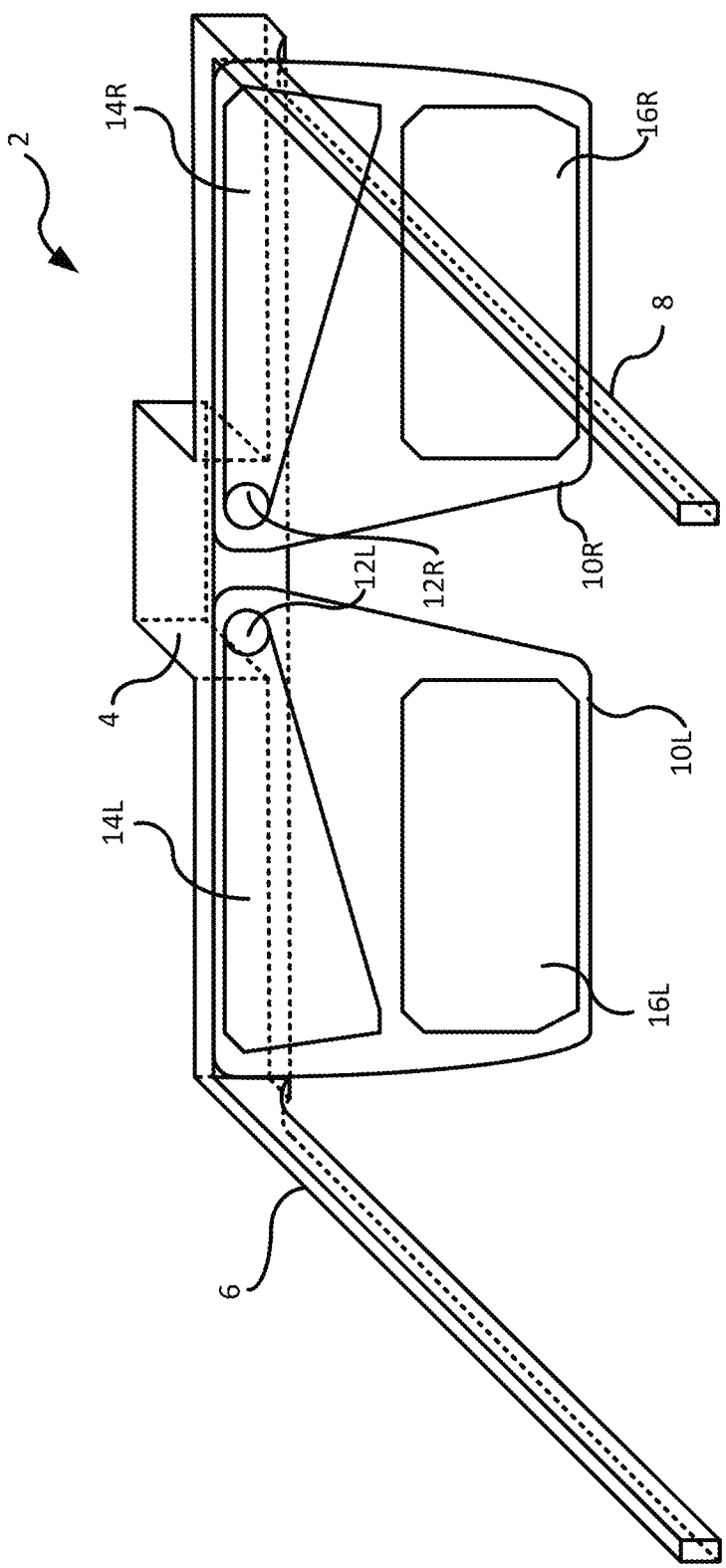
FIG. 1 shows a wearable display system.

Electronic or optical components provide a variety of functionality to users. For instance, optical components in a display system enable users to view and interact with images in various ways. However, the electronic or optical components can cause undesired effects that cause the image output to not function as expected, which can lead to user frustration. In one example, diffractive optical elements are included in an optical component of a display system.

Some ways to manufacture a master for producing diffractive optical elements can include removing varying amounts of material from a flat surface on a quartz plate. For instance, material can be removed from different areas of the flat surface such that an amount of material removed in each of the different areas corresponds to different diffractive optical elements. However, due to variations in the amount of material removed, the diffractive optical elements vary in height from the flat surface of the quartz plate. This variation in height leads to variations in an amount of imprint resin required in the replication process for the replicated component to achieve complete filling of the structures on the areas of the diffractive optical elements. However, variances in the amount of the imprint resin in different areas on the optical component cause unwanted wavefront distortion when light responds to different optical elements.

Techniques for generating electronic or optical components are described herein. The described techniques can be implemented to generate electronic or optical components that operate free of unwanted distortions such as edge diffraction and wavefront distortion. For instance, a modified production master or a modified working stamp can be implemented to generate an electronic or optical component having structures that are positioned within a desired distance from a planar surface. A production master or a working stamp can be modified in dependence upon a comparison of an identified distance for each respective structure to the planar surface and a desired distance. Then, the modified production master or the modified working stamp generates the electronic or optical component by positioning the structures in accordance with the desired distance. By positioning the structures in accordance with the desired distance, electronic components generated using the modified production master or the modified working stamp minimize distortions, such as a wave front distortion between the structures. In examples, the structures can represent a raised area, a lowered area, and/or a flat area (also referred to as a 'blank' area) that is equal to the plane and therefore is not a raised or lowered area. In one specific example, the structures are microstructures having a periodic and/or non-period format over a surface of the electronic component, such as the surface relief gratings (SRG) described herein.

A sub-assembly can be implemented to perform electronic or optical component generation techniques including producing structures on a surface of a substrate in accordance with a recess that positions the structures to a desired level. The sub-assembly can be configured in a variety of ways to produce structures that cause a reduction in an edge diffraction effect of light interacting with the structures. For instance, the sub-assembly can include a production master and a working stamp that are configured to produce the structures on the surface of the substrate in accordance with the desired level such that the structures are positioned a minimum distance from a plane of the substrate. In examples, the production master and the working stamp are further configured to cause a reduction in edge diffraction of light interacting with the structures on the surface of the substrate by positioning the structures in accordance with the desired level. In one specific example, the structures are positioned at a particular height determined by the sub-assembly resulting in accurate level control for the structures.

In implementations, the sub-assembly can generate the electronic or optical component while optimizing an offset in height between elements making up the electronic or optical component. For example, optimizing an offset in height may constitute setting an offset in height to a desired distance or height. In examples, the sub-assembly can generate a particular height for each element included in the electronic or optical component relative to a plane defined by the electronic or optical component and/or relative to another element(s). The height of each element relative to the plane can be optimized by setting the respective heights to respective desired heights. Consequently, the sub-assembly can operate to optimize an offset in heights among electrical or optical elements of an electrical or optical component. In one specific example, the sub-assembly determines an offset for heights of different diffractive optical elements of an optical waveguide. Further, the sub-assembly can be implemented to produce surface relief grating(s) including those described herein, such as in FIGS. 5A, 5B, and 5C.

A process to form optical elements on a surface of a substrate using a mould is also described. The process can be used to manufacture a waveguide, an optical element, an optical component, a display system, or a combination thereof, for instance. In implementations, the process can include ascertaining an offset distance for the optical elements from a surface of the substrate and adjusting the offset distance for the optical elements from the surface of the substrate by modifying areas on the mould that generate the optical elements. By modifying areas on the mould that generate the optical elements based on an adjusted offset distance, a uniform offset of optical elements from the surface of the substrate (e.g., a wafer) can be achieved. In examples, the process can represent a microfabrication process for making an optical component and can include etching and imprinting just to name a few.

In implementations, a production master or a working stamp is modified in dependence upon ascertained properties of a material that is configured to go over a surface of the structures of the electronic component. For instance, the material can represent resin with shrinkage properties that are taken into account when performing the modification. In examples, the material can shrink responsive to light, heat, and/or pressure, and an amount that the material shrinks is an ascertained property from which the modifying of the production master or the working stamp depends.

By controlling a height for each of the optical elements of an optical component during production of the sub-assembly, fewer process steps are required to generate the master for producing the sub-assembly of the optical component. Further, implementing the described techniques can simplify manufacturing steps, such as requiring fewer steps to remove material resulting in an overall cost savings to generate the masters for these components.

Generally, the sub-assembly can be used to generate an optical component with optical elements that have desired height relative to each other and/or relative to a plane formed by the optical component. In this way, the optical component is generated to include optical elements having a particular height determined by the sub-assembly.

Typically, a waveguide based display system comprises an image source, e.g. a projector, waveguide(s) and various optical elements (e.g. diffraction gratings) imprinted on the waveguide surfaces.

FIGS. 10A and 10B show side and plan views of part of an optical waveguide 10a having diffractive optical elements O1, O2 (which are diffraction gratings) imprinted on the top of the waveguide's surface. The first grating O1 has a depth h1 and the second grating O2 has a depth h2. An expanded side view of the optical elements O1, O2 is shown at the top of FIG. 10A. Each optical element is formed of a series of grooves in the surface of the waveguide 10a of depth h1, h2≠h1 respectively as measured normal to the waveguide. The depths h1, h2 are constant across the whole of the gratings O1, O2 in this example.

The first and second elements O1, O2 are used, for example, to couple light emitted by the image source into and out of the waveguide, and/or for manipulation of its spatial distribution within the waveguide. While being necessary for the operation of the display system, the optical elements O1, O2 can also cause unwanted distortions on the wave front of the light field as it travels through the waveguide. In particular, phase distortions may be created when the wavefront meets the edges of the optical elements O1, O2. Elements may also change the amplitude of the field differently, i.e. there will be amplitude variation as well. However, in terms of image quality the phase distortion is much more severe and matching of amplitude of the field portions is not required to achieve acceptable image quality.

The optical elements O1 and O2 are separated by a blank surface region B, which is substantially non-diffractive (i.e. which interacts with light substantially in accordance with Snell's law and the law of reflection). Portions of the wavefront that are totally internally reflected from the blank surface region B of the light guide experience a different phase retardation than portions that are reflected from the optical elements O1, O2. A ray R0 change phase upon total internal reflection from the (or any other) blank surface region B by an amount $\phi0$ which depends on the polarization of the incident light. A ray R1 change phase upon reflection from the first optical element O1 by an amount $\phi1=\phi0-\Delta\phi1$. A ray R2 change phase upon reflection from the second optical component O2 by an amount $\phi2=\phi0-\phi2$. This is illustrated in the phase distribution of FIG. 10C, which shows the phase of the rays R1, R0, R2 after reflection from the first optical element O1, the blank surface B, and the second optical element O2 respectively.

Generally, gratings and TIR change the phase of polarization components differently, i.e. there is polarization rotation as well. As will be apparent, the description of the preceding paragraph is a simplification to aid illustration of the distortion mechanism.

Note the term "reflected" as it is used herein includes reflectively diffracted light e.g. as created by a reflective or partially reflective diffraction grating. Both zero and higher order modes can experience phase retardation. In general, polarization of reflected higher order modes as well as 0th order mode can be rotated or turned into/out of elliptical polarization etc.

Figure 11A:
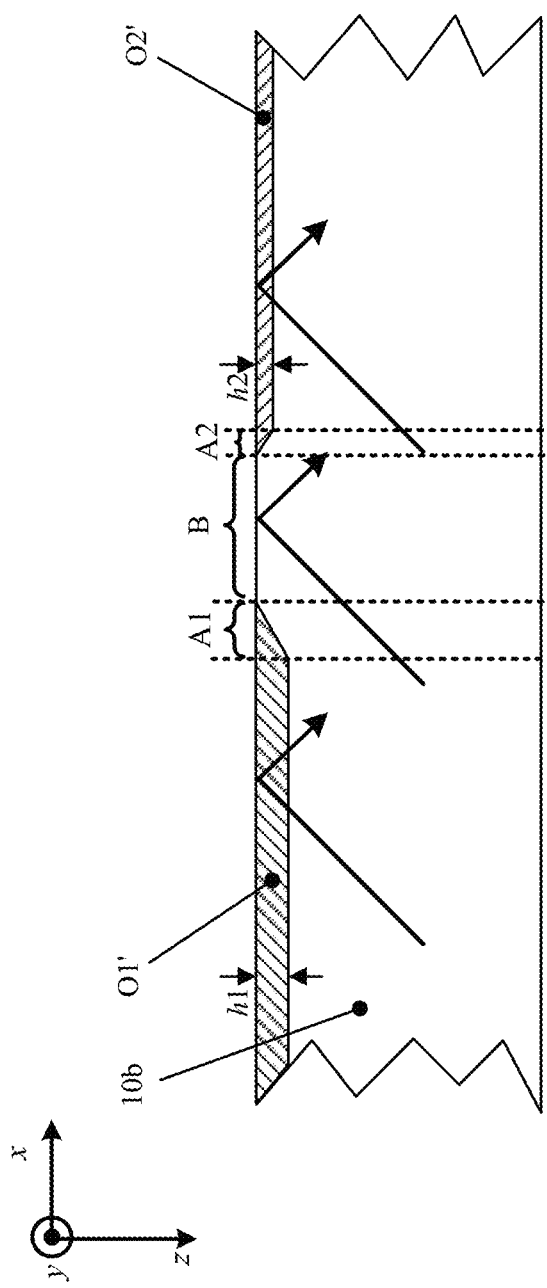
FIG. 11A shows a side view of a part of a waveguide having optical elements which are not offset from one another and which exhibit apodization.
Figure 11B:
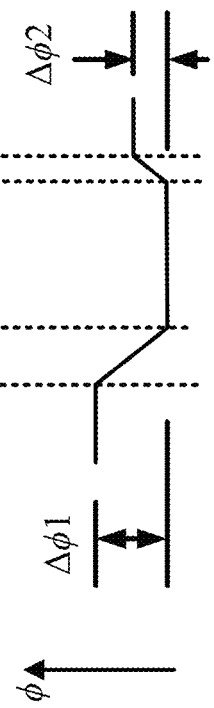
FIG. 11B shows a phase distribution for the waveguide of FIG. 11A.

Such phase jumps result in diffractive beam spreading and thus loss of image sharpness. One method to reduce the effect of edge diffraction would be to use apodization. Generally this means using some form of smoothing to turn sharp edges into more continuously varying shapes. The smoothing can be done through various means. In the case of gratings the depth of the grating structure, or more generally any other profile parameter, could be varied smoothly between two regions. An exemplary waveguide 10b exhibiting apodization is shown in FIG. 11A. The waveguide 10b has first and second optical elements O1', O2' which are equivalent to the optical component O1, O2 of the waveguide 10a but for the fact that the depth of O1', O2' gradually decreases to zero throughout first and second apodization regions A1, A2 respectively, which are adjacent a blank region B that separates the optical elements O1' and O2'. This results in gradually varying phase in the apodized area, as shown in the phase distribution of FIG. 11B. As can be seen in FIG. 11B, the amount by which the phase of rays changes due to reflection in the apodization regions A1, A2 varies as a function of location across the apodization regions A1, A2, with rays reflected closer to the blank region B exhibiting phase changes which are close to that exhibited by rays reflected in the blank region B itself. Whilst this can in some cases lead to reduced strength edge diffraction and diffractive beam spreading, apodization can have other undesired effects e.g. it can reduce the efficiency of the grating near its edges.

The present disclosure provides a means to reduce phase distortions caused by diffractive optical elements imprinted on the surface of the light guide. In particular, the effect of the grating edge on the wavefront is removed by adding a suitable height offset to a grating and/or to the blank surface (or other grating) next to it. The offset is selected so that the total phase retardance for rays that are reflected from the offset grating is equal to the phase retardance of rays that are totally internally reflected from the blank surface of the waveguide (or that are reflected from the other grating).

As compared with the method of using apodization, the method of the present disclosure allows for improved reduction of phase distortions as compared with apodization. This is achieved while maintaining other desired properties of the gratings, e.g. gratings can be optimized for efficiency over the entire surface area of the gratings, including at the edges of the grating, by for instance maintaining a desired depth profile right up to the edges of the grating.

This is described in detail below. First, a context in which the waveguides of the present disclosure can be used will be described.

FIG. 1 is a perspective view of a head mounted display. The head mounted display comprises a headpiece, which comprises a frame 2 having a central portion 4 intended to fit over the nose bridge of a wearer, and a left and right supporting extension 6,8 which are intended to fit over a user's ears. Although the supporting extensions are shown to be substantially straight, they could terminate with curved parts to more comfortably fit over the ears in the manner of conventional spectacles.

Figure 2A:
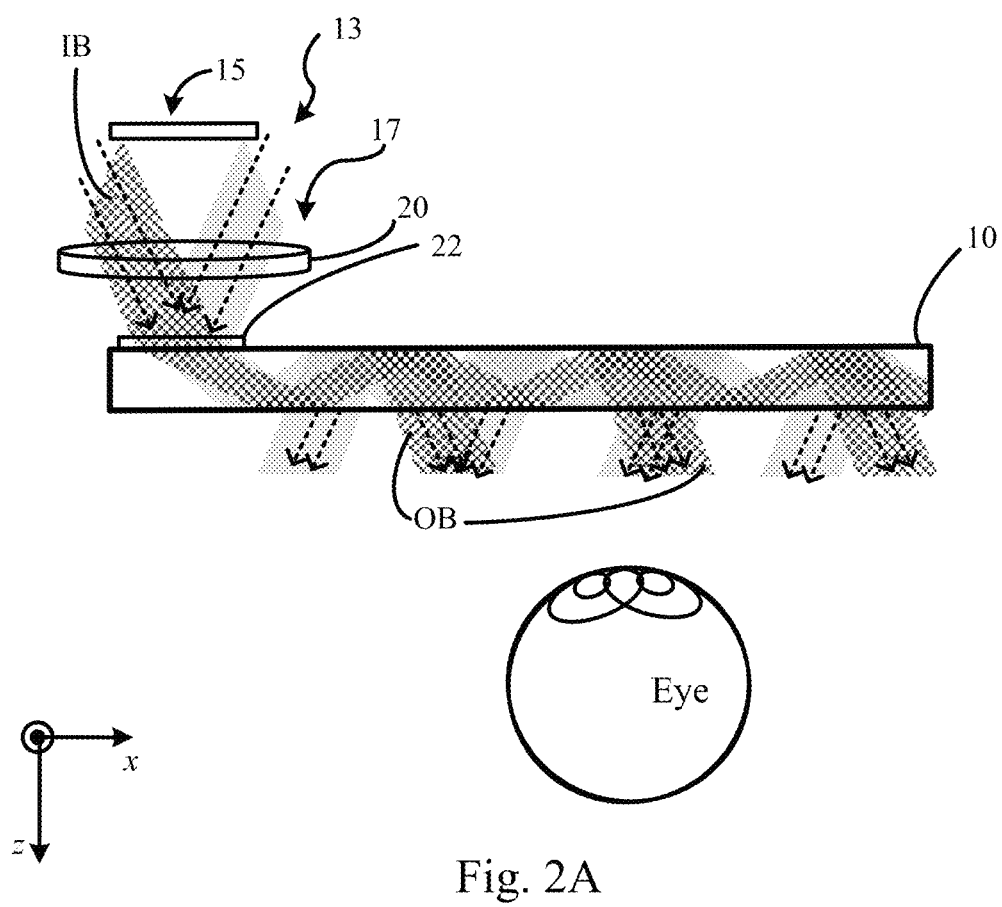
FIG. 2A shows a plan view of part of the display system.

The frame 2 supports left and right optical components, labelled 10L and 10R, which are waveguides. For ease of reference herein an optical component 10 (which is a waveguide) will be considered to be either a left or right component, because the components are essentially identical apart from being mirror images of each other. Therefore, all description pertaining to the left-hand component also pertains to the right-hand component. The optical components will be described in more detail later with reference to FIG. 3. The central portion 4 houses a light engine which is not shown in FIG. 1 but which is shown in FIG. 2.

FIG. 2 shows a plan view of a section of the top part of the frame of FIG. 1. Thus, FIG. 2 shows the light engine 13 which comprises a micro display 15 and imaging optics 17 in the form of a collimating lens 20. The light engine also includes a processor which is capable of generating an image for the micro display. The micro display can be any type of light of image source, such as liquid crystal on silicon (LCOS) displays (LCD's), transmissive liquid crystal displays (LCD), matrix arrays of LED's (whether organic or inorganic) and any other suitable display. The display is driven by circuitry which is not visible in FIG. 2 which activates individual pixels of the display to generate an image. The substantially collimated light, from each pixel, falls on an exit pupil 22 of the light engine 13. At exit pupil 22, collimated light beams are coupled into each optical component, 10L, 10R into a respective in-coupling zone 12L, 12R provided on each component. These in-coupling zones are clearly shown in FIG. 1, but are not readily visible in FIG. 2. In-coupled light is then guided, through a mechanism that involves diffraction and TIR, laterally of the optical component in a respective intermediate (fold) zone 14L, 14R, and also downward into a respective exit zone 16L, 16R where it exits the component 10 towards the users' eye. The zones 14L, 14R, 16L and 16R are shown in FIG. 1. These mechanisms are described in detail below. FIG. 2 shows a user's eye (right or left) receiving the diffracted light from an exit zone (16L or 16R). The output beam OB to a user's eye is parallel with the incident beam IB. See, for example, the beam marked IB in FIG. 2 and two of the parallel output beams marked OB in FIG. 2. The optical component 10 is located between the light engine 13 and the eye i.e. the display system configuration is of so-called transmissive type.

Other headpieces are also within the scope of the subject matter. For instance, the display optics can equally be attached to the users head using a head band, helmet or other fit system. The purpose of the fit system is to support the display and provide stability to the display and other head borne systems such as tracking systems and cameras. The fit system will also be designed to meet user population in anthropometric range and head morphology and provide comfortable support of the display system.

Beams from the same display 15 may be coupled into both components 10L, 10R so that an image is perceived by both eyes from a single display, or separate displays may be used to generate different images for each eye e.g. to provide a stereoscopic image. In alternative headsets, light engine(s) may be mounted at one or both of left and right portions of the frame—with the arrangement of the incoupling, fold and exit zones 12, 14, 16 flipped accordingly.

The optical component 10 is substantially transparent such that a user can not only view the image from the light engine 13, but also can view a real world view through the optical components.

The optical component 10 has a refractive index n which is such that total internal reflection takes place guiding the beam from the incoupling zone along the intermediate expansion zone 14, and down towards the exit zone 16.

Figure 3A:
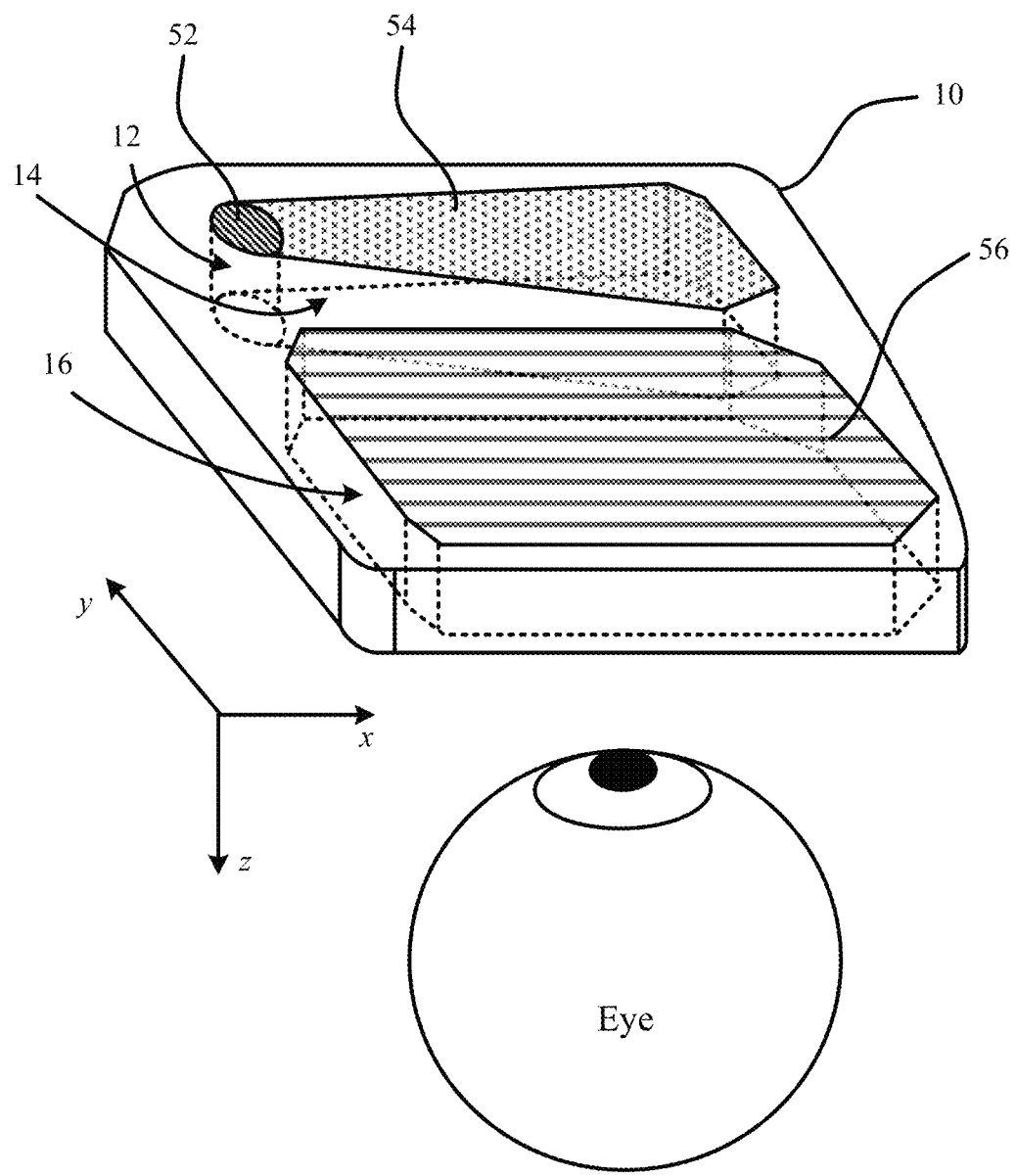
FIGS. 3A and 3B shows perspective and frontal view of an optical component.
Figure 3B:
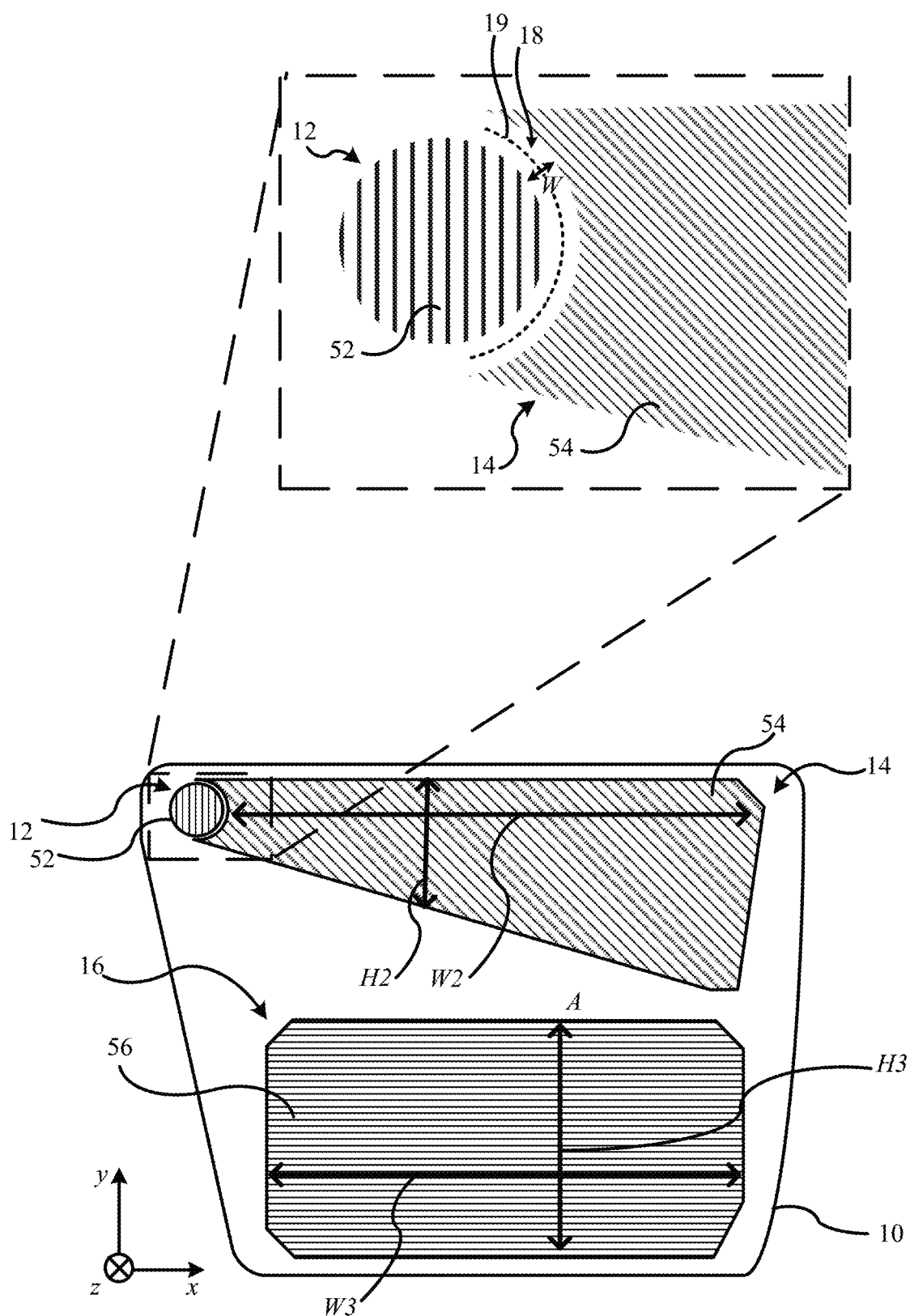

FIGS. 3A and 3B show an optical component in more detail.

FIG. 3A shows a perspective view of an optical component 10. The optical component is flat in that the front and rear portions of its surface are substantially flat (front and rear defined from the viewpoint of the wearer, as indicated by the location of the eye in FIG. 3A). The front and rear portions of the surface are parallel to one another. The optical component 10 lies substantially in a plane (xy-plane), with the z axis (referred to as the "normal") directed towards the viewer from the optical component 10. The incoupling, fold and exit zones 12, 14 and 16 are shown, each defined by respective surface modulations 52, 46 and 56 on the surface of the optical component, which are on the rear of the waveguide from a viewpoint of the wearer. Each of the surface modulations 52, 46, 56 forms a respective surface relief grating (SRG), the nature of which will be described shortly. Instead of the SRGs, holograms could be used providing the same optical function as the SRGs.

As shown in the plan view of FIG. 3B, the fold zone has a horizontal extent W2 (referred to herein as the "length" of the expansion zone) in the lateral (x) direction and an extent H2 in they direction (referred to herein as the "length" of the expansion zone) which increases from the inner edge of the optical component to its outer edge in the lateral direction along its width W2. The exit zone has a horizontal extent W3 (length of the exit zone) and y-direction extent H3 (width of the exit zone) which define the size of the eye box, which size is independent of the imaging optics in the light engine. The incoupling and fold SRGs 52, 54 have a relative orientation angle A, as do the fold and exit SRGs 54, 56 (note the various dotted lines superimposed on the SRGs 52, 54, 56 denote directions perpendicular to the grating lines of those SRGs).

The incoupling and fold zones 12, 14 are substantially contiguous in that they are separated by at most a narrow border zone 18 which has a width W as measured along (that is, perpendicular to) a common border 19 that divides the border zone 18. The common border 19 is arcuate (substantially semi-circular in this example), the incoupling and fold regions 12, 14 having edges which are arcuate (substantially semi-circular) along the common border 19. The edge of incoupling region 12 is substantially circular overall.

Principles of the diffraction mechanisms which underlie operation of the head mounted display described herein will now be described with reference to FIGS. 4A and 4B.

The optical components described herein interact with light by way of reflection, refractions and diffraction. Diffraction occurs when a propagating wave interacts with a structure, such as an obstacle or slit. Diffraction can be described as the interference of waves and is most pronounced when that structure is comparable in size to the wavelength of the wave. Optical diffraction of visible light is due to the wave nature of light and can be described as the interference of light waves. Visible light has wavelengths between approximately 390 and 700 nanometres (nm) and diffraction of visible light is most pronounced when propagating light encounters structures of a similar scale e.g. of order 100 or 1000 nm in scale.

One example of a diffractive structure is a periodic (substantially repeating) diffractive structure. Herein, a "diffraction grating" means any (part of) an optical component which has a periodic diffractive structure. Periodic structures can cause diffraction of light, which is typically most pronounced when the periodic structure has a spatial period of similar size to the wavelength of the light. Types of periodic structures include, for instance, surface modulations on the surface of an optical component, refractive index modulations, holograms etc. When propagating light encounters the periodic structure, diffraction causes the light to be split into multiple beams in different directions. These directions depend on the wavelength of the light thus diffractions gratings cause dispersion of polychromatic (e.g. white) light, whereby the polychromatic light is split into different coloured beams travelling in different directions.

When the periodic structure is on the surface of an optical component, it is referred to a surface grating. When the periodic structure is due to modulation of the surface itself, it is referred to as a surface relief grating (SRG). An example of a SRG is uniform straight grooves in a surface of an optical component that are separated by uniform straight groove spacing regions. Groove spacing regions are referred to herein as "lines", "grating lines" and "filling regions". The nature of the diffraction by a SRG depends both on the wavelength of light incident on the grating and various optical characteristics of the SRG, such as line spacing, groove depth and groove slant angle. An SRG can be fabricated by way of a suitable microfabrication process, which may involve etching of and/or deposition on a substrate to fabricate a desired periodic microstructure on the substrate to form an optical component, which may then be used as a production master such as a mould for manufacturing further optical components.

An SRG is an example of a Diffractive Optical Element (DOE). When a DOE is present on a surface (e.g. when the DOE is an SRG), the portion of that surface spanned by that DOE is referred to as a DOE area.

Figure 4A:
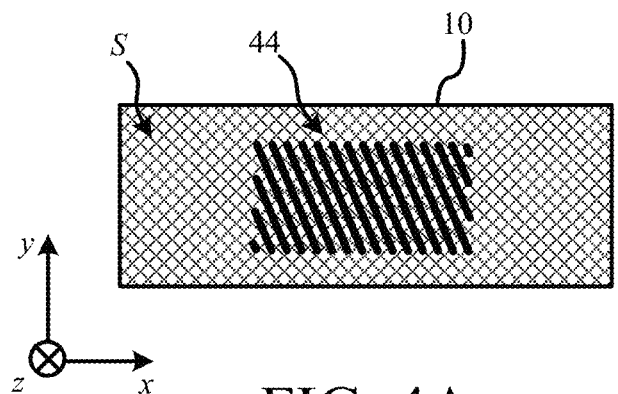
FIG. 4A shows a schematic plan view of an optical component having a surface relief grating formed on its surface.
Figure 4B:
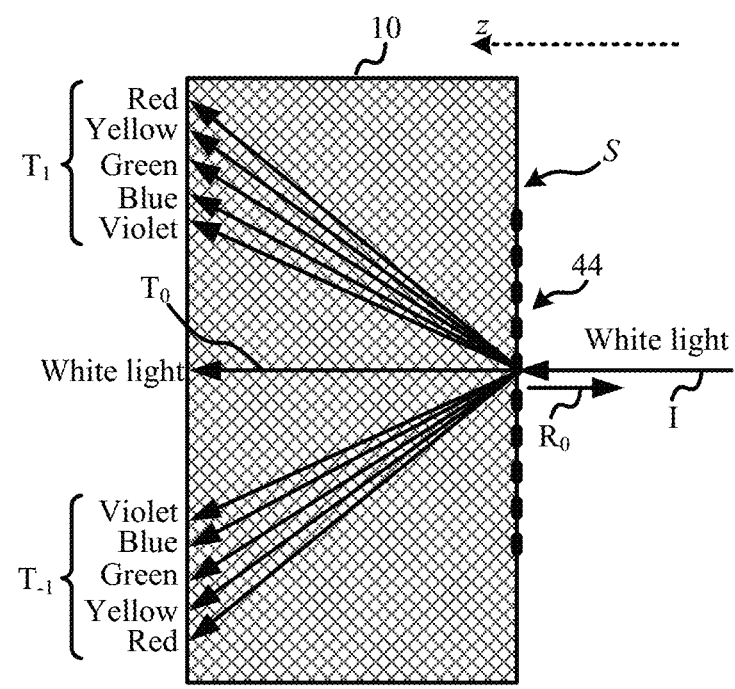
FIG. 4B shows a schematic illustration of the optical component of FIG. 4A, shown interacting with incident light and viewed from the side.

FIGS. 4A and 4B show from the top and the side respectively part of a substantially transparent optical component 10 having an outer surface S. At least a portion of the surface S exhibits surface modulations that constitute a SRG 44 (e.g. 52, 54, 56), which is a microstructure. Such a portion is referred to as a "grating area". The modulations comprise grating lines which are substantially parallel and elongate (substantially longer than they are wide), and also substantially straight in this example (though they need not be straight in general).

FIG. 4B shows the optical component 10, and in particular the SRG 44, interacting with an incoming illuminating light beam I that is inwardly incident on the SRG 44. The light I is white light in this example, and thus has multiple colour components. The light I interacts with the SRG 44 which splits the light into several beams directed inwardly into the optical component 10. Some of the light I may also be reflected back from the surface S as a reflected beam R0. A zero-order mode inward beam T0 and any reflection R0 are created in accordance with the normal principles of diffraction as well as other non-zero-order (±n-order) modes (which can be explained as wave interference). FIG. 4B shows first-order inward beams T1, T-1; it will be appreciated that higher-order beams may or may not also be created depending on the configuration of the optical component 10. Because the nature of the diffraction is dependent on wavelength, for higher-order modes, different colour components (i.e. wavelength components) of the incident light I are, when present, split into beams of different colours at different angles of propagation relative to one another as illustrated in FIG. 4B.

Figure 5A:
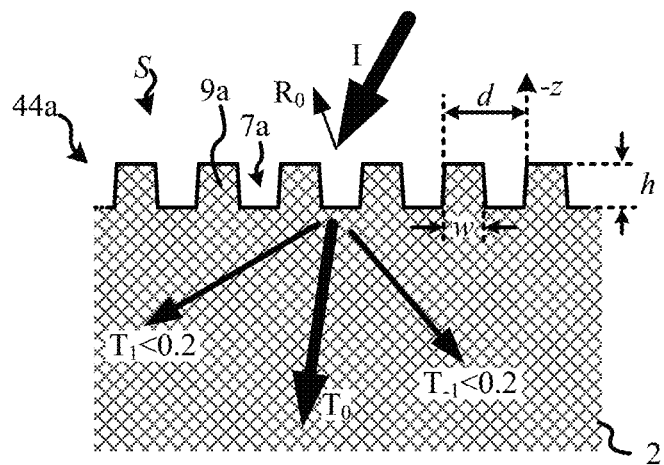
FIG. 5A shows a schematic illustration of a straight binary surface relief grating, shown interacting with incident light and viewed from the side.
Figure 5B:
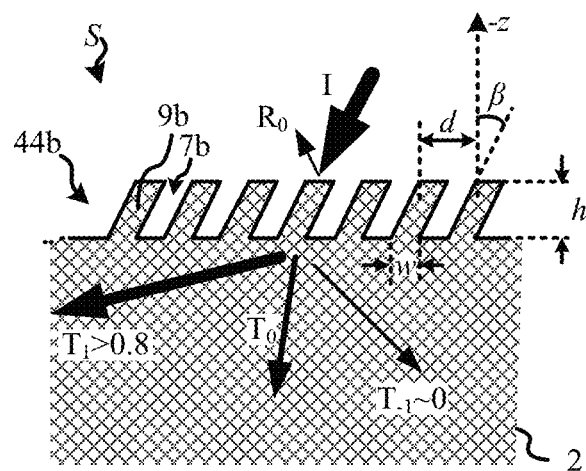
FIG. 5B shows a schematic illustration of a slanted binary surface relief grating, shown interacting with incident light and viewed from the side.
Figure 5C:
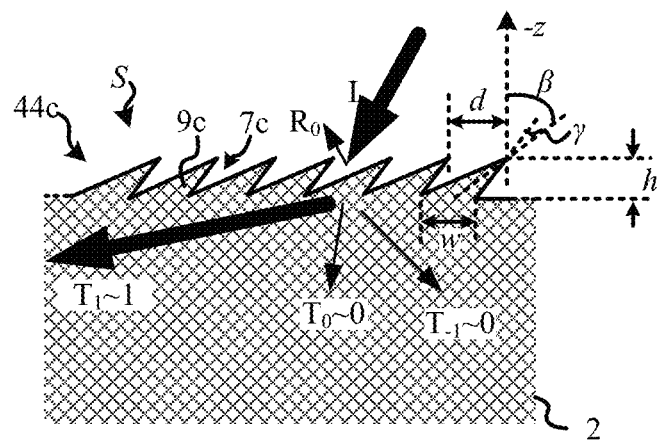
FIG. 5C shows a schematic illustration of an overhanging triangular surface relief grating, shown interacting with incident light and viewed from the side.

FIGS. 5A-5C are close-up schematic cross sectional views of different exemplary SRGs 44a-44c (collectively referenced as 44 herein) that may be formed by modulation of the surface S of the optical component 10 (which is viewed from the side in these figures). Light beams are denoted as arrows whose thicknesses denote approximate relative intensity (with higher intensity beams shown as thicker arrows).

FIG. 5A shows an example of a straight binary SRG 44a. The straight binary SRG 44a is formed of a series of grooves 7a in the surface S separated by protruding groove spacing regions 9a which are also referred to herein as "filling regions", "grating lines" or simply "lines". The SRG 44a has a spatial period of d (referred to as the "grating period"), which is the distance over which the modulations' shape repeats and which is thus the distance between adjacent lines/grooves. The grooves 7a have a depth h and have substantially straight walls and substantially flat bases. The filling regions have a height h and a width that is substantially uniform over the height h of the filling regions, labelled "w" in FIG. 2A (with w being some fraction f of the period: w=f*d).

For a straight binary SRG, the walls are substantially perpendicular to the surface S. The SRG 44a causes symmetric diffraction of incident light I that is entering perpendicularly to the surface, in that each +n-order mode beam (e.g. T1) created by the SRG 4a has substantially the same intensity as the corresponding −n-order mode beam (e.g. T-1), typically less than about one fifth (0.2) of the intensity of the incident beam I.

FIG. 5B shows an example of a slanted binary SRG 44b. The slanted binary SRG 44b is also formed of grooves, labelled 7b, in the surface S having substantially straight walls and substantially flat bases separated by lines 9b of width w. However, in contrast to the straight SRG 44a, the walls are slanted by an amount relative to the normal, denoted by the angle β in FIG. 5B. The grooves 7b have a depth h as measured along the normal. Due to the asymmetry introduced by the non-zero slant, ±n-order mode inward beams travelling away from the slant direction have greater intensity that their ∓n-order mode counterparts (e.g. in the example of FIG. 2B, the T1 beam is directed away from the direction of slant and has usually greater intensity than the T-1 beam, though this depends on e.g. the grating period d); by increasing the slant by a sufficient amount, those counterparts can be substantially eliminated (i.e. to have substantially zero intensity). The intensity of the T0 beam is typically also very much reduced by a slanted binary SRG such that, in the example of FIG. 5B, the first-order beam T1 typically has an intensity of at most about four fifths (0.8) the intensity of the incident beam I but this is highly dependent on wavelength and incident angle.

The binary SRGs 44a and 44b can be viewed as spatial waveforms embedded in the surface S that have a substantially square wave shape (with period d). In the case of the SRG 44b, the shape is a skewed square wave shape skewed by β.

FIG. 5C shows an example of an overhanging triangular SRG 44c which is a special case of an overhanging trapezoidal SRG. The triangular SRG 44c is formed of grooves 7c in the surface S that are triangular in shape (and which thus have discernible tips) and which have a depth h as measured along the normal. Filling regions 9c take the form of triangular, tooth-like protrusions (teeth), having medians that make an angle β with the normal (β being the slant angle of the SRG 44c). The teeth have tips that are separated by d (which is the grating period of the SRG 44c), a width that is w at the base of the teeth and which narrows to substantially zero at the tips of the teeth. For the SRG of FIG. 44c, w≈d, but generally can be w<d. The SRG is overhanging in that the tips of the teeth extend over the tips of the grooves. It is possible to construct overhanging triangular SRGs that substantially eliminate both the transmission-mode T0 beam and the ∓n-mode beams, leaving only ±n-order mode beams (e.g. only T1). The grooves have walls which are at an angle γ to the median (wall angle).

The SRG 44c can be viewed as a spatial waveform embedded in S that has a substantially triangular wave shape, which is skewed by β.

Other SRGs are also possible, for example other types of trapezoidal SRGs (which may not narrow in width all the way to zero), sinusoidal SRGs etc. Such other SRGs also exhibit depth h, linewidth w, slant angle β and wall angles γ which can be defined in a similar manner to FIG. 5A-C.

In the present display system, d is typically between about 250 and 500 nm, and h between about 30 and 400 nm. The slant angle β is typically between about 0 and 45 degrees (such that slant direction is typically elevated above the surface S by an amount between about 45 and 90 degrees).

An SRG has a diffraction efficiency defined in terms of the intensity of desired diffracted beam(s) (e.g. T1) relative to the intensity of the illuminating beam I, and can be expressed as a ratio η of those intensities. As will be apparent from the above, slanted binary SRGs can achieve higher efficiency (e.g. 4b—up to η=0.8 if T1 is the desired beam) than non-slanted SRGs (e.g. 44a—only up to about η=0.2 if T1 is the desired beam). With overhanging triangular SRGs, it is possible to achieve near-optimal efficiencies of η≈1.

Figure 6:
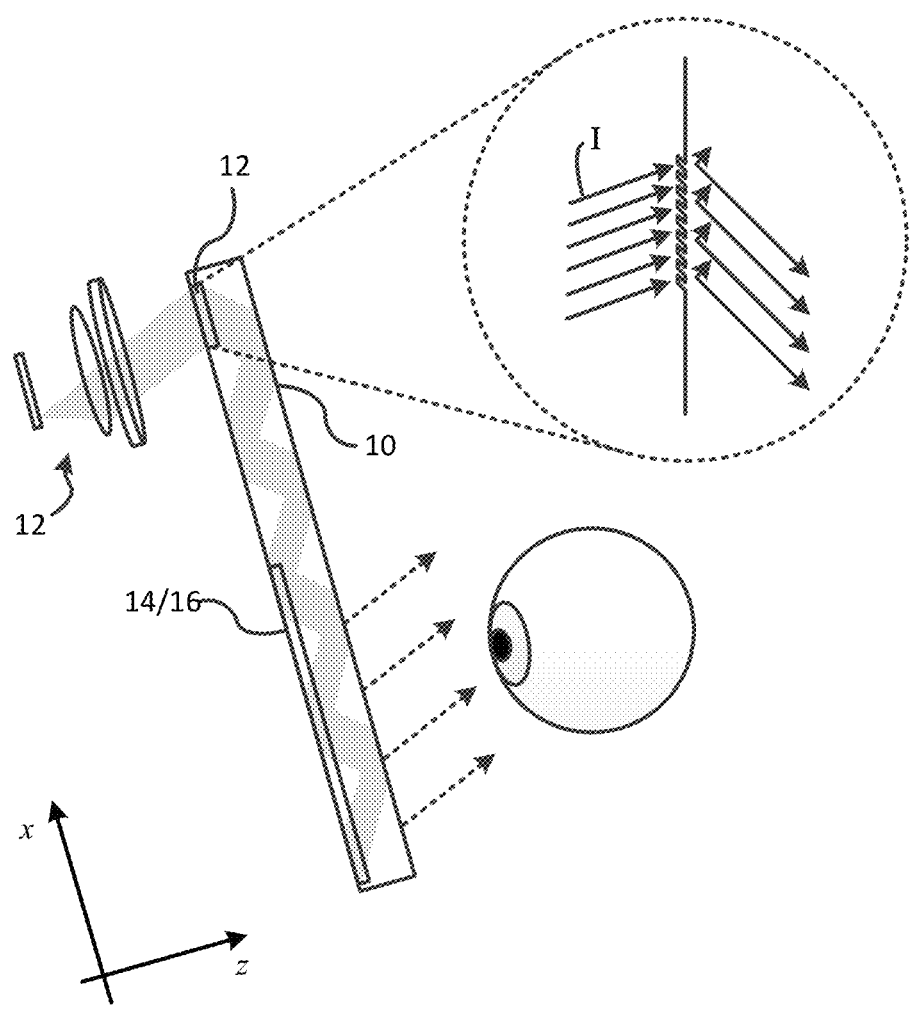
FIG. 6 shows a close up view of part of an incoupling zone of an optical component.

FIG. 6 shows the incoupling SRG 52 with greater clarity, including an expanded version showing how the light beam interacts with it. FIG. 6 shows a plan view of the optical component 10. The light engine 13 provides beams of collimated light, one of which is shown (corresponding to a display pixel). That beam falls on the incoupling SRG 52 and thus causes total internal reflection of the beam in the component 10. The intermediate grating 14 directs versions of the beams down to the exit grating 16, which causes diffraction of the image onto the user's eye. The operation of the grating 12 is shown in more detail in the expanded portion which shows rays of the incoming light beam coming in from the left and denoted I and those rays being diffracted so as to undergo TIR in the optical component 10. The grating in FIG. 6 is of the type shown in FIG. 5B but could also be of the type shown in FIG. 5C or some other slanted grating shape.

Optical principles underlying certain embodiments will now be described with reference to FIGS. 7A-9B.

Collimating optics of the display system is arranged to substantially collimate an image on a display of the display system into multiple input beams. Each beam is formed by collimating light from a respective image point, that beam directed to the incoupling grating in a unique inward direction which depends on the location of that point in the image. The multiple input beams thus form a virtual version of the image. The intermediate and exit grating have widths substantially larger than the beams' diameters. The incoupling grating is arranged to couple each beam into the intermediate grating, in which that beam is guided onto multiple splitting regions of the intermediate grating in a direction along the width of the intermediate grating. The intermediate grating is arranged to split that beam at the splitting regions to provide multiple substantially parallel versions of that beam. Those multiple versions are coupled into the exit grating, in which the multiple versions are guided onto multiple exit regions of the exit grating. The exit regions lie in a direction along the width of the exit grating. The exit grating is arranged to diffract the multiple versions of that beam outwardly, substantially in parallel and in an outward direction which substantially matches the unique inward direction in which that beam was incoupled. The multiple input beams thus cause multiple exit beams to exit the waveguide which form substantially the same virtual version of the image.

Figure 7A:
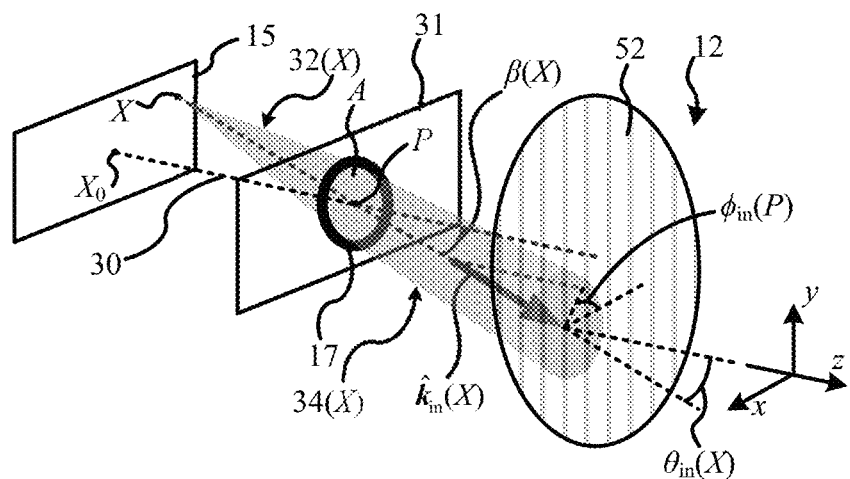
FIG. 7A shows a perspective view of a part of a display system.

FIG. 7a shows a perspective view of the display 15, imaging optics 17 and incoupling SRG 52. Different geometric points on the region of the display 15 on which an image is displayed are referred to herein as image points, which may be active (currently emitting light) or inactive (not currently emitting light). In practice, individual pixels can be approximated as image points.

The imaging optics 17 can typically be approximated as a principal plane (thin lens approximation) or, in some cases, more accurately as a pair of principal planes (thick lens approximation) the location(s) of which are determined by the nature and arrangement of its constituent lenses. In these approximations, any refraction caused by the imaging optics 17 is approximated as occurring at the principal plane(s). To avoid unnecessary complication, principles of various embodiments will be described in relation to a thin lens approximation of the imaging optics 17, and thus in relation to a single principal plane labelled 31 in FIG. 7a, but it will be apparent that more complex imaging optics that do not fit this approximation still can be utilized to achieve the desired effects.

The imaging optics 17 has an optical axis 30 and a front focal point, and is positioned relative to the optical component 10 so that the optical axis 30 intersects the incoupling SRG 52 at or near the geometric centre of the incoupling SRG 52 with the front focal point lying substantially at an image point $X_0$ on the display (that is, lying in the same plane as the front of the display). Another arbitrary image point X on the display is shown, and principles underlying various embodiments will now be described in relation to X without loss of generality. In the following, the terminology "for each X" or similar is used as a convenient shorthand to mean "for each image point (including X)" or similar, as will be apparent in context.

When active, image points—including the image point labelled X and $X_0$—act as individual illumination point sources from which light propagates in a substantially isotropic manner through the half-space forward of the display 15. Image points in areas of the image perceived as lighter emit light of higher intensity relative to areas of the image perceived as darker. Image points in areas perceived as black emit no or only very low intensity light (inactive image points). The intensity of the light emitted by a particular image point may change as the image changes, for instance when a video is displayed on the display 15.

Each active image point provides substantially uniform illumination of a collimating area A of the imaging optics 17, which is substantially circular and has a diameter D that depends on factors such as the diameters of the constituent lenses (typically D is of order 1-10 mm). This is illustrated for the image point X in FIG. 7a, which shows how any propagating light within a cone 32(X) from X is incident on the collimating area A. The imaging optics collimates any light 32(X) incident on the collimating area A to form a collimated beam 34(X) of diameter D (input beam), which is directed towards the incoupling grating 52 of the optical component 10. The beam 34(X) is thus incident on the incoupling grating 52. A shielding component (not shown) may be arranged to prevent any un-collimated light from outside of the cone 32(X) that is emitted from X from reaching the optical component 10.

The beam 34(X) corresponding to the image point X is directed in an inward propagation direction towards the incoupling SRG 52, which can be described by a propagation vector $\hat{k}_{in}(X)$ (herein, bold typeface is used to denote 3-dimensional vectors, with hats on such vectors indicating denoting a unit vector). The inward propagation direction depends on the location of X in the image and, moreover, is unique to X. That unique propagation direction can be parameterized in terms of an azimuthal angle $\phi_{in}(X)$ (which is the angle between the x-axis and the projection of $\hat{k}_{in}(X)$ in the xy-plane) and a polar angle $\theta_{in}(X)$ (which is the angle between the z-axis and $\hat{k}_{in}$ (P) as measured in the plane in which both the z-axis and $\hat{k}_{in}(X)$ lie—note this is not the xz-plane in general). The notation $\phi_{in}(X)$, $\theta_{in}(X)$ is adopted to denote the aforementioned dependence on X; as indicated $\phi_{in}(X)$, $\theta_{in}(X)$ are unique to that X. Note that, herein, both such unit vectors and such polar/azimuthal angle pairs parameterizing such vectors are sometimes referred herein to as "directions" (as the latter represent complete parameterizations thereof), and that sometimes azimuthal angles are referred to in isolation as xy-directions for the same reason. Note further that "inward" is used herein to refer to propagation that is towards the waveguide (having a positive z-component when propagation is towards the rear of the waveguide as perceived by the viewer and a negative z-component when propagation is towards the front of the waveguide).

The imaging optics has a principle point P, which is the point at which the optical axis 30 intersects the principal plane 31 and which typically lies at or near the centre of the collimation area A. The inward direction $\hat{k}_{in}(X)$ and the optical axis 30 have an angular separation $\beta(X)$ equal to the angle subtended by X and $X_0$ from P. $\beta(X)=\theta_{in}(X)$ if the optical axis is parallel to the z-axis (which is not necessarily the case).

As will be apparent, the above applies for each active image point and the imaging optics is thus arranged to substantially collimate the image which is currently on the display 15 into multiple input beams, each corresponding to and propagating in a unique direction determined by the location of a respective active image point (active pixel in practice). That is, the imaging optics 17 effectively converts each active point source X into a collimated beam in a unique inward direction $\hat{k}_{in}(X)$. As will be apparent, this can be equivalently stated as the various input beams for all the active image points forming a virtual image at infinity that corresponds to the real image that is currently on the display 17. A virtual image of this nature is sometimes referred to herein as a virtual version of the image (or similar).

The input beam corresponding to the image point $X_0$ (not shown) would propagate parallel to the optical axis 30, towards or near the geometric centre of the incoupling SRG 52.

Figure 7B:
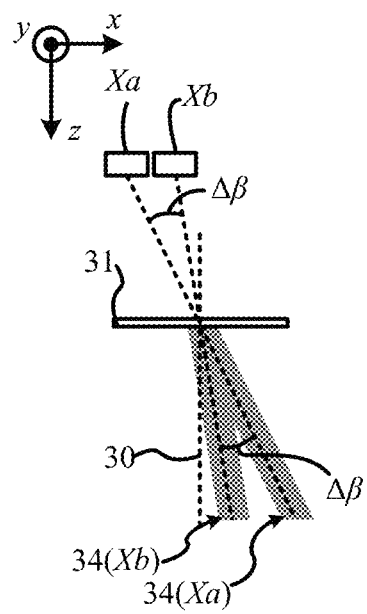
FIG. 7B shows a plan view of individual pixels of a display.

As mentioned, in practice, individual pixels of the display 15 can be approximated as single image points. This is illustrated in FIG. 7B which is a schematic plan view showing the principal plane 31 and two adjacent pixels Xa, Xb of the display 15, whose centres subtend an angle $\Delta\beta$ from the principal point P. Light emitted the pixels Xa, Xb when active is effectively converted into collimated beams 34(Xa), 34(Xb) having an angular separation equal to $\Delta\beta$. As will be apparent, the scale of the pixels Xa, Xb has been greatly enlarged for the purposes of illustration.

The beams are highly collimated, having an angular range no greater than the angle subtended by an individual pixel from P (~$\Delta\beta$) e.g. typically having an angular range no more than about ½ milliradian. As will become apparent in view of the following, this increases the image quality of the final image as perceived by the wearer.

Figure 7C:
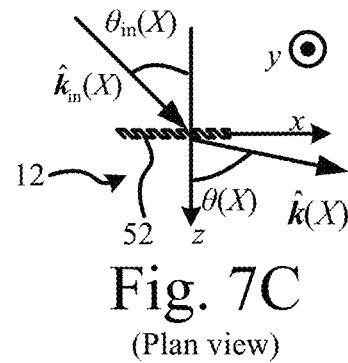
FIGS. 7C and 7D show plan and frontal views of a beam interacting with an optical component.
Figure 7D:
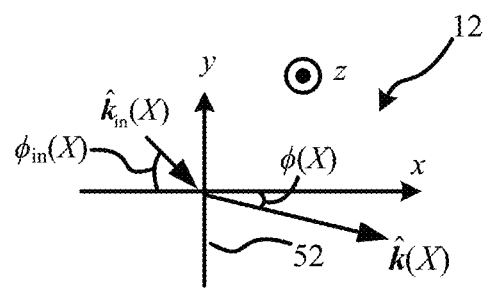

FIGS. 7C and 7D show schematic plan (xz) and frontal (yz) views of part of the optical component respectively. As indicated in these figures, the incoupling grating 52 causes diffraction of the beam 34(X) thereby causing a first (±1) order mode beam to propagate within the optical component 10 in a new direction $\hat{k}(X)$ that is generally towards the fold SRG 54 (i.e. that has a positive x-component). The new direction $\hat{k}(X)$ can be parameterized by azimuthal and polar angles $\phi(X)$—where $|\phi(X)| \leq |\phi_{in}(X)|$ and $\theta(X)$ where $|\theta(X)| > |\theta_{in}(X)|$—which are also determined by the location of and unique to the image point X. The grating 52 is configured so that the first order mode is the only significant diffraction mode, with the intensity of this new beam thus substantially matching that of the input beam. As mentioned above, a slanted grating can be used to achieve this desired effect (the beam as directed away from the incoupling SRG 52 would correspond, for instance, to beam T1 as shown in FIG. 4B or 4C). In this manner, the beam 34(X) is coupled into the incoupling zone 12 of the optical component 10 in the new direction $\hat{k}(X)$.

The optical component has a refractive index n and is configured such that the polar angle $\theta(X)$ satisfies total internal reflection criteria given by:

$$\sin \theta(X) > 1/n \text{ for each } X. \quad (1):$$

As will be apparent, each beam input from the imaging optics 17 thus propagates through the optical component 10 by way of total internal reflection (TIR) in a generally horizontal (+x) direction (offset from the x-axis by $\phi(X) < \phi_{in}(X)$). In this manner, the beam 34(X) is coupled from the incoupling zone 12 into the fold zone 14, in which it propagates along the width of the fold zone 14.

Figure 7F:
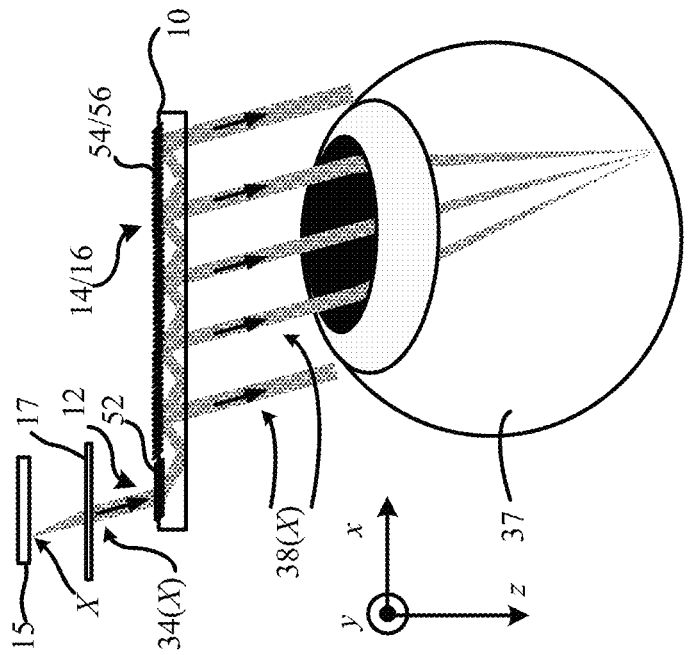
FIG. 7F shows a plan view of an optical component performing beam expansion.
Figure 7E:
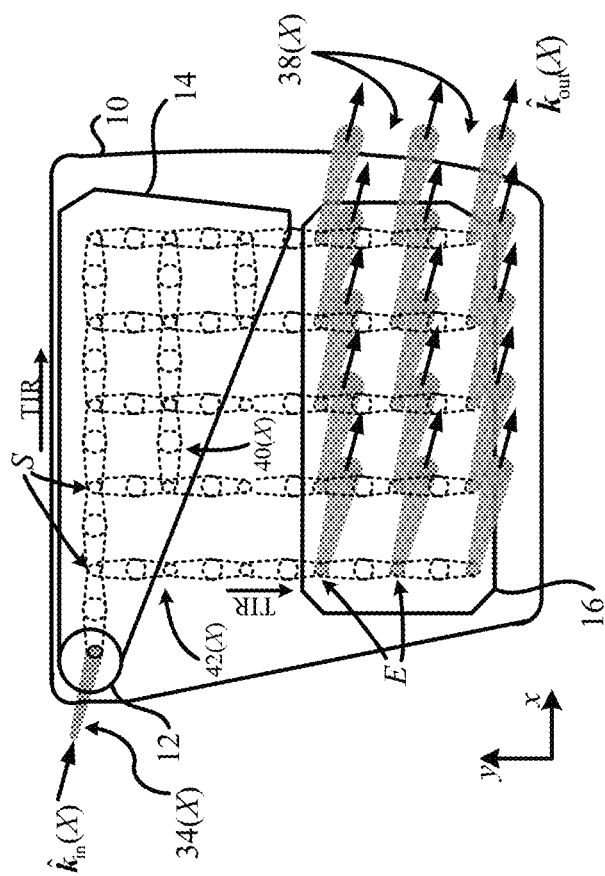
FIG. 7E shows a frontal view of an optical component performing beam expansion.

FIG. 7E shows a frontal (xy) view of the whole of the optical component 10, from a viewpoint similar to that of the wearer. As explained in more detail below, a combination of diffractive beam splitting and total internal reflection within the optical component 10 results in multiple versions of each input beam 34(X) being outwardly diffracted from the exit SRG along both the length and the width of the exit zone 16 as output beams 38(X) in respective outward directions (that is, away from the optical component 10) that substantially match the respective inward direction $\hat{k}_{in}(X)$ of the corresponding input beam 34(X).

In FIG. 7E, beams external to the optical component 10 are represented using shading and dotted lines are used to represent beams within the optical component 10. Perspective is used to indicate propagation in the z-direction, with widening (resp. narrowing) of the beams in FIG. 7E representing propagation in the positive (resp. negative) z direction; that is towards (resp. away from) the wearer. Thus, diverging dotted lines represent beams within the optical component 10 propagating towards the front wall of the optical component 10; the widest parts represent those beams striking the front wall of the optical component 10, from which they are totally internally reflected back towards the rear wall (on which the various SRGs are formed), which is represented by the dotted lines converging from the widest points to the narrowest points at which they are incident on the rear wall. Regions where the various beams are incident on the fold and exit SRGs are labelled S and E and termed splitting and exit regions respectively for reasons that will become apparent.

As illustrated, the input beam 34(X) is coupled into the waveguide by way of the aforementioned diffraction by the incoupling SRG 52, and propagates along the width of the incoupling zone 12 by way of TIR in the direction $\phi(X)$, $\pm\theta(X)$ (the sign but not the magnitude of the polar angle changing whenever the beam is reflected). As will be apparent, this results in the beam 34(X) eventually striking the fold SRG at the left-most splitting region S.

When the beam 34(X) is incident at a splitting region S, that incident beam 34(X) is effectively split in two by way of diffraction to create a new version of that beam 42(X) (specifically a −1 reflection mode beam) which directed in a specific and generally downwards (−y) direction $\phi'(X)$, $\pm\theta'(X)$ towards the exit zone 16 due to the fold SRG 54 having a particular configuration which will be described in due course, in addition to a zero order reflection mode beam (specular reflection beam), which continues to propagate along the width of the beam in the same direction $\phi(X)$, $\pm\theta(X)$ just as the beam 34(X) would in the absence of the fold SRG (albeit at a reduced intensity). Thus, the beam 34(X) effectively continues propagates along substantially the whole width of the fold zone 14, striking the fold SRG at various splitting regions S, with another new version of the beam (in the same specific downward direction $\phi'(X)$, $\pm\theta'(X)$) created at each splitting region S. As shown in FIG. 7E, this results in multiple versions of the beam 34(X) being coupled into the exit zone 16, which are horizontally separated so as to collectively span substantially the width of the exit zone 16.

As also shown in FIG. 7E, a new version 42(X) of the beam as created at a splitting region S may itself strike the fold SRG during its downward propagation. This will result in a zero order mode being created which continues to propagate generally downwards in the direction $\phi''(X)$, $\pm\theta'$ (X) and which can be viewed as continued propagation of that beam, but may also result in a non-zero order mode beam 40(X) (further new version) being created by way of diffraction. However, any such beam 40(X) created by way of such double diffraction at the same SRG will propagate in substantially the same direction $\phi(X)$, $\pm\theta(X)$ along the width of the fold zone 14 as the original beam 34(X) as coupled into the optical component 10 (see below). Thus, notwithstanding the possibility of multiple diffractions by the fold SRG, propagation of the various versions of the beam 34(X) (corresponding to image point X) within the optical component 10 is effectively limited to two xy-directions: the generally horizontal direction ($\phi(X)$, $\pm\theta(X)$), and the specific and generally downward direction ($\phi'(X)$, $\pm\theta'(X)$) that will be discussed shortly.

Propagation within the fold zone 14 is thus highly regular, with all beam versions corresponding to a particular image point X substantially constrained to a lattice like structure in the manner illustrated.

The exit zone 16 is located below the fold zone 14 and thus the downward-propagating versions of the beam 42(X) are coupled into the exit zone 16, in which they are guided onto the various exit regions E of the output SRG. The exit SRG 56 is configured so as, when a version of the beam strikes the output SRG, that beam is diffracted to create a first order mode beam directed outwardly from the exit SRG 56 in an outward direction that substantially matches the unique inward direction in which the original beam 34(X) corresponding to image point X was inputted. Because there are multiple versions of the beam propagating downwards that are substantially span the width of the exit zone 16, multiple output beams are generated across the width of the exit zone 16 (as shown in FIG. 7E) to provide effective horizontal beam expansion.

Moreover, the exit SRG 56 is configured so that, in addition to the outwardly diffracted beams 38(X) being created at the various exit regions E from an incident beam, a zero order diffraction mode beam continuous to propagate downwards in the same specific direction as that incident beam. This, in turn, strikes the exit SRG at a lower exit zone 16s in the manner illustrated in FIG. 7E, resulting in both continuing zero-order and outward first order beams. Thus, multiple output beams 38(X) are also generated across substantially the width of the exit zone 16 to provide effective vertical beam expansion.

The output beams 38(X) are directed outwardly in outward directions that substantially match the unique input direction in which the original beam 34(X) is inputted. In this context, substantially matching means that the outward direction is related to the input direction in a manner that enables the wearer's eye to focus any combination of the output beams 38(X) to a single point on the retina, thus reconstructing the image point X (see below).

For a flat optical component (that is, whose front and rear surfaces lie substantially parallel to the xy-plane in their entirety), the output beams are substantially parallel to one another (to at least within the angle $\Delta\beta$ subtended by two adjacent display pixels) and propagate outwardly in an output propagation direction $\hat{k}_{out}(X)$ that is parallel to the unique inward direction $\hat{k}_{in}(X)$ in which the corresponding input beam 34(X) was directed to the incoupling SRG 52. That is, directing the beam 34(X) corresponding to the image point X to the incoupling SRG 52 in the inward direction $\hat{k}_{in}(X)$ causes corresponding output beams 38(X) to be diffracted outwardly and in parallel from the exit zone 16, each in an outward propagation direction $\hat{k}_{out}(X)=\hat{k}_{in}(X)$ due to the configuration of the various SRGs (see below).

As will now be described with reference to FIG. 7F, this enables a viewer's eye to reconstruct the image when looking at the exit zone 16. FIG. 7F shows a plan (xz) view of the optical component 10. The input beam 34(X) is in coupled to the optical component 10 resulting in multiple parallel output beams 38(X) being created at the various exit regions E in the manner discussed above. This can be equivalently expressed at the various output beams corresponding to all the image points forming the same virtual image (at infinity) as the corresponding input beams.

Because the beams 38(X) corresponding to the image point X are all substantially parallel, any light of one or more of the beam(s) 38(X) which is received by the eye 37 is focussed as if the eye 37 were perceiving an image at infinity (i.e. a distant image). The eye 37 thus focuses such received light onto a single retina point, just as if the light were being received from the imaging optics 17 directly, thus reconstructing the image point X (e.g. pixel) on the retina. As will be apparent, the same is true of each active image point (e.g. pixel) so that the eye 37 reconstructs the whole image that is currently on the display 15.

However, in contrast to receiving the image directly from the optics 17—from which only a respective single beam 34(X) of diameter D is emitted for each X—the output beams 39(X) are emitted over a significantly wider area i.e. substantially that of the exit zone 16, which is substantially larger than the area of the inputted beam ($\sim D^2$). It does not matter which (parts) of the beam(s) 38(X) the eye receives as all are focused to the same retina point—e.g., were the eye 37 to be moved horizontally (±x) in FIG. 7F, it is apparent that the image will still be perceived. Thus, no adaptation of the display system is required for, say, viewers with different pupillary distances beyond making the exit zone 16 wide enough to anticipate a reasonable range of pupillary distances: whilst viewers whose eyes are closer together will generally receive light from the side of the exit zone 16 nearer the incoupling zone 12 as compared with viewers whose eyes are further apart, both will nonetheless perceive the same image. Moreover, as the eye 27 rotates, different parts of the image are brought towards the centre of the viewer's field of vision (as the angle of the beams relative to the optical axis of the eye changes) with the image still remaining visible, thereby allowing the viewer to focus their attention on different parts of the image as desired.

The same relative angular separation Δβ exhibited the input beams corresponding any two adjacent pixels Xa, Xb is also exhibited by the corresponding sets of output beams 38(Xa), 38(Xb)—thus adjacent pixels are focused to adjacent retina points by the eye 37. All the various versions of the beam remain highly collimated as they propagate through the optical component 10, preventing significant overlap of pixel images as focused on the retina, thereby preserving image sharpness.

It should be noted that FIGS. 7A-7G are not to scale and that in particular beams diameters are, for the sake of clarity, generally reduced relative to components such as the display 15 than would typically be expected in practice.

The configuration of the incoupling SRG 52 will now be described with reference to FIGS. 8A and 8B, which show schematic plan and frontal views of part of the fold grating 52. Note, in FIGS. 8A and 8B, beams are represented by arrows (that is, their area is not represented) for the sake of clarity.

Figure 8A:
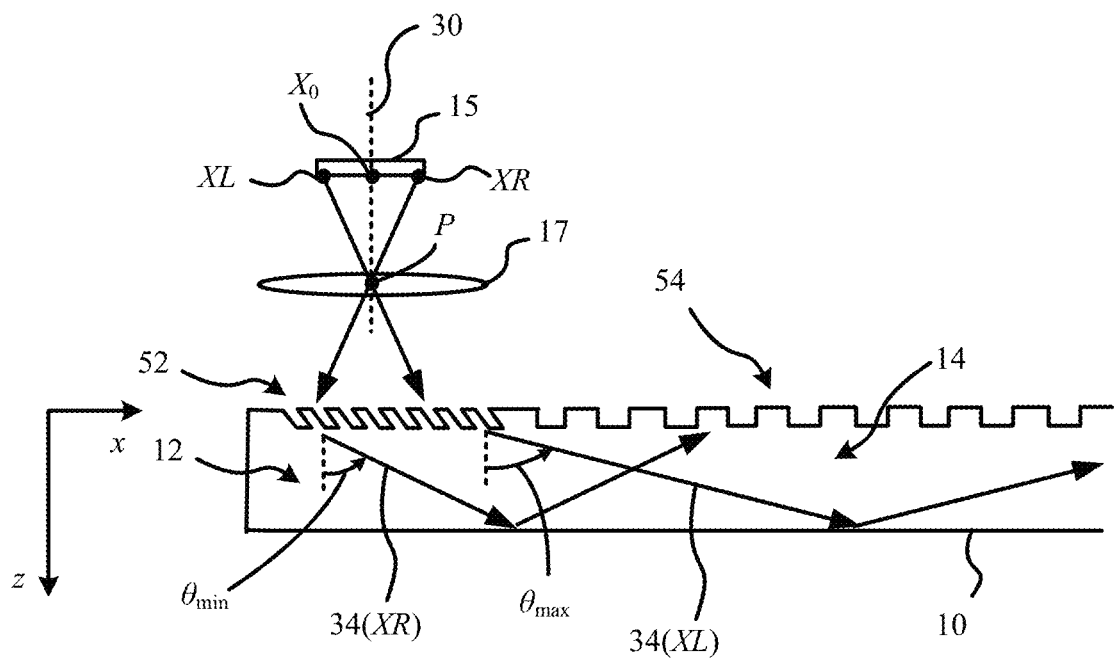
FIGS. 8A and 8B are plan and frontal views of a part of an optical component.

FIG. 8A shows two image points XL, XR located at the far left and far right of the display 15 respectively, from which light is collimated by the optics 17 to generate respective input beams 34(XL), 34(XR) in inward directions $(\theta_{in}(XL), \phi_{in}(XL)), (\theta_{in}(XR), \phi_{in}(XR))$. These beams are coupled into the optical component 10 by the incoupling SRG 52 as shown—the incoupled beams shown created at the incoupling SRG 52 are first order (+1) mode beams created by way of diffraction of the beams incident on the SRG 52. The beams 34(XL), 34(XR) as coupled into the waveguide propagate in directions defined by the polar angles θ(XL), θ(XR).

Figure 8B:
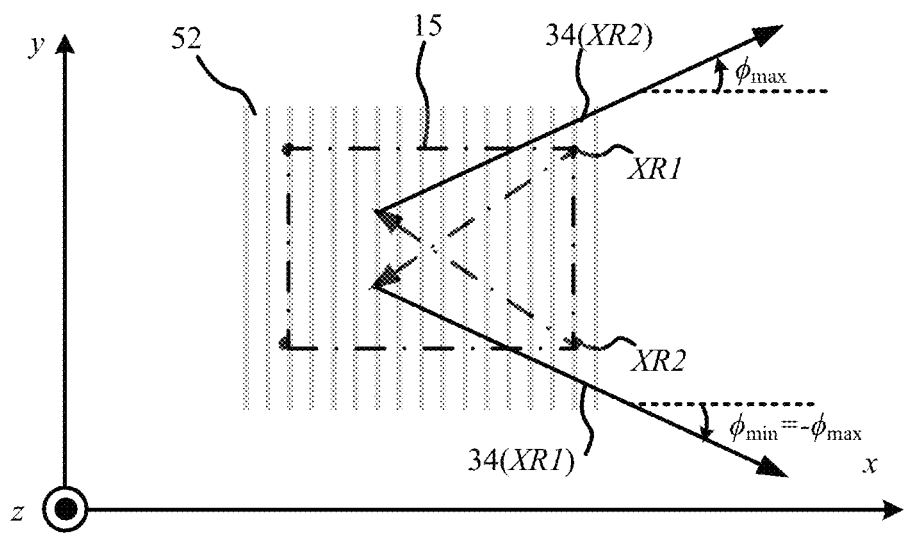

FIG. 8B shows two image points XR1 and XR2 at the far top-right and far bottom-right of the display 15. Note in this figure dashed-dotted lines denote aspects which are behind the optical component 10 (−z). Corresponding beams 34(XL), 34(XR) in directions within the optical component 10 with polar angles φ(XL), φ(XR).

Such angles θ(X), φ(X) are given by the (transmissive) grating equations:

$$n\sin\theta(X)\sin\phi(X) = \sin\theta_{in}(X)\sin\phi_{in}(X) \quad (2)$$

$$n\sin\theta(X)\cos\phi(X) = \sin\theta_{in}(X)\cos\phi_{in}(X) + \frac{\lambda}{d_1} \quad (3)$$

with the SRG 52 having a grating period $d_1$, the beam light having a wavelength λ, and n the refractive index of the optical component.

It is straightforward to show from (2), (3) that $\theta(XL)=\theta_{max}$ and $\theta(XR)=\theta_{min}$ i.e. that any beam as coupled into the component 10 propagates with an initial polar angle in the range [θ(XR), θ(XL)]; and that $\phi(XR2)=\phi_{max}$ and $\phi(XR1)=\phi_{min}$ ($\approx\phi_{max}$ in this example) i.e. that any beam as coupled into the component initially propagates with an azimuthal angle in the range [φ(XR1), φ(XR2)] ($\approx[-\phi(XR2), \phi(XR2)]$).

The configuration of the fold SRG 54 will now be described with references to FIGS. 9A-9B. Note, in FIGS. 9A and 9B, beams are again represented by arrows, without any representation of their areas, for the sake of clarity. In these figures, dotted lines denote orientations perpendicular to the fold SRG grating lines, dashed lines orientations perpendicular to the incoupling SRG grating lines, and dash-dotted lines orientations perpendicular to the exit SRG grating lines.

Figure 9A:
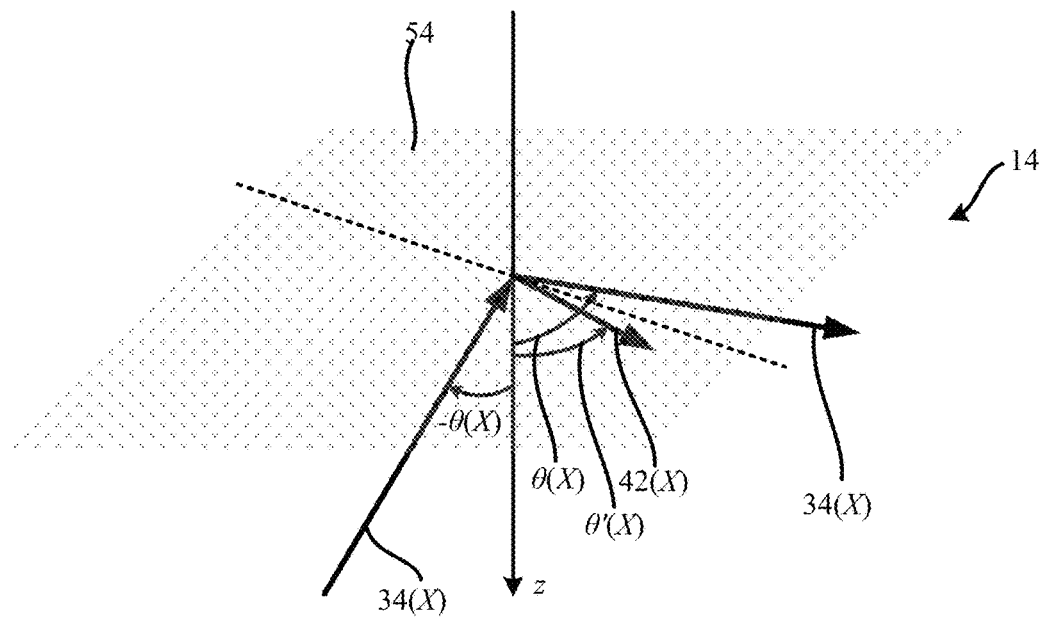
FIG. 9A shows a perspective view of beam reflection within a fold zone of a waveguide.

FIG. 9A shows a perspective view of the beam 34(X) as coupled into the fold zone 14 of the optical component 10, having been reflected from the front wall of the optical component 10 and thus travelling in the direction (φ(X), −θ(X)) towards the fold SRG 54. A dotted line (which lies perpendicular to the fold SRG grating lines) is shown to represent the orientation of the fold SRG.

The fold SRG 54 and incoupling SRG 52 have a relative orientation angle A (which is the angle between their respective grating lines). The beam thus makes an angle A+φ(X) (see FIG. 9B) with the fold SRG grating lines as measured in the xy-plane. The beam 34 is incident on the fold SRG 54, which diffracts the beam 34 into different components. A zero order reflection mode (specular reflection) beam is created which continues to propagate in the direction (φ(X), +θ(X)) just as the beam 34(X) would due to reflection in the absence of the fold SRG 54 (albeit at a reduced intensity). This specular reflection beam can be viewed as effectively a continuation of the beam 34(X) and for this reason is also labelled 34(X). A first order (−1) reflection mode beam 42(X) is also created which can be effectively considered a new version of the beam.

As indicated, the new version of the beam 42(X) propagates in a specific direction (φ'(X), θ'(X)) which is given by the known (reflective) grating equations:

$$n\sin\theta'(X)\sin(A+\phi'(X)) = n\sin\theta(X)\sin(A+\phi(X)) \quad (4)$$

$$n\sin\theta'(X)\cos(A+\phi'(X)) = n\sin\theta(X)\cos(A+\phi(X)) - \frac{\lambda}{d_2} \quad (5)$$

where the fold SRG has a grating period $d_2$, the beam light has a wavelength λ and n is the refractive index of the optical component 10.

Figure 9B:
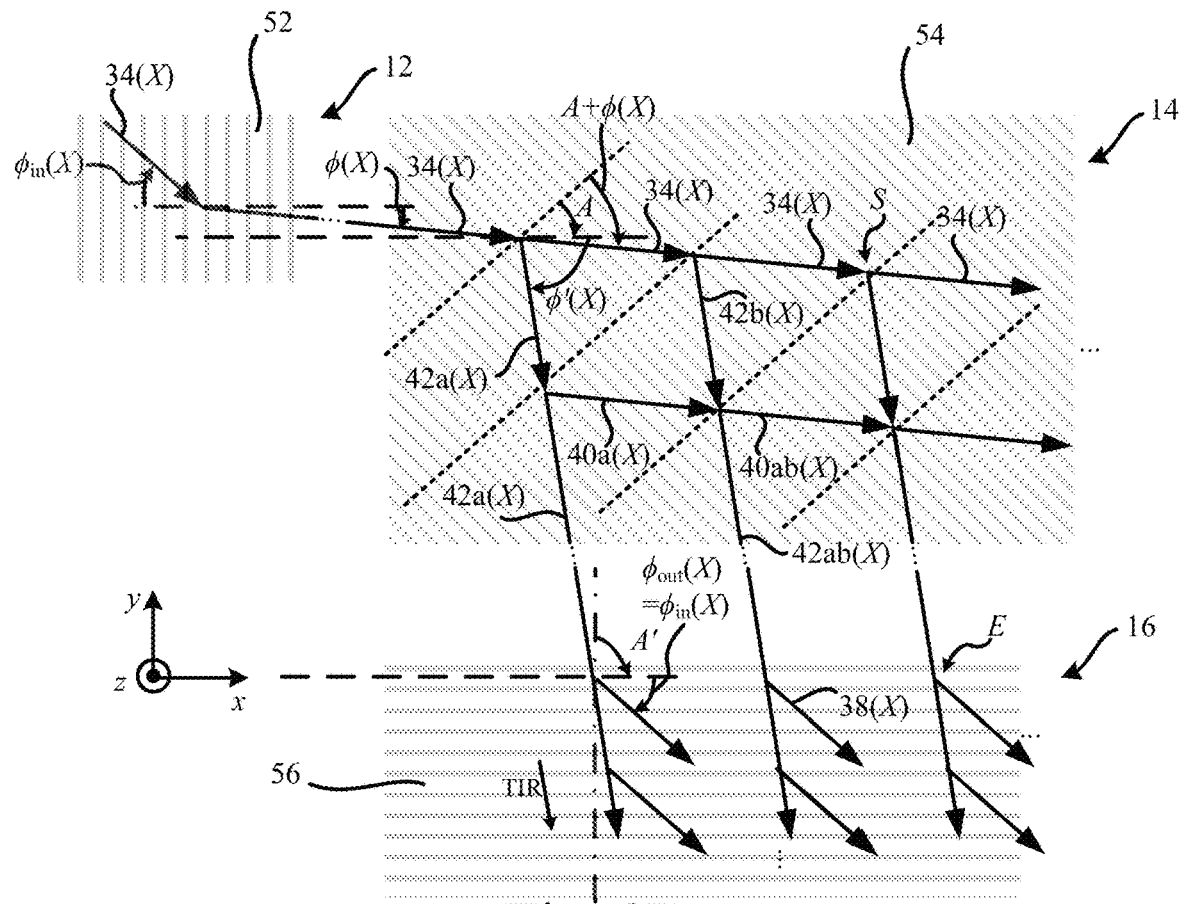
FIG. 9B illustrates a beam expansion mechanism.

As shown in FIG. 9B, which shows a schematic frontal view of the optical component 10, the beam 34(X) is coupled into the incoupling zone 12 with azimuthal angle φ(X) and thus makes an xy-angle φ(X)+A the fold SRG 54.

A first new version 42a(X) (−1 mode) of the beam 34(X) is created when it is first diffracted by the fold SRG 54 and a second new version 42b(X) (−1 mode) when it is next diffracted by the fold SRG 54 (and so on), which both propagate in xy-direction φ"(X). In this manner, the beam 34(X) is effectively split into multiple versions, which are horizontally separated (across the width of the fold zone 14). These are directed down towards the exit zone 16 and thus coupled into the exit zone 16 (across substantially the width of the exit zone 16 due to the horizontal separation). As can be see, the multiple versions are thus incident on the various exit regions (labelled E) of the exit SRG 56, which lie along the width of the exit zone 16.

These new, downward (−y)-propagating versions may themselves meet the fold SRG once again, as illustrated. However, it can be shown from (4), (5) that any first order reflection mode beam (e.g. 40a(X), +1 mode) created by diffraction at an SRG of an incident beam (e.g. 42a(X), −1 mode) which is itself a first order reflection mode beam created by an earlier diffraction of an original beam (e.g. 34(X)) at the same SRG will revert to the direction of the original beam (e.g. $\phi$(X), ±$\theta$(X), which is the direction of propagation of 40a(X)). Thus, propagation within the fold zone 14 is restricted to a diamond-like lattice, as can be seen from the geometry of FIG. 9B. The beam labelled 42ab(X) is a superposition of a specular reflection beam created when 42b(X) meets the fold SRG 54 and a −1 mode beam created when 40a(X) meets the fold SRG at substantially the same location; the beam labelled 42ab(X) is a superposition of a specular reflection beam created when 40a(X) meets the fold SRG 54 and a +1 mode beam created when 42b(X) meets the fold SRG at substantially the same location (and so on).

The exit SRG and incoupling SRG 52, 56 are oriented with a relative orientation angle A' (which is the angle between their respective grating lines). At each of the exit regions, the version meeting that region is diffracted so that, in addition to a zero order reflection mode beam propagating downwards in the direction $\phi'$(X), ±$\theta'$(X), a first order (+1) transmission mode beam 38(X) which propagates away from the optical component 10 in an outward direction $\phi_{out}$(X), $\theta_{out}$(X) given by:

$$\sin\theta_{out}(X)\sin(A' + \phi_{out}(X)) = n\sin\theta'(X)\sin(A' + \phi'(X)) \quad (6)$$

$$\sin\theta_{out}(X)\cos(A' + \phi_{out}(X)) = n\sin\theta'(X)\cos(A' + \phi'(X)) + \frac{\lambda}{d_3} \quad (7)$$

The output direction $\theta_{out}$(X), $\phi_{out}$(X) is that of the output beams outside of the waveguide (propagating in air). For a flat waveguide, equations (6), (7) hold both when the exit grating is on the front of the waveguide—in which case the output beams are first order transmission mode beams (as can be seen, equations (6), (7) correspond to the known transmission grating equations)—but also when the exit grating is on the rear of the waveguide (as in FIG. 7F)—in which case the output beams correspond to first order reflection mode beams which, upon initial reflection from the rear exit grating propagate in a direction $\theta_{out}$(X), $\phi'_{out}$(X) within the optical component 10 given by:

$$n\sin\theta'_{out}(X)\sin(A' + \phi'_{out}(X)) = n\sin\theta'(X)\sin(A' + \phi'(X)) \quad (6')$$

$$n\sin\theta'_{out}(X)\cos(A' + \phi'_{out}(X)) = n\sin\theta'(X)\cos(A' + \phi'(X)) + \frac{\lambda}{d_3}; \quad (7')$$

these beams are then refracted at the front surface of the optical component, and thus exit the optical component in a direction $\delta_{in}$(X), $\phi_{in}$(X) given by Snell's law:

$$\sin\theta_{out}(X) = n\sin\theta'_{out}(X) \quad (8)$$

$$\phi'_{out}(X) = \phi_{out}(X) \quad (9)$$

As will be apparent, the conditions of equations (6), (7) follow straight forwardly from (6'), (7'), (8) and (9). Note that such refraction at the front surface, whilst not readily visible in FIG. 7F, will nonetheless occur in the arrangement of FIG. 7F.

It can be shown from the equations (2-7) that, when $$d = d_1 = d_3 \quad (10)$$

(that is, when the periods of the incoupling and exit SRGs 52, 56 substantially match);

$$d_2 = d/(2\cos A); \quad (11)$$

and $$A' = 2A; \quad (12)$$

then $(\theta_{out}(X), \phi_{out}(X)) = (\theta_{in}(X), \phi_{in}(X))$.

Moreover, when the condition $$\sqrt{(1 + 8\cos^2 A)} > \frac{nd}{\lambda} \quad (13)$$

is met, no modes besides the above-mentioned first order and zero order reflection modes are created by diffraction at the fold SRG 54. That is, no additional undesired beams are created in the fold zone when this criteria is met. The condition (13) is met for a large range of A, from about 0 to 70 degrees.

In other words, when these criteria are met, the exit SRG 56 effectively acts as an inverse to the incoupling SRG 52, reversing the effect of the incoupling SRG diffraction for each version of the beam with which it interacts, thereby outputting what is effectively a two-dimensionally expanded version of that beam 34(X) having an area substantially that of the exit SRG 56 (>>$D^2$ and which, as noted, is independent of the imaging optics 17) in the same direction as the original beam was inputted to the component 10 so that the outwardly diffracted beams form substantially the same virtual image as the inwardly inputted beams but which is perceivable over a much larger area.

In the example of FIG. 9B, A≈45° i.e. so that the fold SRG and exit SRGs 54, 56 are oriented at substantially 45 and 90 degrees to the incoupling SRG 52 respectively, with the grating period of the fold region $d_2 = d/\Lambda$. However, this is only an example and, in fact, the overall efficiency of the display system is typically increased when A≥50°.

Figure 7G:
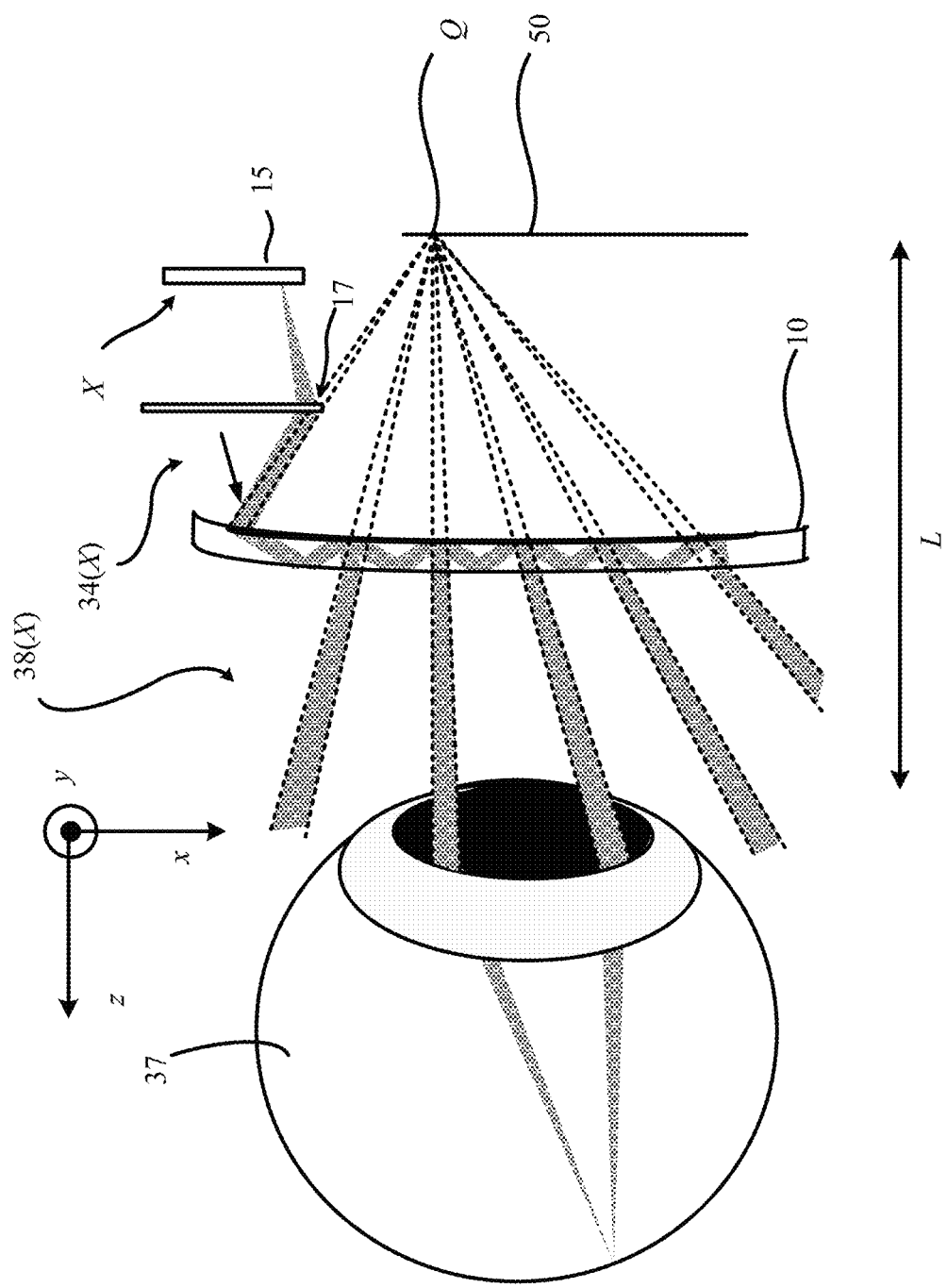
FIG. 7G is a plan view of a curved optical component.

The above considers flat optical components, but a suitably curved optical component (that is, having a radius of curvature extending substantially along the z direction) can be configured to function as an effective lens such that the output beams 30(X) are and are no longer as highly collimated and are not parallel, but have specific relative direction and angular separations such that each traces back to a common point of convergence—this is illustrated in FIG. 7G, in which the common point of convergence is labelled Q. Moreover, when every image point is considered, the various points of convergence for all the different active image points lie in substantially the same plane, labelled 50, located a distance L from the eye 37 so that the eye 37 can focus accordingly to perceive the whole image as if it were the distance L away. This can be equivalently stated as the various output beams forming substantially the same virtual version of the current display image as the corresponding input beams, but at the distance L from the eye 37 rather than at infinity. Curved optical components may be particularly suitable for short-sighted eyes unable to properly focus distant images.

Note, in general the "width" of the fold and exit zones does not have to be their horizontal extent—in general, the width of a fold or exit zone 14, 16 is that zone's extent in the general direction in which light is coupled into the fold zone 14 from the incoupling zone 12 (which is horizontal in the above examples, but more generally is a direction substantially perpendicular to the grating lines of the incoupling zone 12).

As indicated, phase distortions caused by diffractive optical elements imprinted on the surface of a waveguide—such as the SRGs 52, 54, 56—can degrade image quality in a display system of the kind described above. In accordance with the present disclosure, this can be mitigated by introducing suitable height offsets (i.e. in a direction substantially normal to the surface on which they are present) of the optical elements relative to one other and relative to the blank surface of the waveguide.

Figures 12A, 12B:
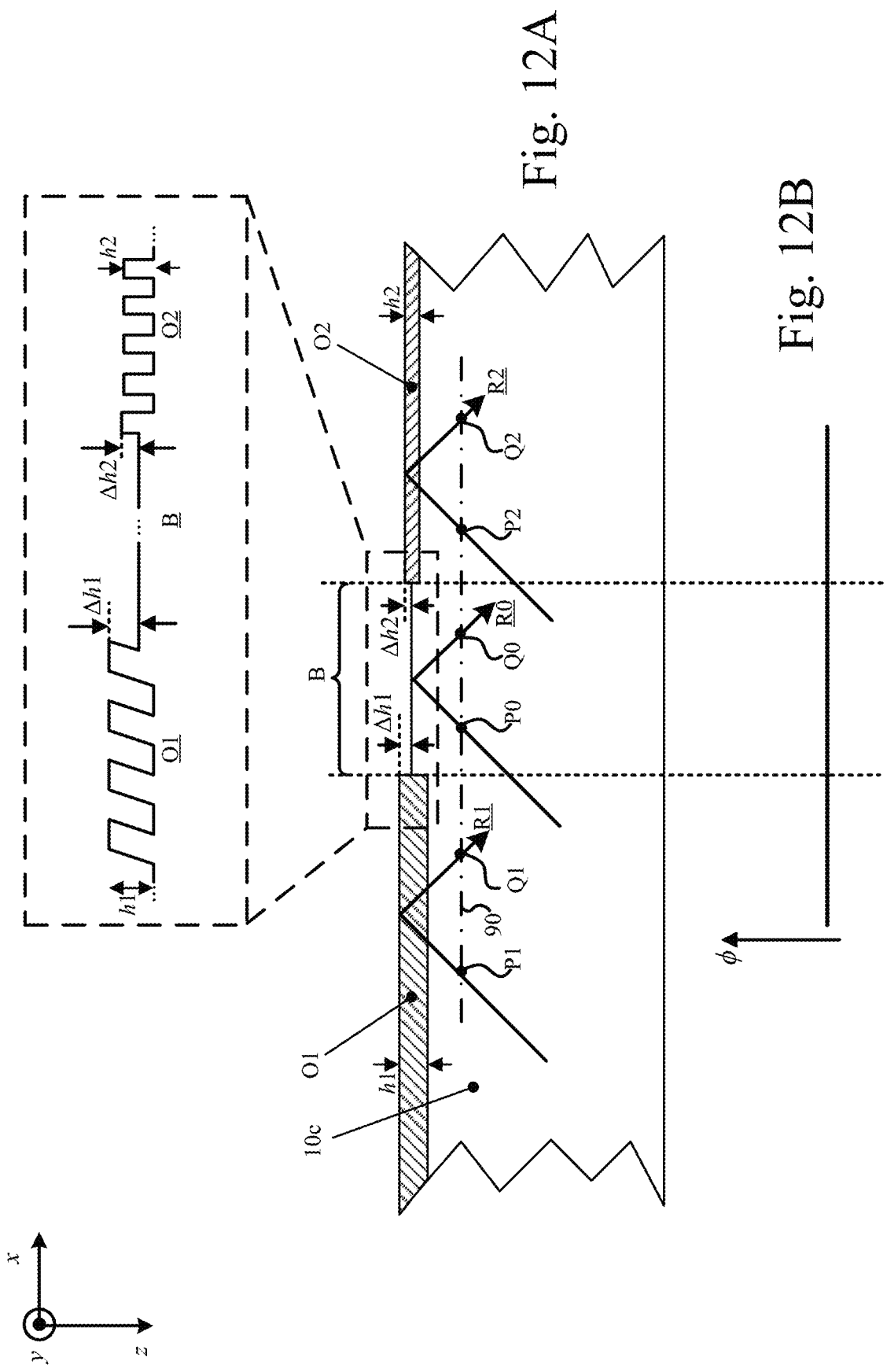
FIG. 12A shows a side view of a part of a first optical component having offset optical elements.
FIG. 12B shows a phase distribution for the second waveguide of FIG. 12A.

FIG. 12A shows a side view of a part of a first waveguide 10c of one embodiment, which is suitable for use in a display system of the kind described above. The waveguide 10c has a first diffractive optical element O1 (e.g. one of the incoupling, fold or exit SRGs 52, 54, 56) and a second diffractive optical element (e.g. another of the incoupling, fold or exit SRG 52, 54, 56) imprinted on its surface (for example on the rear of the waveguide 10c, from the perspective of the viewer). The gratings O1, O2 are separated by a blank surface region B, which—as in the waveguide of FIGS. 10A and 10B—causes light to change phase by $\phi 0$ upon reflection from the blank surface region B. The blank region B could for instance be the region W of FIG. 3B between the incoupling and fold SRGs 52, 54, or the unlabelled region between the fold and exit SRGs 54, 56.

The optical elements have the same structure (in particular, the same depths h1, h2≠h1) as those in FIGS. 10A and 10B, with the first optical element O1 causing light to change phase by $\phi 1 = \phi 0 - \Delta\phi 1$ upon reflection therefrom and the second optical element O2 causing light to change phase by $\phi 2 = \phi 0 - \Delta\phi 2$ upon reflection therefrom.

The depths h1, h2≠h1 are, in contrast to the apodized gratings of FIG. 11A, substantially constant over the entire area of the gratings O1, O2 respectively, right up to the edges of the gratings O1, O2. Alternatively the depths may vary as a function of position (x,y) i.e. as functions h1(x,y), h2(x,y), but nevertheless falls sharply to zero at the edges of the grating i.e. with a significantly steeper gradient than the apodized edges of the regions A1, A2 in FIG. 11A.

Moreover, in contrast to the waveguides 10a, 10b of FIGS. 10A, 10B and 11A, the optical elements O1 and O2 gratings are at offset height with respect to the blank TIR surface. Each height offset is selected such that the additional optical path length introduced by that offset substantially matches the phase difference between reflection from the respective grating region and TIR. The additional optical path length is the product of the refractive index n of the waveguide 10c and the additional distance which light traverses as a result of the offset.

The gratings O1, O2 are offset by distances $\Delta h 1$ and $\Delta h 2$ in the z-direction (i.e. in a direction substantially normal to the surface on which they are imprinted) respectively. The expanded view at the top of FIG. 12A shows this offset in detail: in contrast to FIG. 10A, the tops of the filling regions of O1 and O2 are not level with the blank surface portion B, but are offset from B by $\Delta h 1$ and $\Delta h 2$ respectively.

The offsets $\Delta h 1$ and $\Delta h 2$ substantially match $\Delta \phi 1$ and $\Delta \phi 2$ respectively. That is, each offset $\Delta h 1$, $\Delta h 2$ is such as to increase the length of the optical path traversed by a ray R1, R2 reflected at the respective grating O1, O2 relative to a ray R0 reflected at the blank surface region by an amount that compensates for the differences in the phase changes caused by reflection at O1, B, O2. For the grating O1 (resp. O2), the offset $\Delta h 1$ (resp. $\Delta h 2$) is such as to increase the optical path length traversed by a ray R1 reflected at the first grating O1 (resp. a ray R2 reflected at the second grating O2) relative to that traversed by a ray R0 reflected at the blank surface B by an amount over which the phase of the phase of the ray R1 (resp. R2) changes by substantially $\Delta \phi 1$ (resp.$\approx \Delta \phi 2$). The optical path length traversed by the ray R1 reflected from the first grating O1 is thus increased relative to that traversed by the ray R2 reflected from the second grating O2 by an amount over which the phase of the ray R1 changes by substantially $\Delta \phi 1 - \Delta \phi 2$. Phase matching does not need to be completely accurate to achieve acceptable image quality: phase changes from gratings and the TIR will be angle and wavelength dependent which means that 'fully' optimal performance is obtained only for one case; for others is it less-optimal but nonetheless acceptable in terms of final image quality. In practice the system will be designed to meet conflicting requirements in accordance with normal design practice.

A plane 90 is shown, which is perpendicular to the plane of the waveguide 10c. As will be apparent, assuming the rays R1, R0, R2 are in phase with one another when they arrive at the plane 90 prior to reflection at O1, O2 and B respectively (at points P1, P0, P2 respectively), when the offsets $\Delta h 1$, $\Delta h 2$ substantially match $\Delta \phi 1$, $\Delta \phi 2$ respectively in the above described manner, the rays R1, R0, R2 will also be substantially in phase with one another when they arrive at the plane 90 again (at points Q1, Q0, Q2 respectively) after being reflected. This will be true for any such plane lying below the gratings O1, O2 and above the surface opposite the gratings (in this case the front of the waveguide 10c).

The resulting phase distribution of reflected beams within the waveguide 10c will thus be flat (as shown in FIG. 12B), without any phase jumps that would cause unwanted diffractive beam spreading.

The height offsets can be effected during manufacture, whereby a substrate from which the waveguide 10c is made is processed so that the gratings O1, O2 have the desired height offsets $\Delta h 1$, $\Delta h 2$. The grating offset can be effected by an etching process, for example, so that the blank area is offset from the grating areas by the desired amount.

FIGS. 13A and 13B show side and plan views of a part of a second waveguide 10d in another embodiment. In this example, first and second optical elements O1 are substantially contiguous e.g. separated by a blank region of no more than Wmax≈100 μm, and in some cases no more than 50 μm. For example, the optical elements O1, O2 could be the incoupling and fold SRGs 52, 54 of FIG. 3B, with W≤Wmax. The first optical element 10d is offset relative to the second optical component 10d by an amount $\Delta h'$ which substantially matches $\Delta \phi 1 - \Delta \phi 2$ (which is also equal substantially equal to $\Delta h 1 - \Delta h 2$) i.e. the offset $\Delta h'$ is such as to increase the optical path length traversed by a ray R1 reflected at the first grating O1 relative to a ray R2 reflected at the second grating O2 by an amount over which the phase of the phase of the ray R1 changes by substantially $\Delta \phi 1 - \Delta \phi 2$.

The expanded view at the top of FIG. 13 A shows a small blank region b (e.g. ≤Wmax) separating the gratings O1, O2. When the blank region b separating the gratings O1, O2 is sufficiently small, the improvements in image quality can generally be realized just by matching $\Delta h'$ to $\Delta \phi 1 - \Delta \phi 2$ without having to worry about the offsets relative to the small blank region b as the effects of b may be negligible.

A plane 90 is also shown in FIG. 13A, equivalent to that of 12A. For any such plane 90, when Δh' is thus configured, rays R1, R2 which arrive at the plane 90 (at points P1, P2) in phase with one another prior to reflection at O1, O2 will also be substantially in phase when they arrive at the plane 90 again (at points Q1, Q2) following reflection.

Figure 14:
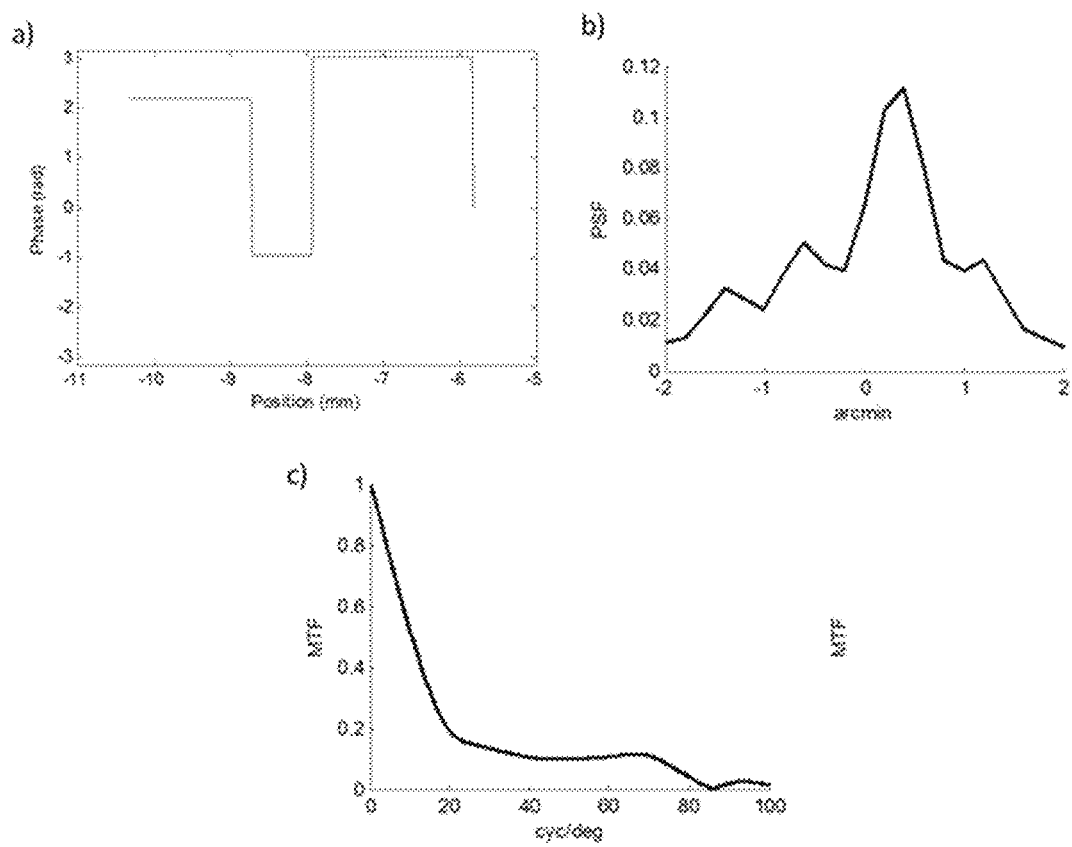
FIG. 14 shows graphs of simulated performance data for the waveguide of FIGS. 11A and 11B.
Figure 15:
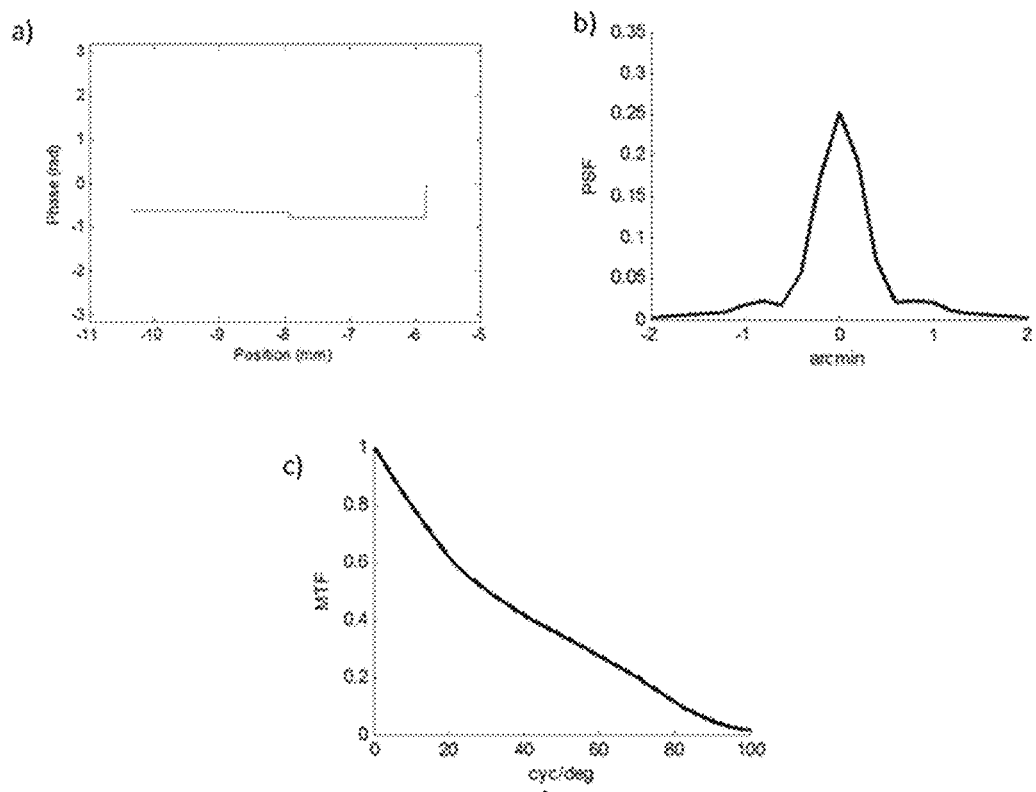
FIG. 15 shows graphs of simulated performance data for the first waveguide of FIG. 12A.

FIG. 14 and FIG. 15 show simulated results for example grating designs both with (FIG. 15) and without (FIG. 14) offset height. FIG. 14 corresponds to the waveguide 10a of FIGS. 10A and 10B, and FIG. 15 to the first waveguide 10c of FIG. 12A. The graphs labelled a) show a simulated phase distributions for each waveguide; the graphs labelled b) show the corresponding point spread functions (PSF), and c) the corresponding modulation transfer functions (MTF).

The PSF describes the response of an imaging system to a point source or point object. In this case, the response is measured in term of angle which represents the extent to which beam de-collimation occurs within the waveguides i.e. beam spreading due to diffraction. As will be apparent, a narrower PSF means less de-collimation, and thus a sharper image.

The MTF is a measure of the ability of an optical system to transfer various levels of detail from object to image. A theoretical MTF of 1.0 (or 100%) represents perfect contrast preservation (in practice, not achievable due to diffraction limits), whereas values less than this mean that more and more contrast is being lost—until an MTF of in practice around 0.1 (or 10%) when separate lines cannot be distinguished, peaks merge together etc.

As can be seen from FIGS. 14 and 15, with the height offset the waveguide has both a narrower PSF and good MTF over a larger range, which is indicative of improved image quality.

It should be noted that light reflected from an optical element may experience a zero phase change i.e. the optical element may cause light to change phase upon reflection by an amount which is zero. For the avoidance of doubt, it should be noted that, in the following, when a structure is described as a causing light to change phase upon reflection by an amount, that amount may or may not be zero.

Note that the above arrangement of the light engine 13 is just an example. For example, an alternative light engine based on so-called scanning can provide a single beam, the orientation of which is fast modulated whilst simultaneously modulating its intensity and/or colour. As will be apparent, a virtual image can be simulated in this manner that is equivalent to a virtual image that would be created by collimating light of a (real) image on a display with collimating optics.

Making an optical component which includes SRGs typically involves the use of microfabrication techniques. Microfabrication refers to the fabrication of desired structures of micrometre scales and smaller. Microfabrication may involve etching of and/or deposition on a substrate, to create the desired microstructure on the substrate.

Wet etching involves using a liquid etchant to selectively dislodge parts of a substrate e.g. parts of a film deposited on a surface of a plate and/or parts of the surface of the plate itself. The etchant reacts chemically with the substrate e.g. plate/film to remove parts of the substrate e.g. plate/film that are exposed to the etchant. The selective etching may be achieved by depositing a suitable protective layer on the substrate/film that exposes only parts of the substrate e.g. plate/film to the chemical effects of etchant and protects the remaining parts from the chemical effects of the etchant. The protective layer may be formed of a photoresist or other protective mask layer.

Dry etching involves selectively exposing a substrate e.g. plate/film (e.g. using a similar photoresist mask) to a bombardment of energetic particles to dislodge parts of the substrate e.g. plate/film that are exposed to the particles (sometimes referred to as "sputtering"). An example is ion beam etching in which parts are exposed to a beam of ions. Those exposed parts may be dislodged as a result of the ions chemically reacting with those parts to dislodge them (sometimes referred to as "chemical sputtering") and/or physically dislodging those parts due to their kinetic energy (sometimes referred to as "physical sputtering").

In contrast to etching, deposition—such as ion-beam deposition or immersion-based deposition—involves applying material to rather than removing material from a substrate e.g. plate/film. As used herein, the term "patterning a substrate's surface" or similar encompasses all such etching of/deposition on a plate or film, and such etching of/deposition on a plate or film is said to impose structure on the substrate's surface.

Conventional techniques for making an optical component involve, for instance, first coating a to-be patterned region of a master plate's surface (desired surface region) in a chromium layer or other protective mask layer (e.g. another metallic layer). The master plate and film constitute a substrate. The mask layer is covered in a positive photoresist. Positive photoresist means photoresist which becomes developable when exposed to light i.e. photoresist which has a composition such that those parts which have been exposed to light (and only those parts) are soluble in a developing fluid used to develop the photoresist following exposure. Light which forms a desired grating pattern (grating structure)—created, for instance, using two-beam laser interference to generate light which forms a grating structure in the form of an interference pattern—is then projected onto the photoresist so that only the photoresist at the locations of the light bands is exposed. The photoresist is then developed to remove the exposed parts, leaving selective parts of the mask layer visible (i.e. revealing only selective parts) and the remaining parts covered by the unexposed photoresist at the locations of the dark fringes. The uncovered parts of the mask layer are then removed using conventional etching techniques e.g. an initial wet etching or ion beam etching process which removes the uncovered parts of the mask but not the parts covered by the photoresist, and which does not substantially affect the plate itself. Etching of the plate itself—such as further wet etching or further ion beam etching—is then performed, to transfer the pattern from the etched mask layer to the substrate itself.

Figure 17A:
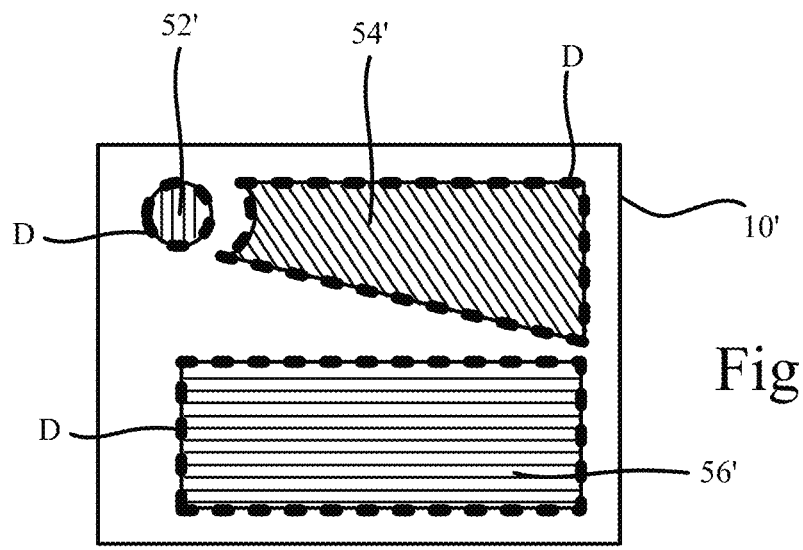
FIG. 17A shows an exemplary optical component having certain characteristics which may impact on image quality.

FIG. 17A shows another optical component 10' which is similar in some respects to the optical component 10 of FIGS. 3A and 3B, but with some important differences that will now be discussed. As illustrated, the other optical component 10' has SRGs 52' (incoupling), 54' (fold), 56' (exit) similar to those of the optical component 10, with large gaps (>>100 μm) between them, including between the incoupling and fold SRGs 52', 54'. Because of this large spacing, in manufacturing the other optical component 10', the laser interference exposure could be done, using a positive photoresist technique along the lines of that outlined above, simply by applying shadow masks of different shapes in front of a master plate (substrate) during laser interference exposure.

Figure 17B:
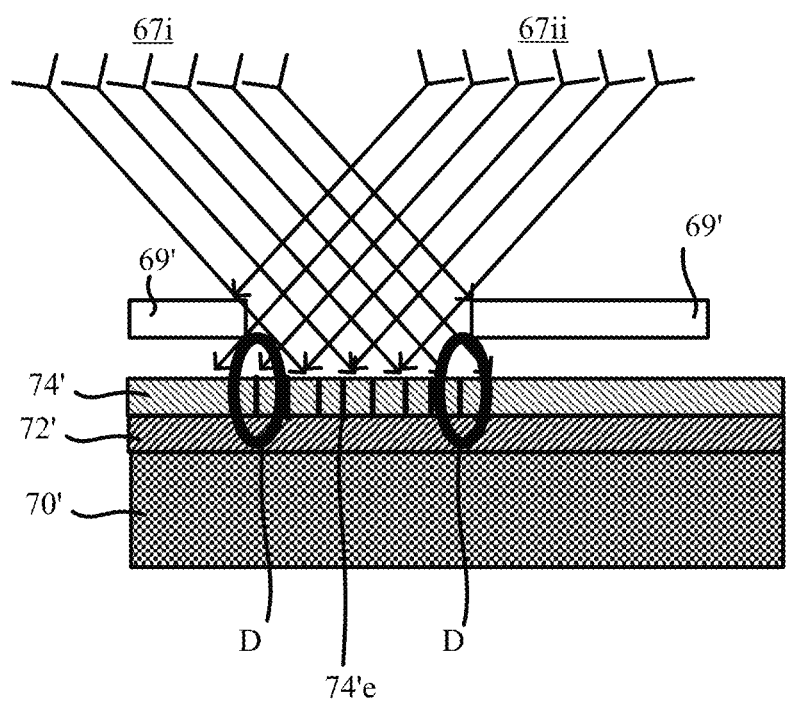
FIG. 17B shows an exposure set-up which could be used in making the optical component of FIG. 17A.

This is illustrated in FIG. 17B, which shows a master plate 70' from the side during a two-beam laser interference exposure process. The plate 70' is coated in a chromium layer 72', which is itself coated in photoresist 74', which is positive photoresist. The plate 70' and film 72' constitute a substrate. An interference pattern is created by the interference of two laser beams 67*i*, 67*ii*. A shadow mask 69' is used to prevent the pattern from falling outside of a desired portion (e.g. that spanned by incoupling SRG 52') of the substrate's surface so that the only photoresist which is exposed is the parts covering the desired portion on which light bands of the interference pattern fall (exposed photoresist is shown in black and labelled 74'*e* in FIG. 17B). This can then be repeated for any other portions to be patterned (e.g. for those spanned by 54' and 56'). The positive photoresist can then be developed to remove the exposed parts 74'*e*, and the substrate patterned in the manner outlined above.

The shadow mask, however, causes distortion near the edges of the DOE areas. The distortion is due to light scattering, non-perfect contact of shadow mask and the finite thickness of the shadow mask (which effectively blurs the pattern near its edge). Herein, non-uniformity of a grating structure exhibited near its edges (of the type caused by such shadowing during fabrication, or similar) is referred to as "edge distortion". Edge distortion is indicated by the label D in FIG. 17B.

When the photoresist is developed, the edge distortion becomes embodied in the developed photoresist along with the grating structure, and as a result is transferred to the surface of the plate 70' when it comes to etching. As a result, the final optical component 10' (which either comprises or is manufactured from the patterned plate) also exhibits corresponding edge distortion as indicated by the dotted lines labelled D around the edges of the various DOE areas in FIG. 17A.

Moreover, as well as creating edge distortion, it is difficult to position the shadow mask 69' accurately when exposing the substrate in this manner, and therefore it would be difficult to reduce the size of the gaps between the SRGs 52', 54' without risking overlap between the SRGs 52', 54'.

Returning to FIG. 3B, in contrast to the other optical component 10' of FIG. 17A, the incoupling and fold zones 12, 14 of the optical component 10 are substantially contiguous in that they are separated by at most a narrow border zone 18 which has a width W as measured along (that is, perpendicular to) a common border 19 that divides the border zone 18. That is, the incoupling and fold zones are separated by a small distance W in width along a common border 18. Moreover, the incoupling, fold and exit SRGs 52, 54, 56 of the optical component 10 are free from edge distortion of the kind described above. It has been observed that this configuration produces superior image quality to that of the other optical component 10'.

Figure 18:
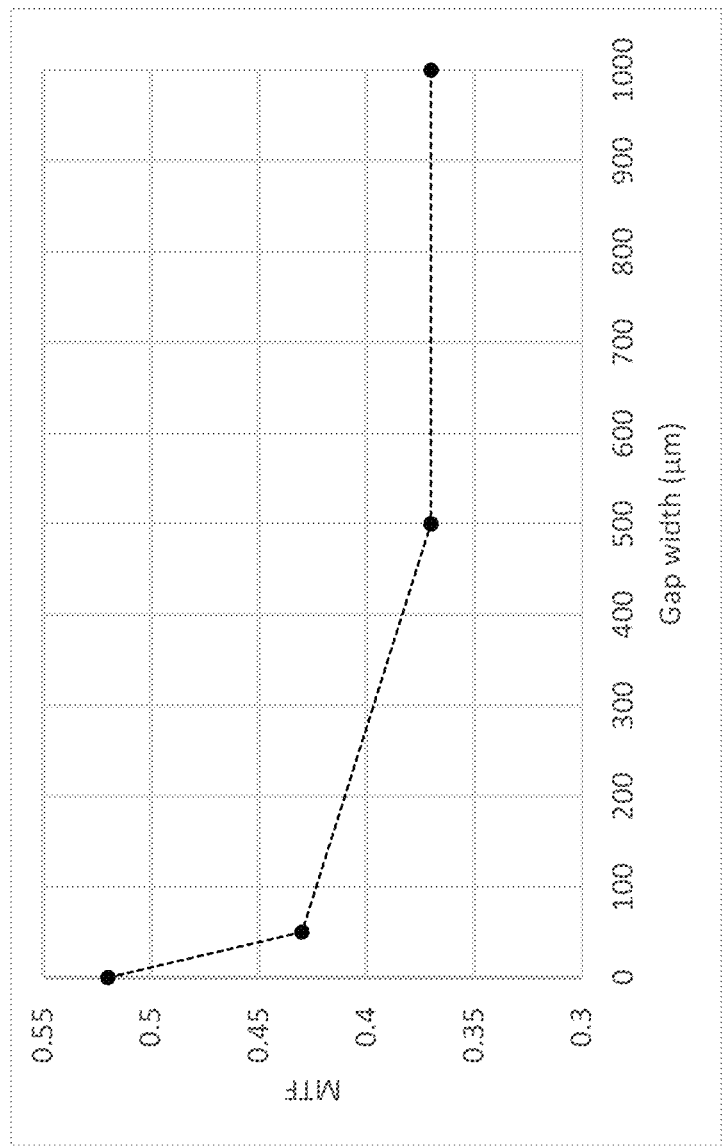
FIG. 18 shows a graph of MTF as function of gap width for an exemplary waveguide.

In particular, it has been observed that, when the separation W of the incoupling and fold regions 12, 14 along the common border 19 (the gap) is reduced to $W \leq W_{max}$ along the length of the common border 19 (that is, provided the incoupling and fold zones are separated by no more than $W_{max}$ in width along the length of the common border 19)—where $W_{max} \approx 50$ μm (micrometres)—an improvement in image quality can be obtained. In practice, the size of gap at which the improvement is observed may have some dependence on the thickness of the waveguide. For example, for a waveguide having a thickness (extent in the z direction, as it is shown in the figures) of approximately 0.6 mm or less, a dramatic improvement in image quality is observed when $W_{max}$ is approximately 50 μm or less. This particular case is illustrated in FIG. 10, which shows curve of MTF (modular transfer function) drop as function of gap width in one case included for FIG. 18. The increase in MTF as the gap is reduced from 50 μm is immediately evident in FIG. 18. As is well known to persons skilled in the art, the modular transfer function (MTF) is a measure of the ability of an optical system to transfer various levels of detail from object to image. An MTF of 1.0 (or 100%) represents perfect contrast preservation, whereas values less than this mean that more and more contrast is being lost—until an MTF of 0 (or 0%), where line pairs (a line pair is a sequence of one black line and one white line) can no longer be distinguished at all. For a thicker waveguide—e.g. of thickness approximately 1 mm, an improvement is still expected for a gap size of up to 100 μm.

The common border 19 of FIG. 3B is arcuate (substantially semi-circular in this example), with the incoupling and fold regions 12, 14 having edges which are arcuate (in this case, substantially semi-circular) along the common border 19. The edge of incoupling region 12 is substantially circular overall.

The disclosure recognizes that conventional microfabrication techniques are ill suited to making the optical component 10 of FIG. 3B. In particular, existing techniques are ill-suited to making optical components exhibiting the requisite incoupling-fold zone separation $W \leq W_{max}$ and which are free of edge distortion whilst still accurately maintaining the desired angular orientation relationship between the various SRGs 52, 54, and 56 described above with reference to FIG. 9B.

A microfabrication process for making an optical component will now be described with reference to FIG. 16. The process of FIG. 16 can be used to.

Figure 16:
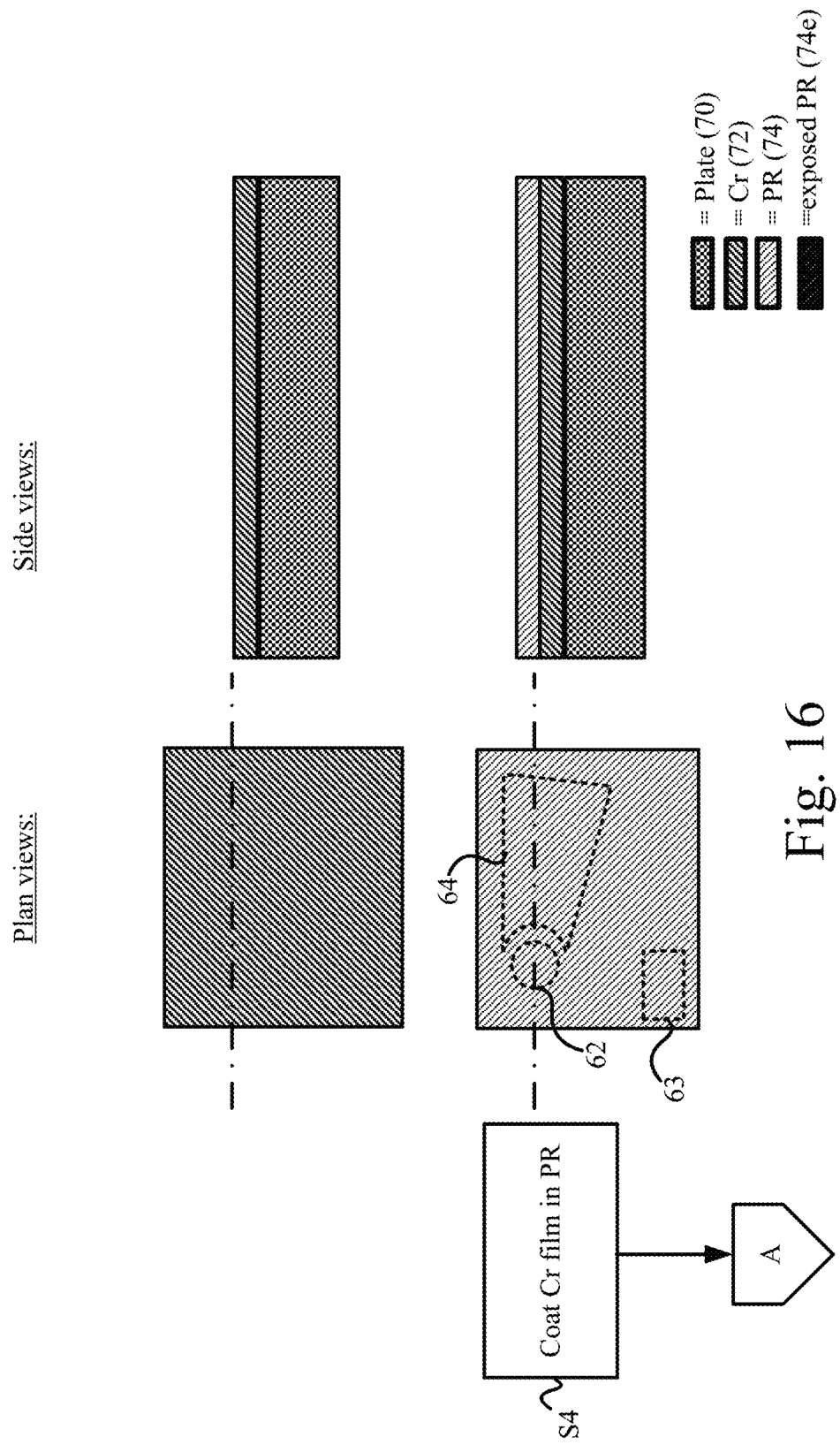
FIG. 16 shows a flow chart for a microfabrication process for manufacturing optical components or masters.
Figure 16:
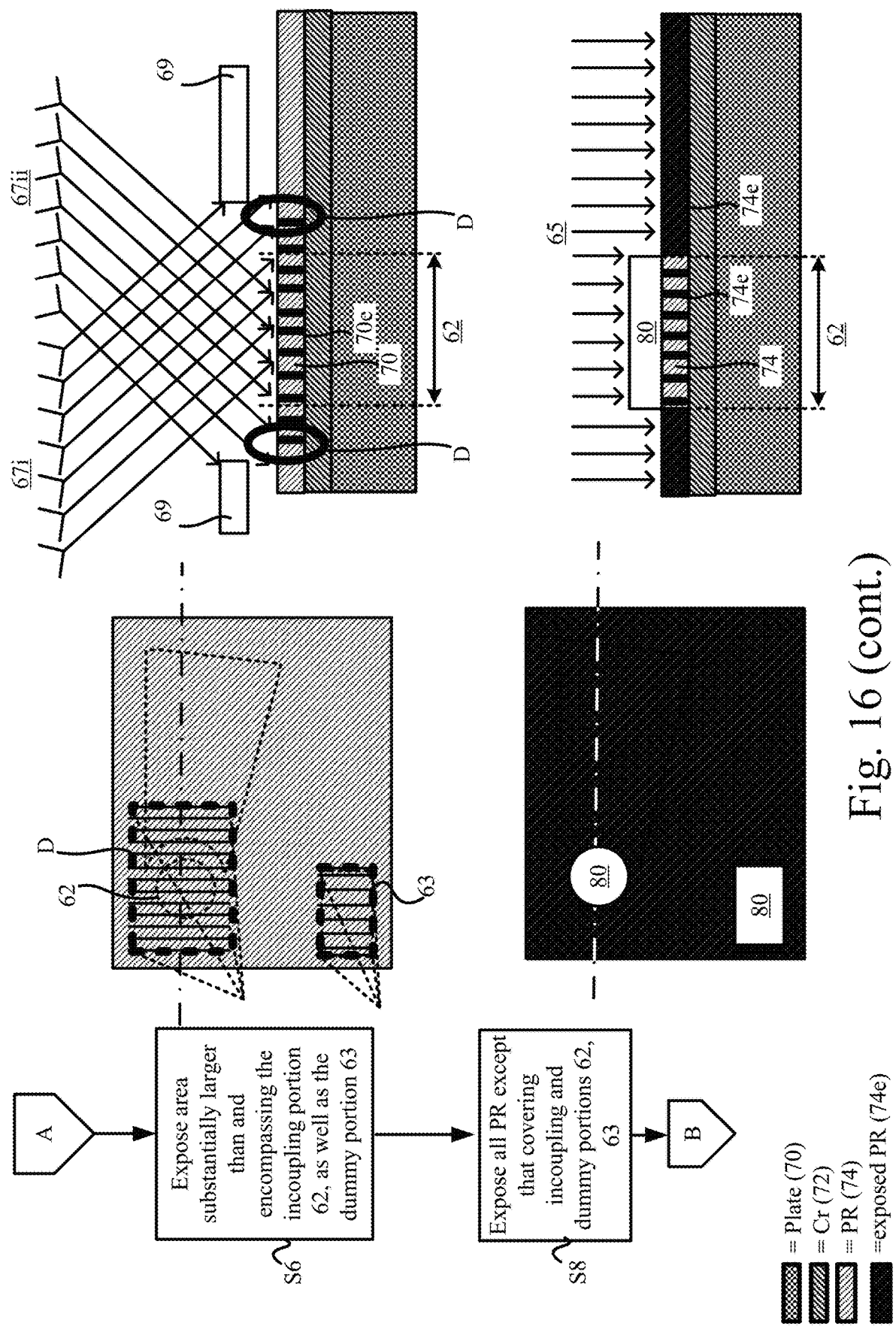
Figure 16:
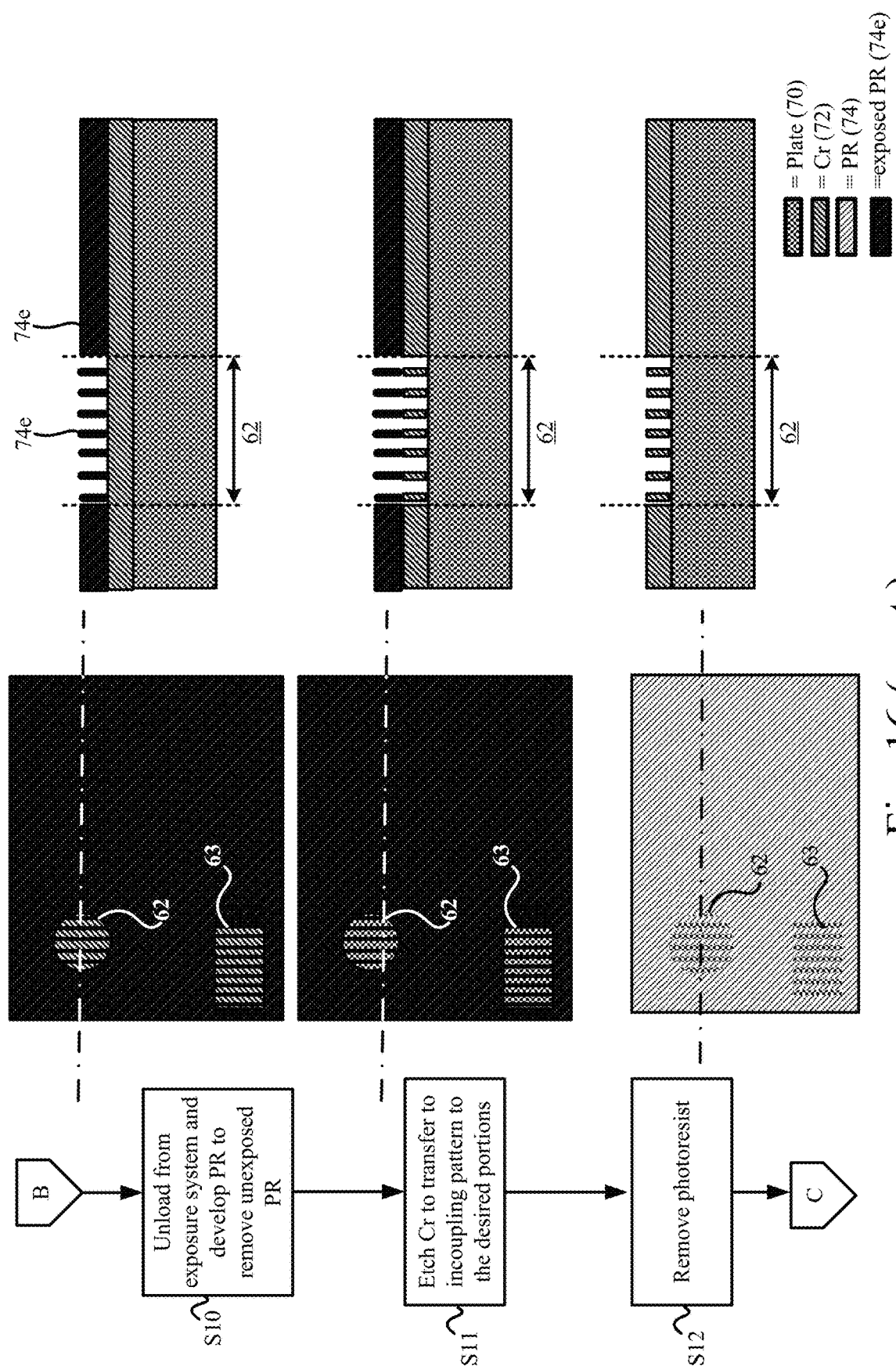
Figure 16:
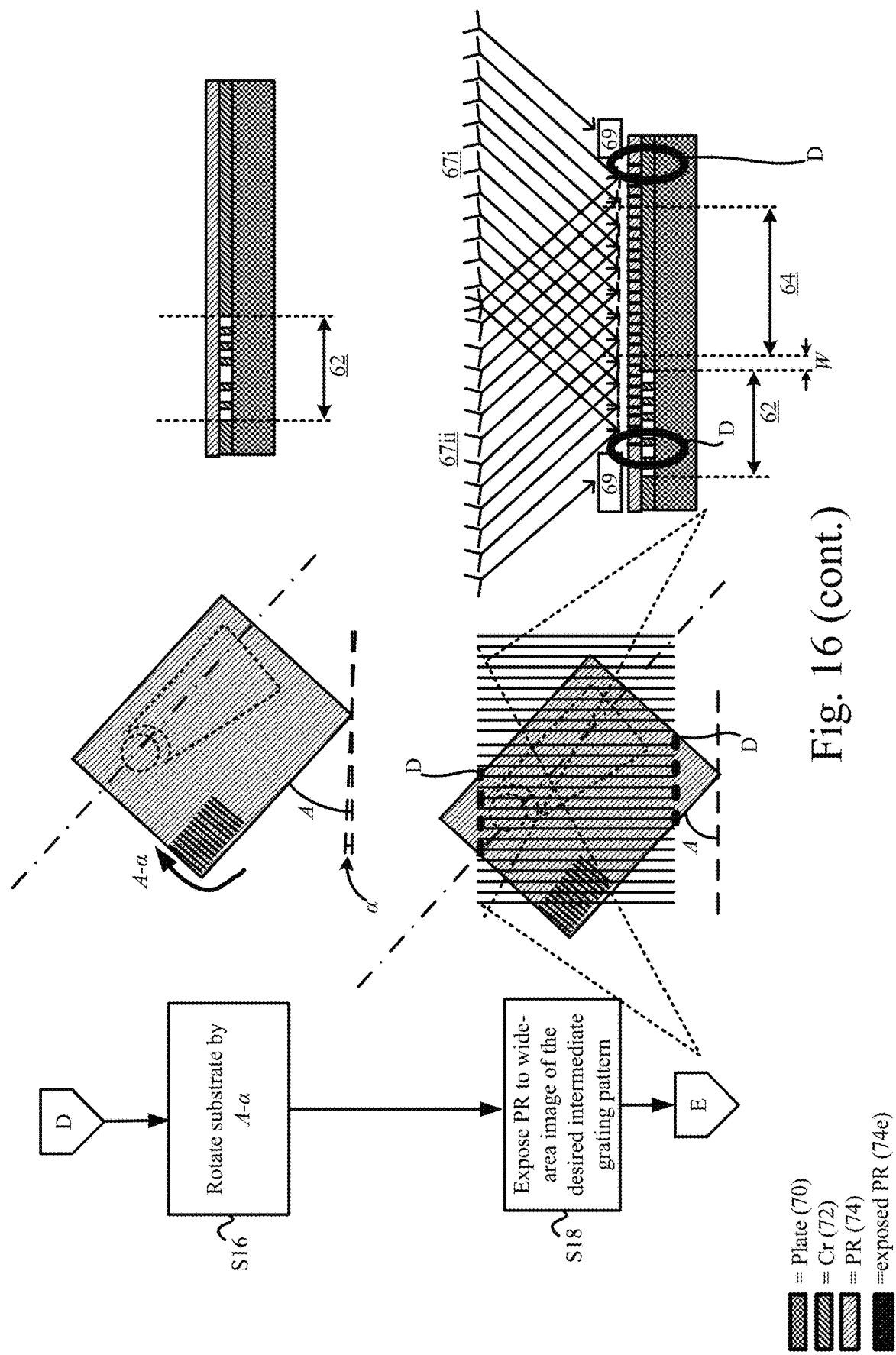
Figure 16:
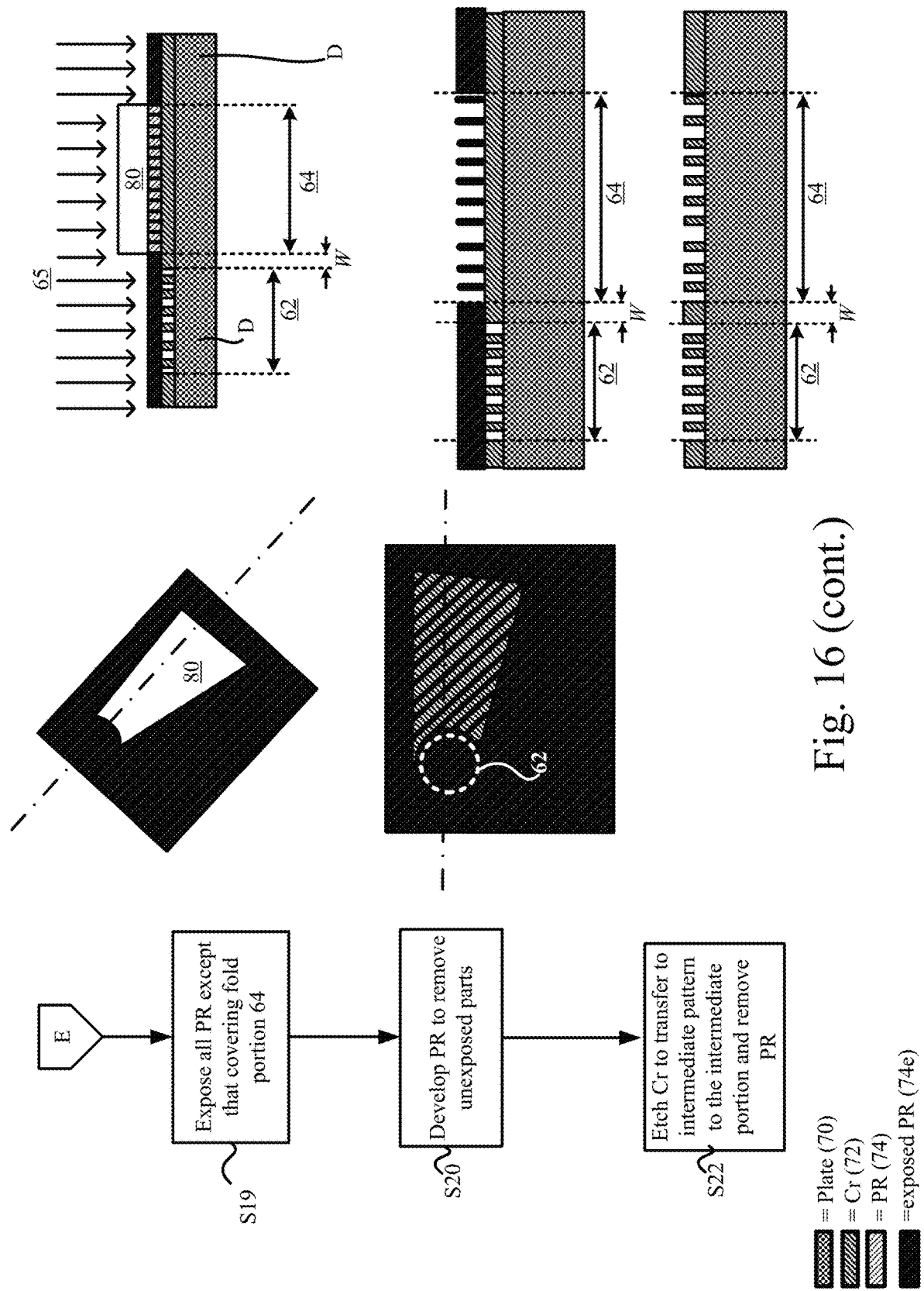

As will become apparent in view of the following, the process of FIG. 16 can be used to make optical components of the type shown in FIG. 3B with the requisite small spacing between incoupling and fold zones, which are free from edge distortion, and which moreover exhibit the desired angular orientation to a high level of accuracy.

That is, this disclosure provides a novel interference lithographic method, which enables grating to be manufactured on the surface of an optical component that are spaced apart from one another by 100 micrometers or less. This is not typically achievable with traditional interference lithographic methods.

FIG. 16 shows on the left-hand side a flow chart for the process and on the right-hand side, for each step of the process, plan and/or side views of an exemplary master plate 70 as appropriate to illustrate the manner in which the plate 70 is manipulated at that step. Each side view is a cross-section taken along the dash-dotted line shown in the corresponding plan view.

An upper part of the plate's surface is coated with a chromium film 72. The plate 70 and film 72 constitute a substrate, a desired surface region of which (specifically, the surface region defined by the chromium layer 72 in this example), in performing the process, is selectively etched to create incoupling and fold SRGs 52, 54. The incoupling SRG 52 is fabricated on a first portion 62 of the desired surface region (incoupling portion), and the fold SRG 54 on a second distinct (i.e. non-overlapping) and substantially contiguous portion 64 of the desired surface region (fold portion) having the reduced separation $W \leq W_{max}$ along the (intended) common border 19. For the optical component 10 shown in FIGS. 3A and 3B, the desired region corresponds to the rear of the component's surface from the perspective of the wearer.

The final etched substrate constitutes an optical component which may be incorporated in a display system (e.g. the display system 2 of FIG. 1), or which may be for use as a production master for manufacturing further optical components e.g. a mould for moulding such components from polymer (or indeed which may be used for making such moulds), in which case the SRGs 52, 54 as fabricated on the substrate's surface are transferred to (the rear of) those components by the manufacturing e.g. moulding process.

At step S4 of FIG. 16, the chromium layer 72 is coated in a negative photoresist film 74—that is, photoresist which becomes undevelopable when exposed to light i.e. photoresist which has a composition such that those parts which have been exposed to light (and only those parts) become substantially insoluble in a developing fluid used to develop the photoresist once exposed so that the exposed parts (and only the parts) remain post-development. This includes coating the incoupling portion 62 which is ultimately intended to be patterned with the incoupling SRG 52, as well as the fold portion 64 ultimately intended to be patterned with the fold SRG 54.

At step S6, an area substantially larger than and encompassing the incoupling portion 62 is exposed (shown in this example as a rectangle containing the desired circular area 62) to light which forms the desired incoupling grating structure (i.e. that of SRG 52). By directing two laser beams 67i, 67ii to coincide in an interference arrangement, an interference pattern which forms the desired incoupling grating structure, having a grating period d when incident on the photoresist 74, is created. The interference pattern comprises alternating light and dark bands, whereby only the parts of the photoresist on which the light bands fall are exposed (exposed photoresist is shown in black and labelled 70e in FIG. 16); however, in contrast to positive photoresist, it is these exposed parts 70e which become undevelopable whereas the non-exposed parts in the locations of the dark bands remain developable.

A shadow mask 69 is used to restrict the interference pattern to the larger area. The larger area is large enough not only to encompass the incoupling surface portion 62 but also such that all the edge distortion D created by the shadow mask lies outside of the incoupling portion 62 (in general, it is sufficient for the wider area to be such there is substantially no edge distortion in the vicinity of the intended common border 19, even if there is some edge distortion present elsewhere around the edge of the incoupling portion 62).

A dummy grating portion 63 is also exposed to the same (or a similar) interference pattern at the same time for reasons that will be discussed in due course.

The exposed portions 62, 63 can be practically of any shape or size but the excess exposure resulting from possible other exposures must not reach any "active part" of the desired exposure portions (i.e. in the illustration aside S6, other exposures must not overlap the circular incoupling portion 62).

As an alternative to using masks, the interference pattern could be projected over the whole of the desired surface region so that no shadowing effects are present on the desired surface region at all.

During the exposure step S6, the plate 70 is supported by a mechanical clamping or other fixing method in an laser interference exposure setup (exposure system) not shown in FIG. 16 to hold it steady relative to the exposure system (in particular, relative to the beams 67i, 67ii) whilst the exposure takes place. After step S6, the master plate 70 is unloaded from the laser interference exposure setup.

At step S8, the unloaded plate 70 is exposed to light 65 of substantially uniform intensity, but with photo mask 80 in place to expose photoresist and thus avoid photoresist development from areas outside the incoupling and dummy grating areas 62, 63. That is, photo mask 80 on the incoupling portion 62 and the dummy region 63 are used to prevent exposure of the portions 62, 63 to the uniform light 65. Thus, uniform light 65 is projected over the entirety of the desired surface region but for the incoupling and dummy portions (as these are covered by the photo mask 80) so that all of the photoresist other than that covering the incoupling and dummy portions 62, 63 becomes undevelopable throughout. It is thus the photo mask which define the portions 62, 63 (i.e. the portions 62, 63 have the same size and shape as the corresponding photomask 80 used to protect those portions), and not the shadow masks used in S6. A mask aligner is used to position the photo mask 80 accurately on correct position on the substrate. The mask aligner has components (e.g. ultraviolet-lamp, optics etc.) for generating uniform light for exposure and the mechanics for positioning the photomask 80 to the correct position.

As will be apparent, the only photoresist to retain any record of the grating structure(s) as projected at S6 is that which covers the incoupling and dummy portions—outside of those portions, all record of the grating structure(s) is intentionally destroyed. The entirely exposed photoresist outside of the incoupling and dummy portions 62, 63 includes all the parts of the photoresist that were subjected to the edge distortion D, thus completely removing any record of the edge distortion from the photoresist. Due to the nature of the process, there is virtually no distortion to the grating pattern.

At step S10, the photoresist is developed to embody the incoupling SRG grating structure by removing only those parts of that photoresist that have not been exposed to light using a developing fluid. All the exposed, undevelopable photoresist 74e is left substantially unchanged by the development of step S10. As illustrated in the figures to the right of S10 in FIG. 16, substantially no photoresist outside of the portions 62, 63 is removed in step S10; the only removed photoresist is lines of unexposed photoresist in the incoupling and dummy portions 62, 63 corresponding to the locations of the dark bands of the interference pattern as projected on the photoresist at S6.

At step S11, a chromium etching procedure is performed to etch the chromium layer 72 (but not the plate 70 itself) with the incoupling SRG pattern, such as dry etching of the chrome hard mask 72. In etching step S11, the photoresist serves as an etching mask to restrict etching of the chromium layer 72 to the incoupling and dummy grating surface portions only, whereby structure is imposed from the photoresist to the incoupling and dummy portions 62, 63. However, the exposed, undeveloped photoresist 74e outside of the portions 62, 63 inhibits etching outside of those portions 62, 63 so that no structure is imposed on the chromium 72 outside of those portions 9 (i.e. outside of those portions, the chromium is substantially unchanged).

Once the chromium 72 has been etched thus, the exposed photoresist 74e is removed (S12) and the chromium 72 recoated with fresh, unexposed negative photoresist 74 (S13).

As indicated above, the relative orientation angle between incoupling and fold SRGs is intended to be A as defined in equation (11) above and shown in FIG. 9B (with the incoupling and exit SRGs having a relative orientation angle 2A, as per equation (12)). This can be achieved by reloading the plate 70 in the same exposure system (previously used at S6) supported again by the same mechanical clamps or other fixing method, and rotating the plate 70 by an amount that matches A relative to the exposure system so that any subsequently projected pattern is oriented to the original incoupling SRG pattern by A (S14). By using a suitable drive mechanism, it is possible to achieve highly accurate rotation of the plate 70.

However, due to inaccuracy of mechanical stoppers, the position of the plate 70 is not accurately the same as in step S6. This is illustrated in the plan view aside step S14 of FIG. 16, in which an angle α is shown to denote slight rotation relative to the plate's initial orientation at the previous exposure step S6 caused by unloading/reloading of the plate 70.

For this reason, prior to rotating the plate 70 at S14, the offset α between the plate position in S6 and S14 is first measured. The measurement is done using a moiré pattern 81. The moiré pattern 81 changes when the plate is rotated and this can be used to measure the angle of the plate with better than 0.001 degrees resolution.

To create the moiré pattern 81, the dummy grating portion is re-exposed to the same interference pattern it was exposed to at step S6 (or at least an interference pattern having the same angular orientation), as shown on the right-hand side of FIG. 16. The moiré pattern is evident notwithstanding the presence of the photoresist atop the dummy grating. The moiré pattern is created as a result of the interaction between the interference pattern and the dummy grating, and when the angular alignment is better than e.g. 0.01 degrees, has a fringe spacing—typically of the order of few mm—and thus clearly visible when the offset α is about 5 thousandths of a degree, and which increases as α is reduced towards zero, becoming maximal (effectively infinite) upon a reaching zero. The fringe spacing is determined by the offset α and, conversely, can be used to measure α.

This leaves the photoresist atop the dummy grating partially exposed; as will become apparent, this is inconsequential. Notably, the dummy grating portion 63 is sufficiently offset from the fold grating portion 64 for the photoresist atop the fold grating portion to remain unexposed in creating the moiré pattern 81.

Once α has been measured, at step S16 the plate 70 is rotated from that initial orientation by an amount=A−α (thereby accounting for α in the rotation) so that the plate 70 now has an orientation A relative to its initial position at S6 to a high level of accuracy.

At step S18, an area substantially larger than and encompassing the fold portion 64 is exposed (shown in this example as a rectangle containing the desired area 64) again by directing two laser beams 67i, 67ii to coincide in an interference arrangement, leaving the parts of the photoresist on which light bands fall undevelopable in a manner equivalent to S6 (but without any additional dummy grating area being exposed). In S18, the interference pattern has a period $d/(2 \cos A)$ when incident on the photoresist. A shadow mask 69 is again used to restrict the interference pattern to this area, which is large enough not only to encompass the fold surface portion 64 but also such that all the edge distortion D created by the shadow mask lies outside of the incoupling portion 62 (or at least clear of the common border 16).

Some or all of the photoresist atop the incoupling grating will likely be exposed at S18, which is inconsequential as it has no effect on the incoupling pattern which has already been etched into the underlying chromium 72.

All other areas except fold portion 64 are then exposed (S19) to uniform light 65 with a suitable photo mask 80 in place to prevent exposure of the fold portion 64 (and only that portion) in a manner equivalent to step S8. This leaves all the photoresist covering the incoupling portion 62 (and also that covering an exit portion ultimately intended to be etched to form the exit grating 56) exposed and therefore undevelopable. The photoresist is then developed to remove only the unexposed parts (S20) in a manner equivalent to step S10, the chromium one again etched to transfer the fold SRG pattern from the photoresist to the chromium, and the photoresist removed following etching (equivalent to S11-S12). The incoupling portion is protected by the exposed and therefore undeveloped photoresist 70e, thereby preserving the incoupling grating pattern already etched into the chromium.

The use of photo mask 80 to define the incoupling and fold portions enables the location of the DOE areas to be controlled far more accurately then when simply using shadow masks to define those areas (as in the positive photoresist technique outlined above). It thus becomes possible to reduce the separation of those portions to $W \le W_{max}$ whilst still retaining separation of those portions (i.e. without the etched patterns overlapping).

Although not shown explicitly in FIG. 16, it will be apparent that the chromium covering the grating area ultimately intended for the exit SRG 56 (vertically below the incoupling and fold SRGs 52, 54) is unaffected by the etching of both S11 and S22 as in both of those steps it is protected by undeveloped photoresist.

A similar process could be repeated to etch the desired fold grating structure into the chromium, again using a moiré pattern to achieve a highly accurate angular orientation of 2A between the incoupling and exit grating structures. The exit grating in the present configuration is relatively far away from the input grating. Thus input grating and exit grating can be exposed to the same photoresist layer with large enough shadow masks to avoid edge distortions.

Once all three structures have been etched into the chromium, the plate 70 itself is subject to an etching procedure (e.g. ion-beam etching) in which the chromium now serves as an etching mask, whereby the grating structures are transferred from the etched chromium 72 to the plate 70 itself to form the desired incoupling, exit and fold SRGs 52, 54, 56 on the plate itself with very good angular accuracy, narrow gap $W \le W_{max}$ between SRGs 52, 54, and good quality edges free form edge distortion.

Note that the dummy grating pattern is not etched onto the plate itself as it is not desired on the final optical component.

Once the plate itself has been etched, the chromium is removed and the plate 70, can e.g. be used in a display system of the kind shown in FIG. 1, to mould further optical components, or indeed to make such moulds.

It has been demonstrated that, using the process of FIG. 16, substrates can be patterned, free from edge distortion, with the actual relative orientation angle between the incoupling and fold zones 14, 16 consistently being arccos($d_1$/($2d_2$)) (see equations 11, 12 above) and/or one half of the relative orientation angle between the incoupling and exit SRGs 12, 16 (see equation 13, above) to within ±one thousandth of a degree (as measured from a representative statistical population of substrates fabricated using the present techniques). However two thousandths of a degree may be still acceptable angular error in some practical contexts. It should be noted that the subject matter is not limited to the particular exit pupil expansion configuration or grating structures but applies to other configurations as well. Moreover, whilst the above is described with reference to diffraction gratings in the form of SRGs, the subject matter is not limited to diffraction gratings and encompasses any structures which cause different phase changes.

In embodiments of the various aspects set out in the Summary section, the structure of the first portion may constitute a first diffraction grating. The structure of the second portion may also a second diffraction grating.

The first grating may have a depth different from the second grating.

The first grating may have a depth which is substantially constant over the entire first portion up to the edge of the first grating. The first grating may have a depth which is substantially constant over the entire first portion up to the edge of the first grating, and the second grating has a depth which is substantially constant over the entire second portion up to the edge of the second grating.

The structure of the first portion may constitute a first diffraction grating and the structure of the second portion may be substantially non-diffractive. The first grating may have a depth which is substantially constant over the entire first portion up to the edge of the first grating.

The first and second portions may be substantially contiguous.

The first and second portions may be separated by no more than 100 micrometres in width along a common border, and optionally no more than 50 micrometres in width along the common border.

A third portion of the same surface may have a structure which causes light to change phase upon reflection from the third portion by a third amount different from the first amount, wherein the first and third portions are adjacent the second portion so that the second portion separates the first and third portions, and wherein the third portion is offset from the second portion by a distance which substantially matches the difference between the second amount and the third amount.

The structure of the first portion may constitute a first diffraction grating, the structure of the third portion may constitute a second diffraction grating, and the structure of the second portion may be substantially non-diffractive.

The structure of the first portion may constitute an incoupling grating via which said light is coupled into the waveguide from the display of the display system. The structure of the second portion may constitute an exit grating via which said light exits the waveguide onto the eye of the user. The structure of the second portion may constitute an intermediate grating configured to manipulate the spatial distribution of the light within the waveguide.

Having considered a flow chart for a microfabrication process for manufacturing optical components or masters, consider now a discussion of example production masters, example working stamps, and example replicas in accordance with one or more aspects of the disclosure.

Figure 19:
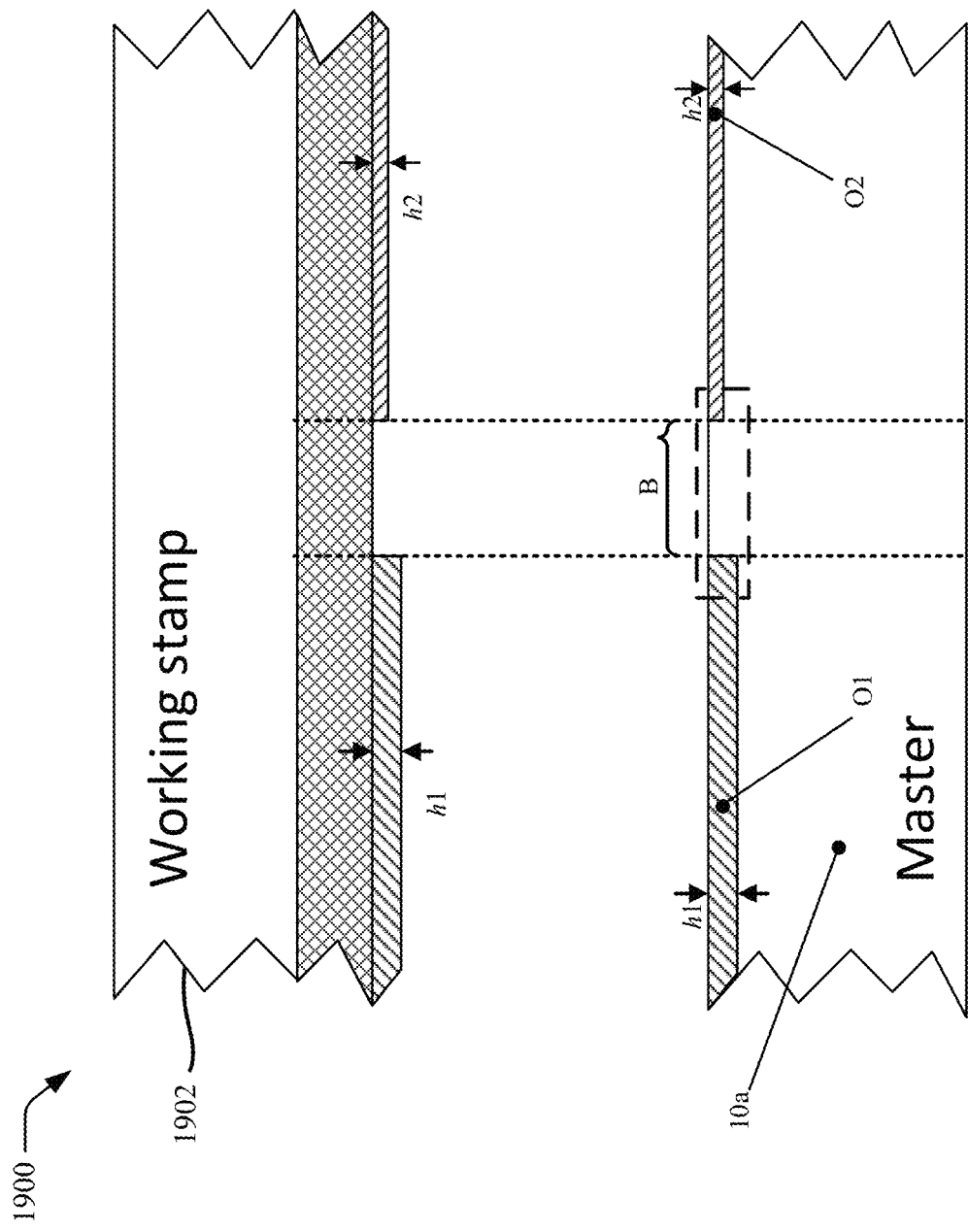
FIG. 19 shows an environment with a production master and a working stamp.

FIG. 19 is an illustration of an environment with a production master and a working stamp 1900 in an example implementation that is operable to employ techniques described herein. Environment 1900 includes production master 10a, as previously described with respect to FIG. 10a. For instance, production master 10a has diffractive optical elements O1, O2 (which are diffraction gratings) produced on the top of the master's surface. The first grating O1 has a depth h1 and the second grating O2 has a depth h2. Each optical element is formed of a series of grooves in the surface of the waveguide 10a of depth h1, h2≠h1 respectively as measured normal to the waveguide. The depths h1, h2 are constant across the whole of the gratings O1, O2 in this example.

The first and second elements O1, O2 are used, for example, to couple light emitted by an image source into and out of the waveguide, and/or for manipulation of its spatial distribution within the waveguide. While being necessary for the operation of the display system, the optical elements O1, O2 can also cause unwanted distortions on the wave front of the light as it travels through the waveguide. In particular, phase and amplitude distortions may be created, such as when a wavefront meets the edges of the optical elements O1, O2. The optical elements O1 and O2 are separated by a blank surface region B, which is substantially non-diffractive (i.e. which interacts with light substantially in accordance with Snell's law and the law of reflection).

Environment 1900 also includes working stamp 1902. Using production master 10a, working stamp 1902 can be produced. For instance, light curable polymer can be dispensed on the master and when the working stamp substrate is brought to proximity of the master, the polymer is spreading and filling the grating areas on the master. After curing of the polymer, the working stamp is de-molded from the master resulting in working stamp 1902. However, due to variations in the amount of material in the grating areas compared to blank areas, the diffractive optical elements vary in height from the flat surface of the quartz plate. An example is the difference in heights h1 and h2 above the flat surface of the quartz plate comprising working stamp 1902. This variation in height leads to variations in an amount of polymer required for each of the diffractive optical elements on a waveguide optical component. Variances in thickness of the polymer over different diffractive optical elements causes unwanted optical distortions including phase jumps when light interacts with different optical elements in the waveguide optical component.

Figure 20:
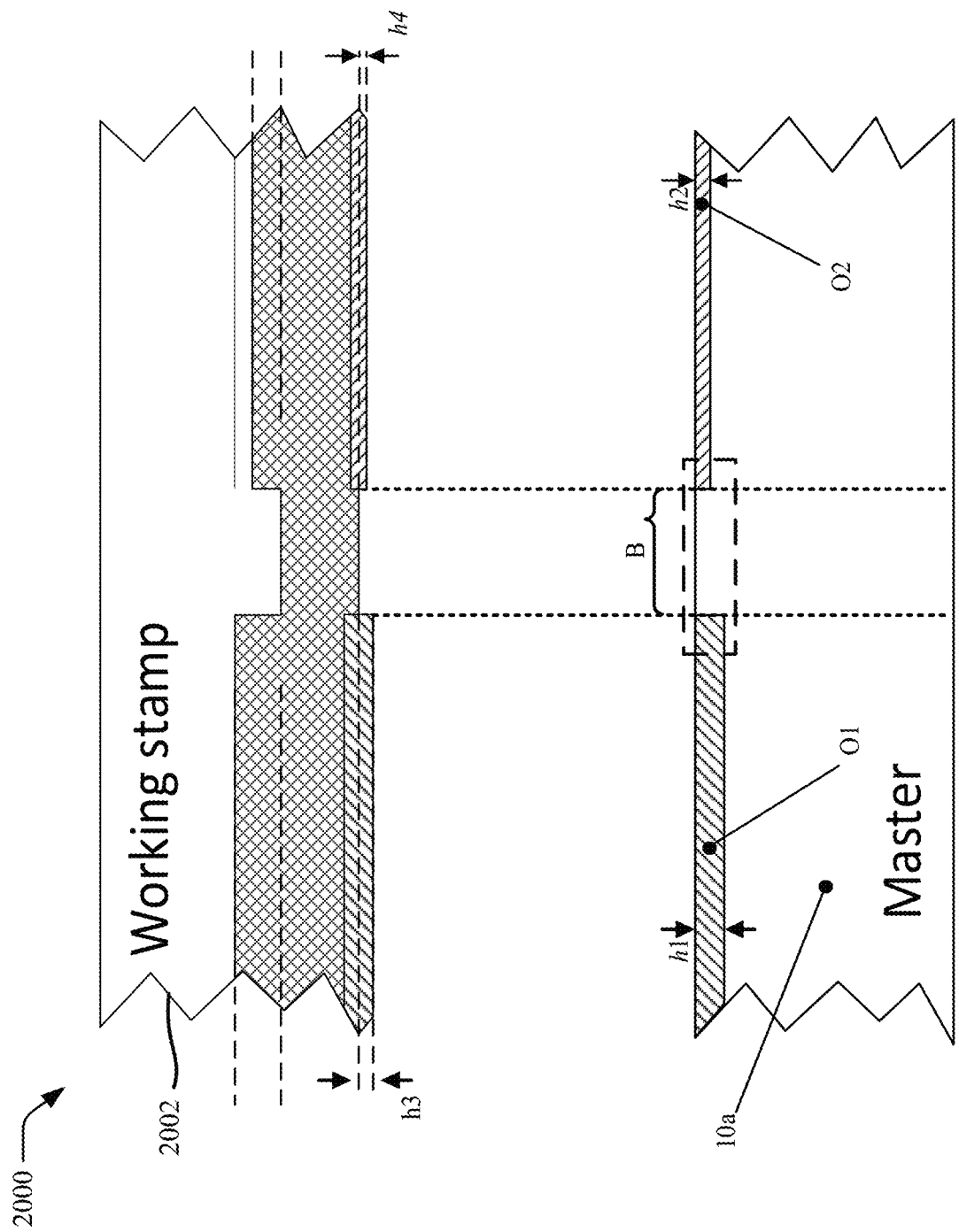
FIG. 20 shows another environment with a production master and a working stamp in accordance with one or more aspects of the disclosure.

FIG. 20 is an illustration of an environment with a production master and a working stamp 2000 in an example implementation that is operable to employ techniques described herein. The height offset of diffractive optical elements imprinted on the surface of the waveguide is adjusted by modifying working stamp 2002 back bone prior to completing the manufacturing of working stamp 2002. In particular, the effect of the grating edge on the wavefront is removed by adjusting the height offset of the grating areas relative to the blank surface next to it.

Working stamp 2002 substrate has been modified, compared to working stamp 1902 substrate in FIG. 19. The surface of working stamp 2002 substrate has been changed based on an identified distance (e.g., height above a planar surface) for each respective optical element. For example, if the identified height for an optical element is above or below a threshold height for each respective optical element, the surface of working stamp 2002 may be modified. For instance, material can be added or removed material to the working stamp at the identified areas. Hence, working stamp 2002 has a structure corresponding to optical element O1 of production master 10a that is a thickness of h1, but only a height of h3 (h3<h1) above the plane of working stamp 2002 at region B, which has not been modified. Similarly, working stamp 2002 also has a structure corresponding to optical element O2 of production master 10a that is a thickness of h2, but only a height of h4 (h4<h2) above the plane of working stamp 2002 at region B.

Knowledge of the shrinkage of the polymer that is used for creating the working stamp can be utilized for adjusting height offset of the diffractive optical elements. Most polymers, which can be utilized, shrink around 5-10% during curing. The height offset adjustment is achieved by removing material from the desired areas of the working stamp back bone, e.g. by wet chemical etching. During the manufacturing of the working stamp, the thickness of the resin is higher on the areas where material has been removed. Due to resin shrinkage during curing, tensile stress is built on the areas with higher thickness. De-molding the master from the working stamp results in relaxation of the tensile stress and thus the etched areas with tensile stress are offset 5-10% compared to the etch depth.

Figure 21:
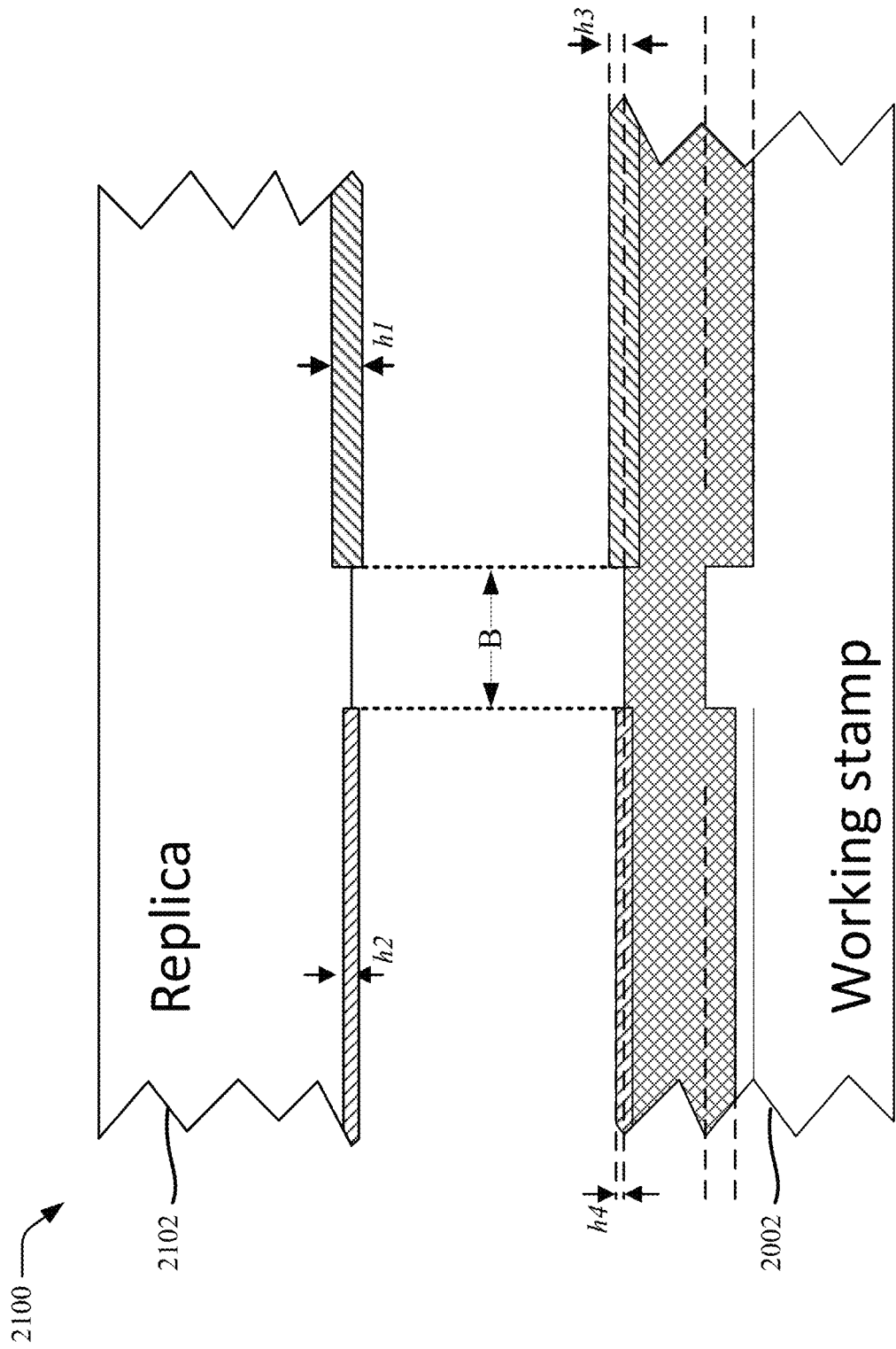
FIG. 21 shows an environment with a working stamp and a replica in accordance with one or more aspects of the disclosure.

FIG. 21 is an illustration of an environment 2100 with a working stamp and a waveguide component in an example implementation that is operable to employ techniques described herein. Environment 2100 includes working stamp 2002 that has been modified, such as illustrated in FIG. 20, used to create waveguide component 2102. For example, waveguide component 2102 can be an optical component in a waveguide display system. Structures in waveguide component 2102 corresponding to optical elements in the waveguide at desired height above a plane of replica 2102 at region B. Because the bias level of the gratings is at optimal height, unwanted optical distortions, including wavefront distortions, elements is reduced.

FIGS. 20 and 21 illustrate methods to create replicas by modifying a working stamp created from a production master. Additionally or alternatively, modifications could be made to a production master. For example, some modifications could be split between the production master and the working stamp, where some modifications are made to a production master and other modifications are made to a working stamp that are used to create a replica having structures corresponding to optical elements in the production master with thicknesses corresponding to thicknesses of respective optical elements of the production master, and with same heights or different heights above a plane of a region not modified in the working stamp or the production master.

Having considered example production masters, example working stamps, and example replicas, consider now a discussion of example methods in accordance with one or more aspects of the disclosure.

FIG. 22 illustrates an example procedure 2200 for generating an electronic or optical component in accordance with one or more embodiments. Aspects of the procedure may be implemented in hardware, firmware, or software, or a combination thereof. The procedure is shown as a set of blocks that specify operations performed by one or more devices and are not necessarily limited to the orders shown for performing the operations by the respective blocks.

A distance for each respective structure of an electronic or optical component to a planar surface defined by the electronic or optical component is identified (block 2202). For instance, the structures can include a diffraction grating or a non-diffractive grating. The structures can include surface relief gratings. In an example, the electronic or optical component includes an optical component of a display system. For instance, the optical component can be a waveguide, and the surfaces can be configured to couple light emitted by an image source into and out of the waveguide.

A production master or a working stamp is modified in dependence upon a comparison of the identified distance for each respective structure to the planar surface and a desired distance from the planar surface (block 2204). For instance, modifying the production master or the working stamp may include changing a surface of the production master or a surface of the working stamp in dependence upon the comparison.

In one example, identifying the distance for each respective structure to the planar surface includes identifying a height for each respective structure to the planar surface and the desired distance includes a desired height for each respective structure to the planar surface. The structures can be positioned in accordance with the desired distance by positioning one of the structures at a distance to the planar surface that is different from the identified distance for the respective structure.

In one example, modifying the production master or the working stamp includes identifying areas of the production master or the working stamp corresponding to each respective structure, and adding or removing material to the production master or the working stamp at the identified areas. Furthermore, modifying the production master or the working stamp can be further dependent upon ascertaining properties of a material that is configured to go over a surface of the structures of the electronic component. For example, the material may shrink responsive to light, heat, or pressure, and an amount that the material shrinks may be one of the ascertained properties from which the modifying of the production master or the working stamp depends.

The electronic or optical component is generated, with the modified production master or the modified working stamp, by positioning the structures in accordance with the desired distance (block 2206).

FIG. 23 illustrates an example procedure 2300 for generating an electronic or optical component in accordance with one or more embodiments. Aspects of the procedure may be implemented in hardware, firmware, or software, or a combination thereof. The procedure is shown as a set of blocks that specify operations performed by one or more devices and are not necessarily limited to the orders shown for performing the operations by the respective blocks.

Structures on the surface of a substrate are produced in accordance with a bias level that biases the structures to a particular position, including positioning the structures a desired distance from a plane of the substrate (block 2302). For instance, the substrate may be quartz wafer or a glass wafer and the structures may be optical elements.

In one example, the bias level is based on properties of a material that covers the substrate, and to produce the structures on the surface of the substrate in accordance with the bias level includes to adjust the desired distance of the structures from the plane of the substrate based on the properties of the material that covers the substrate. Additionally or alternatively, to produce the structures on the surface of the substrate in accordance with the bias level includes generating each of the structures at a particular depth from the plane.

A reduction in an edge diffraction effect of light interacting with the structures on the surface of the substrate is caused by positioning the structures in accordance with the bias level (block 2304).

Figure 24:
FIG. 24 shows another flow diagram depicting an example procedure in accordance with one or more aspects of the disclosure.

FIG. 24 illustrates an example procedure 2400 for generating an electronic component in accordance with one or more embodiments. Aspects of the procedure may be implemented in hardware, firmware, or software, or a combination thereof. The procedure is shown as a set of blocks that specify operations performed by one or more devices and are not necessarily limited to the orders shown for performing the operations by the respective blocks.

An offset distance for the optical elements from a surface of the substrate is ascertained (block 2402). In one example, the offset distance includes a height offset distance for the optical elements relative to the surface of the substrate.

The offset distance for the optical elements from the surface of the substrate is adjusted by modifying areas on the mould that generates the optical elements (block 2404). In one example, modifying the areas on the mould that generate the optical elements includes adjusting areas on a production master or a working stamp to generate the optical elements on the surface of the substrate in accordance with the ascertained offset distance. Additionally or alternatively, modifying the areas on the mould that generate the optical elements includes forming structures on the mould at positions that correspond to the adjusted offset distance for the optical elements from the surface of the substrate.

Using a modified production master or a modified working stamp can be implemented to generate an electronic component having structures that are positioned within a desired distance from a planar surface constitutes an improvement over current techniques to generate electronic components. By positioning the structures in accordance with the threshold distance, electronic components generated using the modified production master or the modified working stamp minimize distortions, such as a phase jump between the structures. In examples, the structures can represent a raised areas, a lowered area, and/or a flat area (also referred to as a 'blank' area) that is equal to the plane and therefore is not a raised or lowered area. In one specific example, the structures are microstructures having a periodic and/or non-period format over a surface of the electronic component, such as the surface relief gratings (SRG).

Furthermore, although the techniques herein have been described for manufacturing optical elements, e.g., DOE's, the techniques described herein can also be used to manufacture electrical and non-optical components, such as by imprinting on glass or silicon wafers.

In the discussions herein, various different embodiments are described. It is to be appreciated and understood that each embodiment described herein can be used on its own or in connection with one or more other embodiments described herein. Further aspects of the techniques discussed herein relate to one or more of the following embodiments.

A method for generating an electronic or optical component having structures that are positioned within a desired distance from a planar surface defined by the electronic or optical component, the method comprising: identifying a distance for each respective structure to the planar surface; modifying a production master or a working stamp in dependence upon a comparison of the identified distance for each respective structure to the planar surface and the desired distance; and generating, with the modified production master or the modified working stamp, the electronic or optical component by positioning the structures in accordance with the desired distance.

Alternatively or in addition to any of the above described methods, any one or combination of: wherein the modifying the production master or the working stamp includes changing a surface of the production master or a surface of a substrate of the working stamp in dependence upon the comparison; wherein the modifying the production master or the working stamp includes identifying areas of the production master or the working stamp corresponding to each respective structure, and adding or removing material to the production master or the working stamp at the identified areas; wherein the modifying the production master or the working stamp is further dependent upon ascertaining properties of a material that is configured to go over a surface of the structures of the electronic or optical component; wherein the material shrinks responsive to light, heat, or pressure, and an amount that the material shrinks is one of the ascertained properties from which the modifying of the production master or the working stamp depends; wherein the identifying the distance for each respective structure to the planar surface includes identifying a height for each respective structure to the planar surface and wherein the desired distance includes a desired height for each respective structure to the planar surface; wherein the structures include a diffraction grating or a non-diffractive grating; wherein the structures include surface relief gratings; wherein the electronic or optical component includes an optical component of a display system; wherein the desired distance represents a minimal difference among the identified distances for each respective structure to the planar surface; wherein the positioning the structures in accordance with the desired distance includes positioning one of the structures at a distance to the planar surface that is different from the identified distance for the respective structure; wherein the electronic or optical component is a waveguide, and wherein the surfaces are configured to couple light emitted by an image source into and out of the waveguide.

A sub-assembly for producing structures on a surface of a substrate in accordance with a bias level that biases the structures to a particular position, the sub-assembly including: a production master and a working stamp that are configured to: produce the structures on the surface of the substrate in accordance with the bias level including positioning the structures a desired distance from a plane of the substrate; and cause a reduction in edge diffraction of light interacting with the structures on the surface of the substrate by positioning the structures in accordance with the bias level.

Alternatively or in addition to any of the above described sub-assemblies, any one or combination of: wherein the substrate is glass wafer and the structures are optical elements; wherein the bias level is based on properties of a material that covers the substrate and wherein to produce the structures on the surface of the substrate in accordance with the bias level includes to adjust the desired distance of the structures from the plane of the substrate based on the properties of the material that covers the substrate; wherein to produce the structures on the surface of the substrate in accordance with the bias level includes generating each of the structures at a particular depth from the plane.

A process to form optical elements on a surface of a substrate using a mould, the process including: ascertaining an offset distance for the optical elements from a surface of the substrate; and adjusting the offset distance for the optical elements from the surface of the substrate by modifying areas on the mould that generate the optical elements.

Alternatively or in addition to any of the above described processes, any one or combination of: wherein the offset distance includes a height offset distance for the optical elements relative to the surface of the substrate; wherein the modifying the areas on the mould that generate the optical elements includes adjusting areas on a production master or a working stamp to generate the optical elements on the surface of the substrate in accordance with the ascertained offset distance; wherein the modifying the areas on the mould that generate the optical elements includes forming structures on the mould at positions that correspond to the adjusted offset distance for the optical elements from the surface of the substrate.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims. For instance, reactive ion beam etching can remove material from the flat quartz plate to form the diffractive optical elements. The shrinkage of the polymer that is used can be utilized to adjust the bias level of the gratings to minimize phase jump between DOEs.

What is claimed is:

1. A method for generating an electronic or optical component, the method comprising:
identifying a specified height for an optical grating structure relative to a planar surface of the electronic or optical component;
modifying a working stamp to include a recess of less than a thickness of the optical grating structure;
providing another structure, corresponding to the optical grating structure, in the recess of the modified working stamp; and
generating, with the modified working stamp, the electronic or optical component by using the another structure in the recess of the modified working stamp to produce the optical grating structure having the specified height relative to the planar surface of the electronic or optical component.

2. The method according to claim 1, further comprising:
identifying at least two different specified heights for at least two different optical grating structures relative to the planar surface of the electronic or optical component; and
modifying the working stamp to include corresponding recesses of at least two different depths, based at least at least two different specified heights.

3. The method according to claim 1, wherein the modifying the working stamp includes:
removing material from the working stamp to create the recess.

4. The method according to claim 1, further comprising:
ascertaining one or more properties of a material that is configured to go over a surface of the optical grating structure of the electronic or optical component; and
selecting a depth of the recess based at least on the one or more properties of the material.

5. The method according to claim 4, wherein the material shrinks responsive to light, heat, or pressure, and an amount that the material shrinks is at least one of the properties used to select the depth of the recess.

6. The method according to claim 1, further comprising:
performing wet chemical etching on the working stamp to create the recess.

7. The method according to claim 1, wherein the optical grating structure comprises a diffraction grating.

8. The method according to claim 1, wherein the optical grating structure comprises one or more surface relief gratings.

9. The method according to claim 1, wherein the electronic or optical component includes an optical component of a display system.

10. The method according to claim 1, wherein the another structure fills the recess and extends above a corresponding planar surface of the working stamp.

11. The method according to claim 1, wherein the electronic or optical component is an electronic component.

12. The method according to claim 1, wherein the electronic or optical component comprises a waveguide and the optical grating structure is configured to couple light emitted by an image source into and out of the waveguide.

13. A process to form a mould, the process including:
ascertaining specified heights for optical grating elements from a surface of a substrate;
modifying areas on the mould to have corresponding recesses of less than respective thicknesses of the optical grating elements; and
providing structures in the corresponding recesses of the mould that generate the optical grating elements.

14. The process according to claim 13, wherein the mould comprises a working stamp.

15. The process according to claim 13, wherein the optical grating elements comprise surface relief gratings.

16. The process according to claim 15, wherein the modifying comprises:
providing a first recess in the mould of a first depth and incorporating, into the first recess, a first structure that generates a first surface relief grating on the substrate; and
providing a second recess in the mould of a second depth and incorporating, into the second recess, a second structure that generates a second surface relief grating on the substrate,
the first depth being greater than the second depth.

17. The process according to claim 16, further comprising:
determining the first depth and the second depth based at least on a shrinkage rate of a material used to create the mould.

18. The process according to claim 17, wherein the material is a polymer.

19. The process according to claim 18, wherein the providing the first recess and the second recess comprises performing wet chemical etching on a back bone of the mould.

20. The process according to claim 17, further comprising:
determining the first and second depth based at least upon optical distortion characteristics of the optical grating elements.

* * * * *